US011048231B2

(12) United States Patent
Lind et al.

(10) Patent No.: US 11,048,231 B2
(45) Date of Patent: *Jun. 29, 2021

(54) BEAM TOOL PATHING FOR 3D COMPOUND CONTOURS USING MACHINING PATH SURFACES TO MAINTAIN A SINGLE SOLID REPRESENTATION OF OBJECTS

(71) Applicant: Flow International Corporation, Kent, WA (US)

(72) Inventors: Vanessa A. Lind, Redmond, WA (US); Frank E. DeSimone, Berlin, MA (US); Kenneth A. Mental, Mendon, MA (US); Alex M. Chillman, Snohomish, WA (US)

(73) Assignee: Flow International Corporation, Kent, WA (US)

( * ) Notice: Subject to any disclaimer, the term of this patent is extended or adjusted under 35 U.S.C. 154(b) by 70 days.

This patent is subject to a terminal disclaimer.

(21) Appl. No.: 16/447,816

(22) Filed: Jun. 20, 2019

(65) Prior Publication Data

US 2019/0302738 A1    Oct. 3, 2019

Related U.S. Application Data

(63) Continuation of application No. 14/737,104, filed on Jun. 11, 2015, now Pat. No. 10,372,109.

(Continued)

(51) Int. Cl.
  *G05B 19/4099*    (2006.01)
  *B24C 3/00*    (2006.01)
  (Continued)

(52) U.S. Cl.
  CPC ............ *G05B 19/4099* (2013.01); *B24C 3/00* (2013.01); *B26D 5/005* (2013.01); *B26F 3/004* (2013.01);
  (Continued)

(58) Field of Classification Search
  CPC ........................................... G05B 2219/45152
  (Continued)

(56) References Cited

U.S. PATENT DOCUMENTS 5,584,016 A    12/1996    Varghese et al.
5,643,058 A    7/1997    Erichsen et al.
(Continued)

FOREIGN PATENT DOCUMENTS

EP    1944113 A1    7/2008
WO    2013166412 A1    11/2013

OTHER PUBLICATIONS

Olsen, "Waterjet Bevel Cutting Made Easy" Mar. 2012, 9 Pgs Print put PDF, accessed at: https://www.canadianmetalworking.com/article/fabricating/waterjet-bevel-cutting-made-g+Made+Easy&summary=New+technology+for+cutting+beveled+edges+enable+the+creation+of+complex+shapes+and+weld (Year: 2012).*

(Continued)

*Primary Examiner* — Emilio J Saavedra
(74) *Attorney, Agent, or Firm* — Cozen O'Connor

(57) ABSTRACT

Computer based methods, systems, and techniques for planning and generating machining paths for a tool that manufactures a three dimensional object having beveled or "compound" contours from a workpiece. A computer aided design (CAD)/computer aided manufacturing (CAM) system creates intermediate machining path surfaces that extend based on a CAD solid model representing the geometry of the object to be manufactured. The intermediate machining path surfaces extend to a shape that simulates a cutting beam (e.g., a waterjet, a laser beam, etc.) of the tool. For a flat workpiece, the machining path surfaces may extend from a top surface of the workpiece, which is a tool beam entrance surface, to a bottom surface of the workpiece, which is a tool beam exit surface. An operator is able to visualize the cuts (Continued)

to be made and the actual finished object geometry, without requiring the creation of multiple CAD solid models.

67 Claims, 24 Drawing Sheets

Related U.S. Application Data

(60) Provisional application No. 62/012,830, filed on Jun. 16, 2014.

(51) Int. Cl.
 *B26D 5/00* (2006.01)
 *B26F 3/00* (2006.01)
 *G06F 30/00* (2020.01)
 *B24C 1/04* (2006.01)

(52) U.S. Cl.
 CPC .............. *G06F 30/00* (2020.01); *B24C 1/045* (2013.01); *G05B 2219/35051* (2013.01); *G05B 2219/35097* (2013.01); *G05B 2219/35134* (2013.01); *G05B 2219/45036* (2013.01); *G05B 2219/45041* (2013.01); *G05B 2219/49012* (2013.01); *Y02P 90/02* (2015.11)

(58) Field of Classification Search
 USPC .................................................. 700/118, 60
 See application file for complete search history.

(56) References Cited

U.S. PATENT DOCUMENTS

| | | | |
|---|---|---|---|
| 6,311,098 | B1 | 10/2001 | Higasayama et al. |
| 8,401,692 | B2 | 3/2013 | Knaupp et al. |
| 8,423,172 | B2 | 4/2013 | Erichsen et al. |
| 2003/0204285 | A1 | 10/2003 | Thomas et al. |
| 2006/0064198 | A1 | 3/2006 | Fithian et al. |
| 2008/0201002 | A1 | 8/2008 | Crew et al. |
| 2010/0292822 | A1 | 11/2010 | Hahn |
| 2011/0287692 | A1 | 11/2011 | Erichsen et al. |
| 2013/0253687 | A1 | 9/2013 | Erichsen et al. |
| 2017/0255184 | A1 | 9/2017 | Henning et al. |

OTHER PUBLICATIONS

IGEMS Release 10 CAD/CAM/NEST Reference Manual IGEMS Software AB Sweden, Sep. 16, 2012, 207pgs (Year: 2012).*
"IGEMS Release 10 CAD/CAM/NEST Reference Manual," IGEMS Software AB Sweden, Sep. 16, 2012, 207 pages.
Abb, "Operating Manual Machining PowerPac RobotStudio 5.11," 2008, 102 pages.
Communication pursuant to Article 94(3) EPC, dated Aug. 18, 2017, for European Application No. 15731453.5-1927, 7 pages.
Extended European Search Report, dated Sep. 10, 2018, for European Application No. 18186418.2-1205, 11 pages.
International Preliminary Report on Patentability, dated Dec. 20, 2016, for International Application No. PCT/US2015/035335, 11 pages.
International Search Report and the Written Opinion of the International Searching Authority,dated May 24, 2016, for International Application No. PCT/US2015/035335, 17 pages.

* cited by examiner

BEAM TOOL PATHING FOR 3D COMPOUND CONTOURS USING MACHINING PATH SURFACES TO MAINTAIN A SINGLE SOLID REPRESENTATION OF OBJECTS

BACKGROUND

Technical Field

The present disclosure generally relates to systems, methods, and articles for planning and generating paths for tools used to manufacture objects.

Description of the Related Art

Multi-axis machining is a manufacturing process where computer numerically controlled (CNC) tools that move in multiple ways are used to manufacture objects by removing excess material. Systems used for this process include waterjet cutting systems, laser cutting systems, plasma cutting systems, electric discharge machining (EDM), and other systems. Typical multi-axis CNC tools support translation in 3 axes and support rotation around one or multiple axes. Multi-axis machines offer several improvements over other CNC tools at the cost of increased complexity and price of the machine. For example, using multi-axis machines, the amount of human labor may be reduced, a better surface finish can be obtained by moving the tool tangentially about the surface, and parts that are more complex can be manufactured, such as parts with compound contours.

High-pressure fluid jets, including high-pressure abrasive waterjets, are used to cut a wide variety of materials in many different industries. Abrasive waterjets have proven to be especially useful in cutting difficult, thick, or aggregate materials, such as thick metal, glass, or ceramic materials. Systems for generating high-pressure abrasive waterjets are currently available, such as, for example, the Mach 4™ 5-axis abrasive waterjet system manufactured by Flow International Corporation, the assignee of the present invention, as well as other systems that include an abrasive waterjet cutting head assembly mounted to an articulated robotic arm. Other examples of abrasive waterjet cutting systems are shown and described in Flow's U.S. Pat. Nos. 5,643,058 and 8,423,172, which are incorporated herein by reference. The terms "high-pressure fluid jet" and "jet" should be understood to incorporate all types of high-pressure fluid jets, including but not limited to, high-pressure waterjets and high-pressure abrasive waterjets. In such systems, high-pressure fluid, typically water, flows through an orifice in a cutting head to form a high-pressure jet (or "beam"), into which abrasive particles are combined as the jet flows through a mixing tube. The high-pressure abrasive waterjet is discharged from the mixing tube and directed toward a workpiece to cut the workpiece along a designated path, commonly referred to as a "toolpath."

Various systems are currently available to move a high-pressure fluid jet along a designated path. Such systems may commonly be referred to, for example, as three-axis and five-axis machines. Conventional three-axis machines mount the cutting head assembly in such a way that it can move along an x-y plane and perpendicular along a z-axis, namely toward and away from the workpiece. In this manner, the high-pressure fluid jet generated by the cutting head assembly is moved along the designated path in an x-y plane, and is raised and lowered relative to the workpiece, as may be desired. Conventional five-axis machines work in a similar manner but provide for movement about two additional non-parallel rotary axes. Other systems may include a cutting head assembly mounted to an articulated robotic arm, such as, for example, a 6-axis robotic arm which articulates about six separate axes.

Computer-aided manufacturing (CAM) processes may be used to efficiently drive or control such conventional machines along a designated path, such as by enabling two-dimensional (2D) or three-dimensional (3D) models of workpieces generated using computer-aided design (i.e., CAD models) to be used to generate code to drive the machines.

For example, FIG. 1A illustrates a 3D CAD solid model 100 of an object to be manufactured by cutting away material from a workpiece using a tool, such as a waterjet cutting system. The object includes a compound contour or beveled surface 102 that includes an angled upper bevel face 102A having an edge 104 adjacent to a top face 106, an angled lower bevel face 102B having an edge 108 adjacent a bottom face (not shown), and a vertical middle bevel face 102C extending between the upper bevel face 102A and the lower bevel face 102C (i.e., a "k-bevel").

To generate a toolpath for cutting the beveled surface 102 of the object, a user may create three non-compound beveled CAD solid models using a CAD application, one CAD solid model for each cut through the workpiece that will ultimately define the beveled faces 102A-C of the original object to be manufactured. FIG. 1B illustrates a first CAD solid model 110 having a cut face 112 that corresponds to the upper bevel face 102A of the object and spans from a top face 114 of the CAD solid model 110 to a bottom face (not shown) thereof (i.e., non-compound beveled). FIG. 1C illustrates a second CAD solid model 116 having a vertical cut face 118 that corresponds to the middle bevel face 102C of the object and spans from a top face 120 to a bottom face (not shown) thereof. FIG. 1D illustrates a third CAD solid model 122 having a cut face 124 that corresponds to the lower bevel face 102B of the object and spans from a top face 126 to a bottom face thereof. For objects with numerous bevels or "compound contours," the user may need to create several CAD solid models to represent the various required cuts.

The three CAD solid models 110, 116, and 122 may be imported into a CAM application or system and combined to produce a combined CAM solid model 128 shown in FIG. 1E. The operator and/or the CAM system may then select and sequence the cut paths for creating the object depicted by the original CAD solid model 100 in FIG. 1A. As shown, the combined CAM solid model 128 does not resemble the original CAD solid model 100 shown in 1A. Thus, a user of the CAM system and/or operator may have difficulty visualizing or determining which cuts are needed and in what sequence the cuts should be performed. Further, any modifications made to the original CAD solid model 100 may require the user to open the CAD system and recreate or modify each of the three CAD solid models 110, 116, and 112 that represent the cut faces of the original CAD solid model, and then reimport the modified CAD solid models into the CAM system to create a modified combined CAM solid model. For objects having multiple bevels or contours, this process can be expensive, time-consuming, and prone to errors.

Accordingly, there is a need for an improved system and method to plan and generate machining paths for beveled or compound contoured surfaces within a CAD/CAM system.

BRIEF SUMMARY

A method of operation in a computer-aided manufacturing (CAM) system to define a machining orientation for a tool to manufacture a three dimensional physical object from a workpiece, the object having one or more machining faces which are to be machined by the tool during manufacturing, the CAM system includes a display, at least one processor, at least one nontransitory processor-readable medium communicatively coupled to the at least one processor and which stores at least one of instructions or data executable by the at least one processor may be summarized as including obtaining a computer aided-design (CAD) solid model of the physical object to be manufactured from at least one nontransitory processor-readable medium; identifying a first bounding area; identifying a second bounding area; identifying one or more non-spanning machining faces of the CAD solid model, each of the one or more non-spanning machining faces having a first edge relatively proximate to the first bounding area and a second edge relatively proximate to the second bounding area, at least one of the first edge and the second edge spaced apart from the first bounding area and the second bounding area, respectively, such that each of the one or more non-spanning machining faces do not span between the first bounding area and the second bounding area; creating an extended machining path CAM surface model that defines a machining orientation for the tool, the extended machining path CAM surface model logically associated with one or more non-spanning machining faces of the CAD solid model in at least one nontransitory processor-readable medium, the extended machining path CAM surface model including one or more extended machining path CAM surfaces each a representation of a respective one of the non-spanning machining faces of the CAD solid model, the extended machining path CAM surface model including a first extended surface edge relatively proximate to the first bounding area defining a beam entrance contour and a second extended surface edge relatively proximate to the second bounding area defining a beam exit contour; and autonomously extending the extended machining path CAM surface model, by the at least one processor, by, autonomously extending the first extended surface edge of the extended machining path CAM surface model toward the first bounding area when the first extended surface edge is spaced apart from the first bounding area; and autonomously extending the second extended surface edge of the extended machining path CAM surface model toward the second bounding area when the second extended surface edge is spaced apart from the second bounding area.

The method may further include generating motion instructions or data that specify movement for the tool according to the extended machining path CAM surface model; and storing the motion instructions or data in the nontransitory processor-readable medium.

The method may further include receiving a selection of a positioning sequence for the motion instructions or data via a user interface of the CAM system; and logically associating the positioning sequence with the motion instructions or data in at least one nontransitory processor-readable medium.

The method may further include sending the motion instructions or data to a controller associated with the tool.

The method may further include obtaining machining knowledge data stored in at least one nontransitory processor-readable medium, wherein at least a portion of the motion instructions or data are dependent upon the obtained machining knowledge data. Identifying a first bounding area may include logically associating a first bounding area with a first face of the CAD solid model in at least one nontransitory processor-readable medium, and identifying a second bounding area may include logically associating a second bounding area with a second face of the CAD solid model in at least one nontransitory processor-readable medium. At least one of the first bounding area or the second bounding area may have a planar shape. At least one of the first bounding area or the second bounding area may have a non-planar shape.

The method may further include causing the display of the CAM system to display the CAD solid model and the extended machining path CAM surface model.

The method may further include receiving a selection of the first face of the CAD solid model via a user interface of the CAD system; and receiving a selection of the second face of the CAD solid model via a user interface of the CAD system. Extending the first extended surface edge of the extended machining path CAM surface model may include extending the first extended surface edge of the extended machining path CAM surface model to the first bounding area, and extending the second extended surface edge of the extended machining path CAM surface model may include extending the second extended surface edge of the extended machining path CAM surface model to the second bounding area. Extending the first extended surface edge of the extended machining path CAM surface model may include extending the first extended surface edge of the extended machining path CAM surface model a first distance toward the first bounding area, and extending the second extended surface edge of the extended machining path CAM surface model may include extending the second extended surface edge of the extended machining path CAM surface model a second distance toward the second bounding area.

The method may further include autonomously determining at least one of the one or more non-spanning machining faces of the CAD solid model has been modified; and autonomously modifying, by the at least one processor, the extended machining path CAM surface model dependent on the modification to create a modified extended machining path CAM surface model.

The method may further include causing the display of the CAM system to display the modified CAD solid model and the modified extended machining path CAM surface model.

The method may further include identifying one or more spanning machining faces of the CAD solid model, each of the one or more spanning machining faces having a first edge at least a portion of which is adjacent the first bounding area and a second edge at least a portion of which is adjacent the second bounding area, such that each of the one or more non-spanning machining faces do not span between the first bounding area and the second bounding area; and autonomously creating, by the at least one processor, a simplified machining path CAM surface model that defines a machining orientation for the tool, the simplified machining path CAM surface model logically associated with one or more spanning machining faces of the CAD solid model in at least one nontransitory processor-readable medium, the simplified machining path CAM surface model including one or more simplified machining path CAM surfaces, each simplified machining path CAM surface associated with a respective one of the spanning machining faces, the simplified machining path CAM surface model including a first simplified surface edge at least a portion of which is adjacent to the first bounding area defining a beam entrance contour and a second simplified surface edge at least a portion of which is adjacent to the second bounding area defining a beam exit contour.

The method may further include causing the display of the CAM system to display the CAD solid model, the extended machining path CAM surface model, and the simplified machining path CAM surface model. Extending the first extended surface edge of the extended machining path CAM surface model may include extending the first extended surface edge of the extended machining path CAM surface model to the first bounding area, and extending the second extended surface edge of the extended machining path CAM surface model may include extending the second extended surface edge of the extended machining path CAM surface model to the second bounding area. Extending the first extended surface edge of the extended machining path CAM surface model may include extending the first extended surface edge of the extended machining path CAM surface model a first distance toward the first bounding area, and extending the second extended surface edge of the extended machining path CAM surface model may include extending the second extended surface edge of the extended machining path CAM surface model a second distance toward the second bounding area.

The method may further include autonomously determining, by the at least one processor, at least one of the one or more machining faces of the CAD solid model has been modified; and autonomously modifying, by the at least one processor, the extended machining path CAM surface model or the simplified machining path CAM surface model dependent on the modification to generate at least one of a modified extended machining path CAM surface model or a modified simplified machining path CAM surface model.

The method may further include causing the display of the CAM system to display the modified CAD solid model and the generated at least one modified extended machining path CAM surface model or modified simplified machining path CAM surface model. The simplified machining path CAM surface model may be logically associated with a chain of two or more spanning machining faces in at least one nontransitory processor-readable medium.

The method may further include autonomously combining, by the at least one processor, the extended machining path CAM surface model and the simplified machining path CAM surface model to create a combined machining path CAM surface model.

The method may further include causing the display of the CAM system to display the CAD solid model and the combined machining path CAM surface model.

The method may further include segmenting, by the at least one processor, the simplified machining path CAM surface model into object geometry vectors that define a machining orientation for the tool, each object geometry vector connecting an imaginary point on the first simplified surface edge of the simplified machining path CAM surface model to a corresponding imaginary point on the second simplified surface edge of the simplified machining path CAM surface model such that there is a one-to-one correspondence between the number of points on the first simplified surface edge of the simplified machining path CAM surface model and the second simplified surface edge of the simplified machining path CAM surface model.

The method may further include dividing, by the at least one processor, one of the simplified machining path CAM surfaces of the simplified machining path CAM surface model into a first simplified machining path CAM surface and a second simplified machining path CAM surface, each of the first simplified machining path CAM surface and a second simplified machining path CAM surface having a first edge and a second edge; segmenting, by the at least one processor, the first simplified machining path CAM surface into object geometry vectors that define a machining orientation for the tool, each object geometry vector connecting an imaginary point on the first edge of the first simplified machining path CAM surface to a corresponding imaginary point on the second edge of the first simplified machining path CAM surface such that there is a one-to-one correspondence between the number of points on the first edge of the first simplified machining path CAM surface and the second edge of the first simplified machining path CAM surface; and segmenting, by the at least one processor, the second simplified machining path CAM surface into object geometry vectors that define a machining orientation for the tool, each object geometry vector connecting an imaginary point on the first edge of the second simplified machining path CAM surface to a corresponding imaginary point on the second edge of the second simplified machining path CAM surface such that there is a one-to-one correspondence between the number of points on the first edge of the second simplified machining path CAM surface and the second edge of the second simplified machining path CAM surface.

The method may further include logically associating the extended machining path CAM surface model with a chain of two or more adjacent non-spanning machining faces in at least one nontransitory processor-readable medium. Creating an extended machining path CAM surface model logically associated with one or more non-spanning machining faces may include copying the one or more non-spanning machining faces to create the extended machining path CAM surfaces.

The method may further include segmenting, by the at least one processor, the extended machining path CAM surface model into object geometry vectors that define a machining orientation for the tool, each object geometry vector connecting an imaginary point on the first extended surface edge of the extended machining path CAM surface model to a corresponding imaginary point on the second extended surface edge of the extended machining path CAM surface model such that there is a one-to-one correspondence between the number of points on the first extended surface edge of the extended machining path CAM surface model and the second extended surface edge of the extended machining path CAM surface model.

The method may further include dividing, by the at least one processor, one of the extended machining path CAM surfaces of the extended machining path CAM surface model into a first extended machining path CAM surface and a second extended machining path CAM surface, each of the first extended machining path CAM surface and a second extended machining path CAM surface having a first edge and a second edge; segmenting, by the at least one processor, the first extended machining path CAM surface into object geometry vectors that define a machining orientation for the tool, each object geometry vector connecting an imaginary point on the first edge of the first extended machining path CAM surface to a corresponding imaginary point on the second edge of the first extended machining path CAM surface such that there is a one-to-one correspondence between the number of points on the first edge of the first extended machining path CAM surface and the second edge of the first extended machining path CAM surface; and segmenting, by the at least one processor, the second extended machining path CAM surface into object geometry vectors that define a machining orientation for the tool, each object geometry vector connecting an imaginary point on the first edge of the second extended machining path CAM surface to a corresponding imaginary point on the second edge of the second extended machining path CAM surface such that there is a one-to-one correspondence between the number of points on the first edge of the second extended machining path CAM surface and the second edge of the second extended machining path CAM surface.

The method may further include creating, by the at least one processor, a lead-in machining path CAM surface that corresponds to a starting path of the tool, the lead-in machining path adjacent at least one other machining path CAM surface, the lead-in machining path CAM surface defined by a plurality object geometry vectors that define a machining orientation for the tool, wherein at least one of the plurality of object geometry vectors associated with a workpiece piercing location for the tool defines an orientation for the tool that positions a cutting beam of the tool perpendicular to a surface of the workpiece at the workpiece piercing position.

The method may further include creating, by the at least one processor, a lead-out machining path CAM surface that corresponds to a ending path of the tool, the lead-out machining path adjacent at least one other machining path CAM surface, the lead-out machining path CAM surface defined by a plurality object geometry vectors that define a machining orientation for the tool, wherein at least one of the plurality of object geometry vectors associated with an end location for the tool defines an orientation for the tool that positions a cutting beam of the tool perpendicular to a surface of the workpiece at the end location.

A method of operation in a computer-aided manufacturing (CAM) system to define a machining orientation for a tool to manufacture a three dimensional physical object from a workpiece, the object having one or more machining faces which are to be machined by the tool during manufacturing, the CAM system includes a display, at least one processor, at least one nontransitory processor-readable medium communicatively coupled to the at least one processor and which stores at least one of instructions or data executable by the at least one processor may be summarized as including obtaining a computer aided-design (CAD) solid model of the physical object to be manufactured from at least one nontransitory processor-readable medium; identifying a first bounding area; identifying a second bounding area; identifying one or more machining faces of the CAD solid model to be machining by the tool, each of the one or more machining faces having a first edge and a second edge; generating a machining path CAM surface model that defines a machining orientation for the tool, the machining path CAM surface model stored in at least one nontransitory processor-readable medium, and the machining path CAM surface model generated by, autonomously, by the at least one processor, generating one or more initial machining path CAM surfaces, each of the initial machining path CAM surfaces logically associated with a respective one of the machining faces in at least one nontransitory processor-readable medium, each of the initial CAM machining faces having a first edge and a second edge corresponding to the first edge and the second edge, respectively, of the machining face with which each of the initial machining path CAM surfaces is logically associated; and autonomously generating, by the at least one processor, one or more final machining path CAM surfaces of the machining path CAM surface model from the initial machining path CAM surfaces by, for each initial machining path CAM surface, extending the first edge toward the first bounding area when the first edge is spaced apart from the first bounding area, and extending the second edge toward the second bounding area when the second edge is spaced apart from the second bounding area; and causing the display of the CAM system to display the CAD solid model and the machining path CAM surface model. Identifying a first bounding area may include logically associating a first bounding area with a first face of the CAD solid model in at least one nontransitory processor-readable medium, and identifying a second bounding area may include logically associating a second bounding area with a second face of the CAD solid model in at least one nontransitory processor-readable medium.

The method may further include creating, by the at least one processor, a lead-in machining path CAM surface that corresponds to a starting path of the tool, the lead-in machining path adjacent at least one other machining path CAM surface, the lead-in machining path CAM surface defined by a plurality object geometry vectors that define a machining orientation for the tool, wherein at least one of the plurality of object geometry vectors associated with a workpiece piercing location for the tool defines an orientation for the tool that positions a cutting beam of the tool perpendicular to a surface of the workpiece at the workpiece piercing position.

The method may further include generating motion instructions or data, by the at least one processor, that specify movement for the tool according to the machining path CAM surface model.

The method may further include obtaining machining knowledge data stored in at least one nontransitory processor-readable medium, wherein at least a portion of the motion instructions or data are dependent upon the obtained machining knowledge data.

The method may further include storing the motion instructions or data in a nontransitory processor-readable medium.

The method may further include receiving a selection of a positioning sequence for the motion instructions or data via a user interface of the CAM system; and logically associating the positioning sequence with the motion instructions or data in at least one nontransitory processor-readable medium.

The method may further include modifying the CAD solid model; determining whether any of the machining faces of the CAD solid model are modified; generating a modified machining path CAM surface model by, for each modified machining face, autonomously generating, by the at least one processor, a modified initial machining path CAM surface logically associated in at least one nontransitory processor-readable medium with the modified machining face, the modified initial machining path CAM surface having a first edge and a second edge; and autonomously generating, by the at least one processor, a modified final machining path CAM surface from the modified initial machining path CAM surface by extending the first edge toward the first bounding area when the first edge is spaced apart from the first bounding area, and extending the second edge toward the second bounding area when the second edge is spaced apart from the second bounding area; and causing the display of the CAM system to display the modified CAD solid model and the modified machining path CAM surface model.

The method may further include dividing, by the at least one processor, one of the final CAM machining faces into a first portion and a second portion, each of the first portion and the second portion having a first edge and a second edge; segmenting, by the at least one processor, the first portion into object geometry vectors that define a machining orientation for the tool, each object geometry vector connecting an imaginary point on the first edge of the first portion defining a jet entrance contour to a corresponding imaginary point on the second edge of the first portion defining a jet exit contour such that there is a one-to-one correspondence between the number of points on the top edge of the first portion and the bottom edge of the first portion; and segmenting, by the at least one processor, the second portion into object geometry vectors that define the machining orientation for the tool, each object geometry vector connecting an imaginary point on the first edge of the second portion defining a jet entrance contour to a corresponding imaginary point on the second edge of the second portion defining a jet exit contour such that there is a one-to-one correspondence between the number of points on the top edge of the second portion and the bottom edge of the second portion. Extending the first edges of the initial CAM machining faces may include extending the first edges to the first bounding area, and extending the second edges of the initial CAM machining faces may include extending the second edges to the second bounding area.

A nontransitory processor-readable medium may be summarized as including processor executable instructions to: obtain a computer aided-design (CAD) solid model from at least one nontransitory processor-readable medium, the CAD solid model representative of a physical object to be manufactured from a workpiece; identify a first bounding area; identify a second bounding area; identify one or more non-spanning machining faces of the CAD solid model, each of the one or more non-spanning machining faces having a first edge relatively proximate to the first bounding area and a second edge relatively proximate to the second bounding area, at least one of the first edge and the second edge spaced apart from the first bounding area and the second bounding area, respectively, such that each of the one or more non-spanning machining faces do not span between the first bounding area and the second bounding area; create an extended machining path CAM surface model that defines a machining orientation for the tool, the extended machining path CAM surface model logically associated with one or more non-spanning machining faces of the CAD solid model in at least one nontransitory processor-readable medium, the extended machining path CAM surface model including one or more extended machining path CAM surfaces each a representation of a respective one of the non-spanning machining faces of the CAD solid model, the extended machining path CAM surface model including a first extended surface edge relatively proximate to the first bounding area defining a beam entrance contour and a second extended surface edge relatively proximate to the second bounding area defining a beam exit contour; and autonomously extend the extended machining path CAM surface model, wherein the processor executable instructions cause a processor to: autonomously extend the first extended surface edge of the extended machining path CAM surface model toward the first bounding area when the first extended surface edge is spaced apart from the first bounding area; and autonomously extend the second extended surface edge of the extended machining path CAM surface model toward the second bounding area when the second extended surface edge is spaced apart from the second bounding area. The instructions may cause the processor to logically associate a first bounding area with a first face of the CAD solid model in at least one nontransitory processor-readable medium, and logically associate a second bounding area with a second face of the CAD solid model in at least one nontransitory processor-readable medium.

The nontransitory processor-readable medium may further include processor executable instructions to create a lead-in machining path CAM surface that corresponds to a starting path of the tool, the lead-in machining path adjacent at least one other machining path CAM surface, the lead-in machining path CAM surface defined by a plurality object geometry vectors that define a machining orientation for the tool, wherein at least one of the plurality of object geometry vectors associated with a workpiece piercing location for the tool defines an orientation for the tool that positions a cutting beam of the tool perpendicular to a surface of the workpiece at the workpiece piercing position.

The nontransitory processor-readable medium may further include processor executable instructions to create a lead-out machining path CAM surface that corresponds to a ending path of the tool, the lead-out machining path adjacent at least one other machining path CAM surface, the lead-out machining path CAM surface defined by a plurality object geometry vectors that define a machining orientation for the tool, wherein at least one of the plurality of object geometry vectors associated with an end location for the tool defines an orientation for the tool that positions a cutting beam of the tool perpendicular to a surface of the workpiece at the end location.

The nontransitory processor-readable medium may further include processor executable instructions to generate motion instructions or data that specify movement for the tool according to the extended machining path CAM surface model; and store the motion instructions or data in the nontransitory processor-readable medium.

The nontransitory processor-readable medium may further include processor executable instructions to receive a selection of a positioning sequence for the motion instructions or data via a user interface; and logically associate the positioning sequence with the motion instructions or data in at least one nontransitory processor-readable medium.

The nontransitory processor-readable medium may further include processor executable instructions to obtain machining knowledge data stored in at least one nontransitory processor-readable medium, wherein at least a portion of the motion instructions or data are dependent upon the obtained machining knowledge data.

The nontransitory processor-readable medium of may further include processor executable instructions to: autonomously determine at least one of the one or more non-spanning machining faces of the CAD solid model has been modified; autonomously modify the extended machining path CAM surface model dependent on the modification to create a modified extended machining path CAM surface model; and autonomously modify the motion instructions or data to specify a traversal of the modified extended machining path CAM surface model.

The nontransitory processor-readable medium may further include processor executable instructions to cause a display to display the modified CAD solid model and the modified extended machining path CAM surface model.

The nontransitory processor-readable medium may further include processor executable instructions to send the motion instructions or data to a controller associated with the tool.

The nontransitory processor-readable medium may further include processor executable instructions to cause a display to display the CAD solid model and the extended machining path CAM surface model.

The nontransitory processor-readable medium may further include processor executable instructions to: extend the first extended surface edge of the extended machining path CAM surface model to the first bounding area; and extend the second extended surface edge of the extended machining path CAM surface model to the second bounding area.

The nontransitory processor-readable medium may further include processor executable instructions to: extend the first extended surface edge of the extended machining path CAM surface model a first distance toward the first bounding area; and extend the second extended surface edge of the extended machining path CAM surface model a second distance toward the second bounding area.

The nontransitory processor-readable medium may further include processor executable instructions to: identify one or more spanning machining faces of the CAD solid model, each of the one or more spanning machining faces having a first edge at least a portion of which is adjacent the first bounding area and a second edge at least a portion of which is adjacent the second bounding area, such that each of the one or more non-spanning machining faces do not span between the first bounding area and the second bounding area; and autonomously create a simplified machining path CAM surface model that defines a machining orientation for the tool, the simplified machining path CAM surface model logically associated with one or more spanning machining faces of the CAD solid model in at least one nontransitory processor-readable medium, the simplified machining path CAM surface model including one or more simplified machining path CAM surfaces, each simplified machining path CAM surface associated with a respective one of the spanning machining faces, the simplified machining path CAM surface model including a first simplified surface edge at least a portion of which is adjacent to the first bounding area defining a beam entrance contour and a second simplified surface edge at least a portion of which is adjacent to the second bounding area defining a beam exit contour. The nontransitory processor-readable medium may further include processor executable instructions to cause a display to display the CAD solid model, the extended machining path CAM surface model, and the simplified machining path CAM surface model.

The nontransitory processor-readable medium may further include processor executable instructions to: extend the first extended surface edge of the extended machining path CAM surface model to the first bounding area; and extend the second extended surface edge of the extended machining path CAM surface model to the second bounding area.

The nontransitory processor-readable medium may further include processor executable instructions to: extend the first extended surface edge of the extended machining path CAM surface model a first distance toward the first bounding area; and extend the second extended surface edge of the extended machining path CAM surface model a second distance toward the second bounding area.

The nontransitory processor-readable medium may further include processor executable instructions to: autonomously determine at least one of the one or more machining faces of the CAD solid model has been modified; and autonomously modify the extended machining path CAM surface model or the simplified machining path CAM surface model dependent on the modification to generate at least one of a modified extended machining path CAM surface model or a modified simplified machining path CAM surface model.

The nontransitory processor-readable medium may further include processor executable instructions to cause a display to display the modified CAD solid model and the generated at least one modified extended machining path CAM surface model or modified simplified machining path CAM surface model.

The nontransitory processor-readable medium may further include processor executable instructions to logically associate the simplified machining path CAM surface model with a chain of two or more spanning machining faces in at least one nontransitory processor-readable medium.

The nontransitory processor-readable medium may further include processor executable instructions to autonomously combine the extended machining path CAM surface model and the simplified machining path CAM surface model to create a combined machining path CAM surface model.

The nontransitory processor-readable medium may further include processor executable instructions to cause a display to display the CAD solid model and the combined machining path CAM surface model.

The nontransitory processor-readable medium may further include processor executable instructions to segment the simplified machining path CAM surface model into object geometry vectors that define a machining orientation for the tool, each object geometry vector connecting an imaginary point on the first simplified surface edge of the simplified machining path CAM surface model to a corresponding imaginary point on the second simplified surface edge of the simplified machining path CAM surface model such that there is a one-to-one correspondence between the number of points on the first simplified surface edge of the simplified machining path CAM surface model and the second simplified surface edge of the simplified machining path CAM surface model.

The nontransitory processor-readable medium may further include processor executable instructions to: divide one of the simplified machining path CAM surfaces of the simplified machining path CAM surface model into a first simplified machining path CAM surface and a second simplified machining path CAM surface, each of the first simplified machining path CAM surface and a second simplified machining path CAM surface having a first edge and a second edge; segment the first simplified machining path CAM surface into object geometry vectors that define a machining orientation for the tool, each object geometry vector connecting an imaginary point on the first edge of the first simplified machining path CAM surface to a corresponding imaginary point on the second edge of the first simplified machining path CAM surface such that there is a one-to-one correspondence between the number of points on the first edge of the first simplified machining path CAM surface and the second edge of the first simplified machining path CAM surface; and segment the second simplified machining path CAM surface into object geometry vectors that define a machining orientation for the tool, each object geometry vector connecting an imaginary point on the first edge of the second simplified machining path CAM surface to a corresponding imaginary point on the second edge of the second simplified machining path CAM surface such that there is a one-to-one correspondence between the number of points on the first edge of the second simplified machining path CAM surface and the second edge of the second simplified machining path CAM surface.

The nontransitory processor-readable medium may further include processor executable instructions to logically associate the extended machining path CAM surface model with a chain of two or more adjacent non-spanning machining faces in at least one nontransitory processor-readable medium. The nontransitory processor-readable medium may further include processor executable instructions to copy the one or more non-spanning machining faces to create the extended machining path CAM surfaces.

The nontransitory processor-readable medium may further include processor executable instructions to segment the extended machining path CAM surface model into object geometry vectors that define a machining orientation for the tool, each object geometry vector connecting an imaginary point on the first extended surface edge of the extended machining path CAM surface model to a corresponding imaginary point on the second extended surface edge of the extended machining path CAM surface model such that there is a one-to-one correspondence between the number of points on the first extended surface edge of the extended machining path CAM surface model and the second extended surface edge of the extended machining path CAM surface model.

The nontransitory processor-readable medium may further include processor executable instructions to: divide one of the extended machining path CAM surfaces of the extended machining path CAM surface model into a first extended machining path CAM surface and a second extended machining path CAM surface, each of the first extended machining path CAM surface and a second extended machining path CAM surface having a first edge and a second edge; segment the first extended machining path CAM surface into object geometry vectors that define a machining orientation for the tool, each object geometry vector connecting an imaginary point on the first edge of the first extended machining path CAM surface to a corresponding imaginary point on the second edge of the first extended machining path CAM surface such that there is a one-to-one correspondence between the number of points on the first edge of the first extended machining path CAM surface and the second edge of the first extended machining path CAM surface; and segment the second extended machining path CAM surface into object geometry vectors that define a machining orientation for the tool, each object geometry vector connecting an imaginary point on the first edge of the second extended machining path CAM surface to a corresponding imaginary point on the second edge of the second extended machining path CAM surface such that there is a one-to-one correspondence between the number of points on the first edge of the second extended machining path CAM surface and the second edge of the second extended machining path CAM surface.

A nontransitory processor-readable medium may be summarized as including processor executable instructions to: obtain a computer aided-design (CAD) solid model of the physical object to be manufactured by a tool from at least one nontransitory processor-readable medium; identify a first bounding area; identify a second bounding area; identify one or more machining faces of the CAD solid model to be machining by the tool, each of the one or more machining faces having a first edge and a second edge; generate a machining path CAM surface model that defines a machining orientation for the tool, the machining path CAM surface model stored in at least one nontransitory processor-readable medium, the processor executable instructions cause a processor to autonomously generate one or more initial machining path CAM surfaces, each of the initial machining path CAM surfaces logically associated with a respective one of the machining faces in at least one nontransitory processor-readable medium, each of the initial CAM machining faces having a first edge and a second edge corresponding to the first edge and the second edge, respectively, of the machining face with which each of the initial machining path CAM surfaces is logically associated; autonomously generate one or more final machining path CAM surfaces of the machining path CAM surface model from the initial machining path CAM surfaces, the processor executable instructions cause a processor to, for each initial machining path CAM surface: extend the first edge toward the first bounding area when the first edge is spaced apart from the first bounding area; and extend the second edge toward the second bounding area when the second edge is spaced apart from the second bounding area; cause a display to display the CAD solid model and the machining path CAM surface model.

The nontransitory processor-readable medium may further include processor executable instructions to generate motion instructions or data that specify movement for the tool according to the machining path CAM surface model.

The nontransitory processor-readable medium may further include computer executable instructions to store the motion instructions or data in a nontransitory processor-readable medium.

The nontransitory processor-readable medium may further include computer executable instructions to obtain machining knowledge data stored in at least one nontransitory processor-readable medium, wherein at least a portion of the motion instructions or data are dependent upon the obtained machining knowledge data.

The nontransitory processor-readable medium may further include processor executable instructions to receive a selection of a positioning sequence for the motion instructions or data via a user interface; and logically associate the positioning sequence with the motion instructions or data in at least one nontransitory processor-readable medium.

The nontransitory processor-readable medium may further include computer executable instructions to: modify the CAD solid model; determine whether any of the machining faces of the CAD solid model are modified; generate a modified machining path CAM surface model by, for each modified machining face, wherein the computer executable instructions cause a processor to: autonomously generate a modified initial machining path CAM surface logically associated in at least one nontransitory processor-readable medium with the modified machining face, the modified initial machining path CAM surface having a first edge and a second edge; autonomously generate a modified final machining path CAM surface from the modified initial machining path CAM surface, wherein the computer executable instructions cause a processor to extend the first edge toward the first bounding area when the first edge is spaced apart from the first bounding area; and extend the second edge toward the second bounding area when the second edge is spaced apart from the second bounding area; cause a display to display the modified CAD solid model and the modified machining path CAM surface model.

The nontransitory processor-readable medium may further include computer executable instructions to: divide one of the final CAM machining faces into a first portion and a second portion, each of the first portion and the second portion having a first edge and a second edge; segment the first portion into object geometry vectors that define a machining orientation for the tool, each object geometry vector connecting an imaginary point on the first edge of the first portion defining a jet entrance contour to a corresponding imaginary point on the second edge of the first portion defining a jet exit contour such that there is a one-to-one correspondence between the number of points on the top edge of the first portion and the bottom edge of the first portion; and segment the second portion into object geometry vectors that define the machining orientation for the tool, each object geometry vector connecting an imaginary point on the first edge of the second portion defining a jet entrance contour to a corresponding imaginary point on the second edge of the second portion defining a jet exit contour such that there is a one-to-one correspondence between the number of points on the top edge of the second portion and the bottom edge of the second portion.

The nontransitory processor-readable medium may further include computer executable instructions to: extend the first edges of the initial CAM machining faces to the first bounding area; and extend the second edges of the initial CAM machining faces to the second bounding area.

A processor-based system may be summarized as including at least one processor; and at least one nontransitory processor-readable medium, communicatively coupled to the at least one processor and which stores at least one of processor-executable instructions or data, wherein in use the at least one processor: obtains a computer aided-design (CAD) solid model of the physical object to be manufactured from at least one nontransitory processor-readable medium; identifies a first bounding area; identifies a second bounding area; identifies one or more non-spanning machining faces of the CAD solid model, each of the one or more non-spanning machining faces having a first edge relatively proximate to the first bounding area and a second edge relatively proximate to the second bounding area, at least one of the first edge and the second edge spaced apart from the first bounding area and the second bounding area, respectively, such that each of the one or more non-spanning machining faces do not span between the first bounding area and the second bounding area; creates an extended machining path CAM surface model that defines a machining orientation for the tool, the extended machining path CAM surface model logically associated with one or more non-spanning machining faces of the CAD solid model in at least one nontransitory processor-readable medium, the extended machining path CAM surface model including one or more extended machining path CAM surfaces each a representation of a respective one of the non-spanning machining faces of the CAD solid model, the extended machining path CAM surface model including a first extended surface edge relatively proximate to the first bounding area defining a beam entrance contour and a second extended surface edge relatively proximate to the second bounding area defining a beam exit contour; and autonomously extends the extended machining path CAM surface model, wherein the processor: autonomously extends the first extended surface edge of the extended machining path CAM surface model toward the first bounding area when the first extended surface edge is spaced apart from the first bounding area; and autonomously extends the second extended surface edge of the extended machining path CAM surface model toward the second bounding area when the second extended surface edge is spaced apart from the second bounding area. The at least one processor may further generate motion instructions or data that specify movement for the tool according to the extended machining path CAM surface model; and store the motion instructions or data in the nontransitory processor-readable medium.

The at least one processor may further receive a selection of a positioning sequence for the motion instructions or data via a user interface; and logically associate the positioning sequence with the motion instructions or data in at least one nontransitory processor-readable medium.

The at least one processor may further send the motion instructions or data to a controller associated with the tool.

The at least one processor may further cause a display to display the CAD solid model and the extended machining path CAM surface model.

The at least one processor may further extend the first extended surface edge of the extended machining path CAM surface model to the first bounding area; and extend the second extended surface edge of the extended machining path CAM surface model to the second bounding area.

The at least one processor may further extend the first extended surface edge of the extended machining path CAM surface model a first distance toward the first bounding area; and extend the second extended surface edge of the extended machining path CAM surface model a second distance toward the second bounding area.

The at least one processor may further autonomously determine at least one of the one or more non-spanning machining faces of the CAD solid model has been modified; and autonomously modify the extended machining path CAM surface model dependent on the modification to create a modified extended machining path CAM surface model.

The at least one processor may further cause a display to display the modified CAD solid model and the modified extended machining path CAM surface model.

The at least one processor may further identify one or more spanning machining faces of the CAD solid model, each of the one or more spanning machining faces having a first edge at least a portion of which is adjacent the first bounding area and a second edge at least a portion of which is adjacent the second bounding area, such that each of the one or more non-spanning machining faces do not span between the first bounding area and the second bounding area; and autonomously create a simplified machining path CAM surface model that defines a machining orientation for the tool, the simplified machining path CAM surface model logically associated with one or more spanning machining faces of the CAD solid model in at least one nontransitory processor-readable medium, the simplified machining path CAM surface model including one or more simplified machining path CAM surfaces, each simplified machining path CAM surface associated with a respective one of the spanning machining faces, the simplified machining path CAM surface model including a first simplified surface edge at least a portion of which is adjacent to the first bounding area defining a beam entrance contour and a second simplified surface edge at least a portion of which is adjacent to the second bounding area defining a beam exit contour.

The at least one processor may further cause a display to display the CAD solid model, the extended machining path CAM surface model, and the simplified machining path CAM surface model.

The at least one processor may further extend the first extended surface edge of the extended machining path CAM surface model to the first bounding area; and extend the second extended surface edge of the extended machining path CAM surface model to the second bounding area.

The at least one processor may further extend the first extended surface edge of the extended machining path CAM surface model a first distance toward the first bounding area; and extend the second extended surface edge of the extended machining path CAM surface model a second distance toward the second bounding area.

The at least one processor may further autonomously determine at least one of the one or more machining faces of the CAD solid model has been modified; and autonomously modify the extended machining path CAM surface model or the simplified machining path CAM surface model dependent on the modification to generate at least one of a modified extended machining path CAM surface model or a modified simplified machining path CAM surface model.

The at least one processor may further cause a display to display the modified CAD solid model and the generated at least one modified extended machining path CAM surface model or modified simplified machining path CAM surface model.

The at least one processor may further logically associate the simplified machining path CAM surface model with a chain of two or more spanning machining faces in at least one nontransitory processor-readable medium.

The at least one processor may further autonomously combine the extended machining path CAM surface model and the simplified machining path CAM surface model to create a combined machining path CAM surface model.

The at least one processor may further cause a display to display the CAD solid model and the combined machining path CAM surface model.

The at least one processor may further segment the simplified machining path CAM surface model into object geometry vectors that define a machining orientation for the tool, each object geometry vector connecting an imaginary point on the first simplified surface edge of the simplified machining path CAM surface model to a corresponding imaginary point on the second simplified surface edge of the simplified machining path CAM surface model such that there is a one-to-one correspondence between the number of points on the first simplified surface edge of the simplified machining path CAM surface model and the second simplified surface edge of the simplified machining path CAM surface model.

The at least one processor may further divide one of the simplified machining path CAM surfaces of the simplified machining path CAM surface model into a first simplified machining path CAM surface and a second simplified machining path CAM surface, each of the first simplified machining path CAM surface and a second simplified machining path CAM surface having a first edge and a second edge; segment the first simplified machining path CAM surface into object geometry vectors that define a machining orientation for the tool, each object geometry vector connecting an imaginary point on the first edge of the first simplified machining path CAM surface to a corresponding imaginary point on the second edge of the first simplified machining path CAM surface such that there is a one-to-one correspondence between the number of points on the first edge of the first simplified machining path CAM surface and the second edge of the first simplified machining path CAM surface; and segment the second simplified machining path CAM surface into object geometry vectors that define a machining orientation for the tool, each object geometry vector connecting an imaginary point on the first edge of the second simplified machining path CAM surface to a corresponding imaginary point on the second edge of the second simplified machining path CAM surface such that there is a one-to-one correspondence between the number of points on the first edge of the second simplified machining path CAM surface and the second edge of the second simplified machining path CAM surface.

The at least one processor may further logically associate the extended machining path CAM surface model with a chain of two or more adjacent non-spanning machining faces in at least one nontransitory processor-readable medium.

The at least one processor may further copy the one or more non-spanning machining faces to create the extended machining path CAM surfaces.

The at least one processor may further segment the extended machining path CAM surface model into object geometry vectors that define a machining orientation for the tool, each object geometry vector connecting an imaginary point on the first extended surface edge of the extended machining path CAM surface model to a corresponding imaginary point on the second extended surface edge of the extended machining path CAM surface model such that there is a one-to-one correspondence between the number of points on the first extended surface edge of the extended machining path CAM surface model and the second extended surface edge of the extended machining path CAM surface model.

The at least one processor may further divide one of the extended machining path CAM surfaces of the extended machining path CAM surface model into a first extended machining path CAM surface and a second extended machining path CAM surface, each of the first extended machining path CAM surface and a second extended machining path CAM surface having a first edge and a second edge; segment the first extended machining path CAM surface into object geometry vectors that define a machining orientation for the tool, each object geometry vector connecting an imaginary point on the first edge of the first extended machining path CAM surface to a corresponding imaginary point on the second edge of the first extended machining path CAM surface such that there is a one-to-one correspondence between the number of points on the first edge of the first extended machining path CAM surface and the second edge of the first extended machining path CAM surface; and segment the second extended machining path CAM surface into object geometry vectors that define a machining orientation for the tool, each object geometry vector connecting an imaginary point on the first edge of the second extended machining path CAM surface to a corresponding imaginary point on the second edge of the second extended machining path CAM surface such that there is a one-to-one correspondence between the number of points on the first edge of the second extended machining path CAM surface and the second edge of the second extended machining path CAM surface.

A processor-based system may be summarized as including at least one processor; and at least one nontransitory processor-readable medium, communicatively coupled to the at least one processor and which stores at least one of processor-executable instructions or data, wherein in use the at least one processor: obtains a computer aided-design (CAD) solid model of the physical object to be manufactured by a tool from at least one nontransitory processor-readable medium; identifies a first bounding area; identifies a second bounding area; identifies one or more machining faces of the CAD solid model to be machining by the tool, each of the one or more machining faces having a first edge and a second edge; generates a machining path CAM surface model that defines a machining orientation for the tool, the machining path CAM surface model stored in at least one nontransitory processor-readable medium, the processor executable instructions cause a processor to: autonomously generate one or more initial machining path CAM surfaces, each of the initial machining path CAM surfaces logically associated with a respective one of the machining faces in at least one nontransitory processor-readable medium, each of the initial CAM machining faces having a first edge and a second edge corresponding to the first edge and the second edge, respectively, of the machining face with which each of the initial machining path CAM surfaces is logically associated; autonomously generate one or more final machining path CAM surfaces of the machining path CAM surface model from the initial machining path CAM surfaces, the processor executable instructions cause a processor to, for each initial machining path CAM surface: extend the first edge toward the first bounding area when the first edge is spaced apart from the first bounding area; and extend the second edge toward the second bounding area when the second edge is spaced apart from the second bounding area; causes a display to display the CAD solid model and the machining path CAM surface model.

The at least one processor may further logically associate a first bounding area with a first face of the CAD solid model in at least one nontransitory processor-readable medium; and logically associate a second bounding area with a second face of the CAD solid model in at least one nontransitory processor-readable medium.

The at least one processor may further generate motion instructions or data that specify movement for the tool according to the machining path CAM surface model.

The at least one processor may further store the motion instructions or data in a nontransitory processor-readable medium.

The at least one processor may further obtain machining knowledge data stored in at least one nontransitory processor-readable medium, wherein at least a portion of the motion instructions or data are dependent upon the obtained machining knowledge data.

The at least one processor may further receive a selection of a positioning sequence for the motion instructions or data via a user interface; and logically associate the positioning sequence with the motion instructions or data in at least one nontransitory processor-readable medium.

The at least one processor may further modified the CAD solid model; determine whether any of the machining faces of the CAD solid model are modified; generate a modified machining path CAM surface model by, for each modified machining face, wherein the computer executable instructions cause a processor to: autonomously generate a modified initial machining path CAM surface logically associated in at least one nontransitory processor-readable medium with the modified machining face, the modified initial machining path CAM surface having a first edge and a second edge; autonomously generate a modified final machining path CAM surface from the modified initial machining path CAM surface, wherein the computer executable instructions cause a processor to: extend the first edge toward the first bounding area when the first edge is spaced apart from the first bounding area; and extend the second edge toward the second bounding area when the second edge is spaced apart from the second bounding area; cause a display to display the modified CAD solid model and the modified machining path CAM surface model.

The at least one processor may further divide one of the final CAM machining faces into a first portion and a second portion, each of the first portion and the second portion having a first edge and a second edge; segment the first portion into object geometry vectors that define a machining orientation for the tool, each object geometry vector connecting an imaginary point on the first edge of the first portion defining a jet entrance contour to a corresponding imaginary point on the second edge of the first portion defining a jet exit contour such that there is a one-to-one correspondence between the number of points on the top edge of the first portion and the bottom edge of the first portion; and segment the second portion into object geometry vectors that define the machining orientation for the tool, each object geometry vector connecting an imaginary point on the first edge of the second portion defining a jet entrance contour to a corresponding imaginary point on the second edge of the second portion defining a jet exit contour such that there is a one-to-one correspondence between the number of points on the top edge of the second portion and the bottom edge of the second portion.

The at least one processor may further extend the first edges of the initial CAM machining faces to the first bounding area; and extend the second edges of the initial CAM machining faces to the second bounding area.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn, are not intended to convey any information regarding the actual shape of the particular elements, and have been solely selected for ease of recognition in the drawings.

DETAILED DESCRIPTION

Figure 1A:
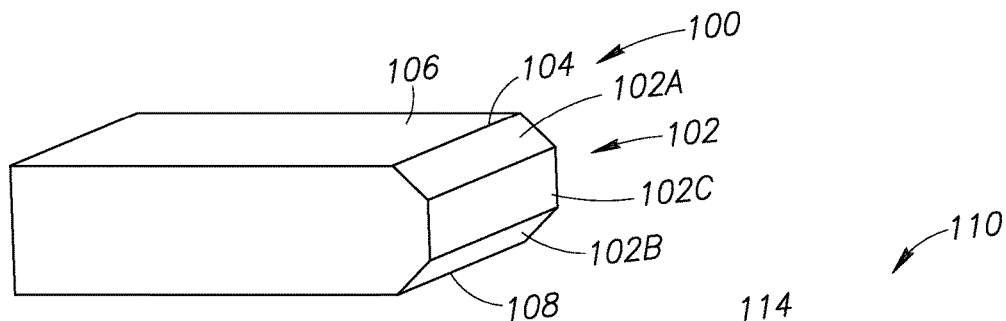
FIGS. 1A-1E are views of prior art CAD solid models used to create toolpaths for manufacturing an object out of a workpiece using a cutting tool.
Figure 1B:
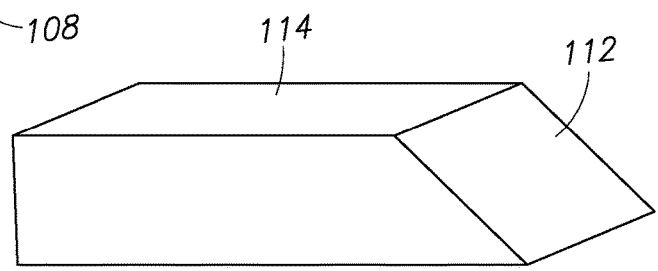
Figure 1C:
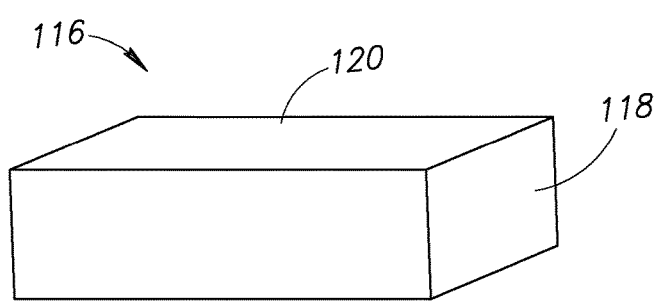
Figure 1D:
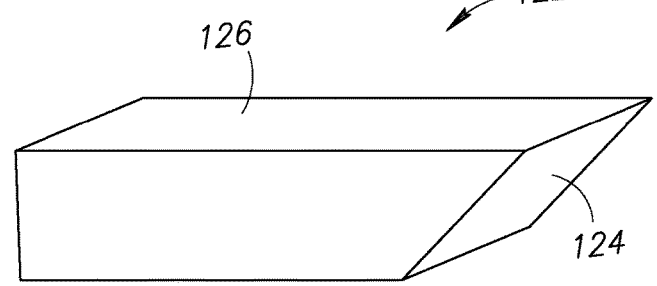
Figure 1E:
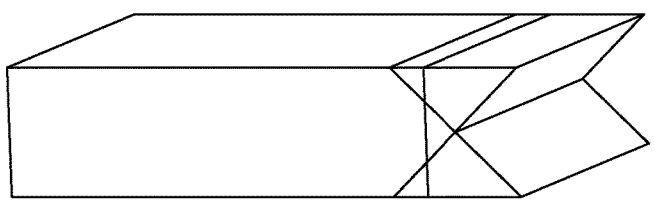

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with transmitters, receivers, or transceivers have not been shown or described in detail to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

The headings and Abstract of the Disclosure provided herein are for convenience only and do not interpret the scope or meaning of the embodiments.

Embodiments described herein provide enhanced computer- and network-based methods, systems, articles, and techniques for planning and generating cutting paths (more generally, "machining paths") for a tool that manufactures a three dimensional object having beveled or "compound" contours from a workpiece. For explanatory purposes, the present disclosure may describe systems and methods relating to waterjet cutting systems, but the embodiments disclosed herein may also be applied with other tools, such as laser cutting systems, plasma cutting systems, electric discharge machining (EDM), and other systems.

One or more embodiments provide a computer aided design (CAD)/computer aided manufacturing (CAM) system or application that creates virtual or intermediate machining path CAM surfaces that extend based on a CAD solid model representing the geometry of the object to be manufactured. The intermediate machining path CAM surfaces extend to a shape that simulates a cutting beam path (e.g., a waterjet, a laser beam, etc.) of the tool. For example, for a flat workpiece, the machining path CAM surfaces may extend from a top surface of the workpiece, which is a tool beam entrance surface, to a bottom surface of the workpiece, which is a tool beam exit surface. Thus, since the machining path CAM surfaces provide a projected estimation of what material the beam of the tool will actually be cutting through, the user is able to visualize the cuts to be made and the actual finished object geometry. This also allows for the creation of a toolpath for a 3D or compound contour object without requiring the creation of multiple CAD solid models, thereby enhancing the workflow. Further, the embodiments disclosed herein enable toolpaths to be created with a high degree of automation that allows for an operator to create an object that can be cut without damage to the workpiece, without incorrect cuts, and without collision between the cutting tool and the workpiece. Moreover, in some embodiments the CAD/CAM system maintains associativity between the machining path CAM surfaces and the CAD solid model. Thus, if any design changes in the CAD solid model occur, the machining path CAM surfaces and/or toolpaths may be automatically updated without requiring the CAD user to recreate the machining path CAM surfaces and/or toolpaths.

In some embodiments, the CAD/CAM system uses a set of advanced predictive models to determine the characteristics of an (intended) cut through a given material and to provide the deviation correction angles to account for predicted deviation of the beam from a straight-line trajectory. The predicted deviation may be related, for example, to the width of the beam changing as it penetrates through the material and/or the drag or deflection that results in the beam exiting at a point in some direction distant from the intended exit point. When cutting straight wall pieces, these cutting phenomena can be expressed as trailback/drag and taper and the corresponding deviation corrections expressed as lead compensation and taper compensation angles. However, when cutting more complicated pieces, such as non-vertical (beveled) surfaces, non-flat (curved) material, pieces with directional changes over the depth of the beam, pieces with different shapes on the top and on the bottom, etc., these deviations have directional components (such as forward, backward, and sideways terms relative to the direction and path of beam travel) that influence the deviations. The prediction of angular corrections thus becomes far more complex. Using advanced predictive models, the CAD/CAM system may operate without manual (e.g., human) intervention and may not require special knowledge by the operator to run the cutting tool. The automatic nature of the CAD/CAM system thus supports decreased production time as well as more precise control over the cutting process, especially of complex objects.

In order to cut such objects, in some embodiments the CAD/CAM system employs the advanced predictive models to determine how the beam is affected when penetrating the workpiece material, from the entrance of the beam when making the cut (e.g., the top) to the exit of the beam when making the cut (e.g., the bottom), as it progresses along the intended machining path. Of note, when cutting from flat stock material, the beam entry typically corresponds to a position on the top surface of the workpiece and the beam exit typically corresponds to a position on the bottom surface of the workpiece. As the beam progresses to cut the workpiece material to create the desired object, there is a path that forms a contour on the top, more generally referred to herein as the beam entry contour and a path that forms a contour on the bottom, more generally referred to herein as the beam exit contour. One aspect to understand these models is to recognize that the cutting speed of the beam changes along the length (e.g., penetration or projection) of the beam as the beam advances along the machining path profile. These microenvironment speed changes cause "localized" deflections along the length of the beam, which are accounted for by the models in determining deviation corrections.

Figure 2:
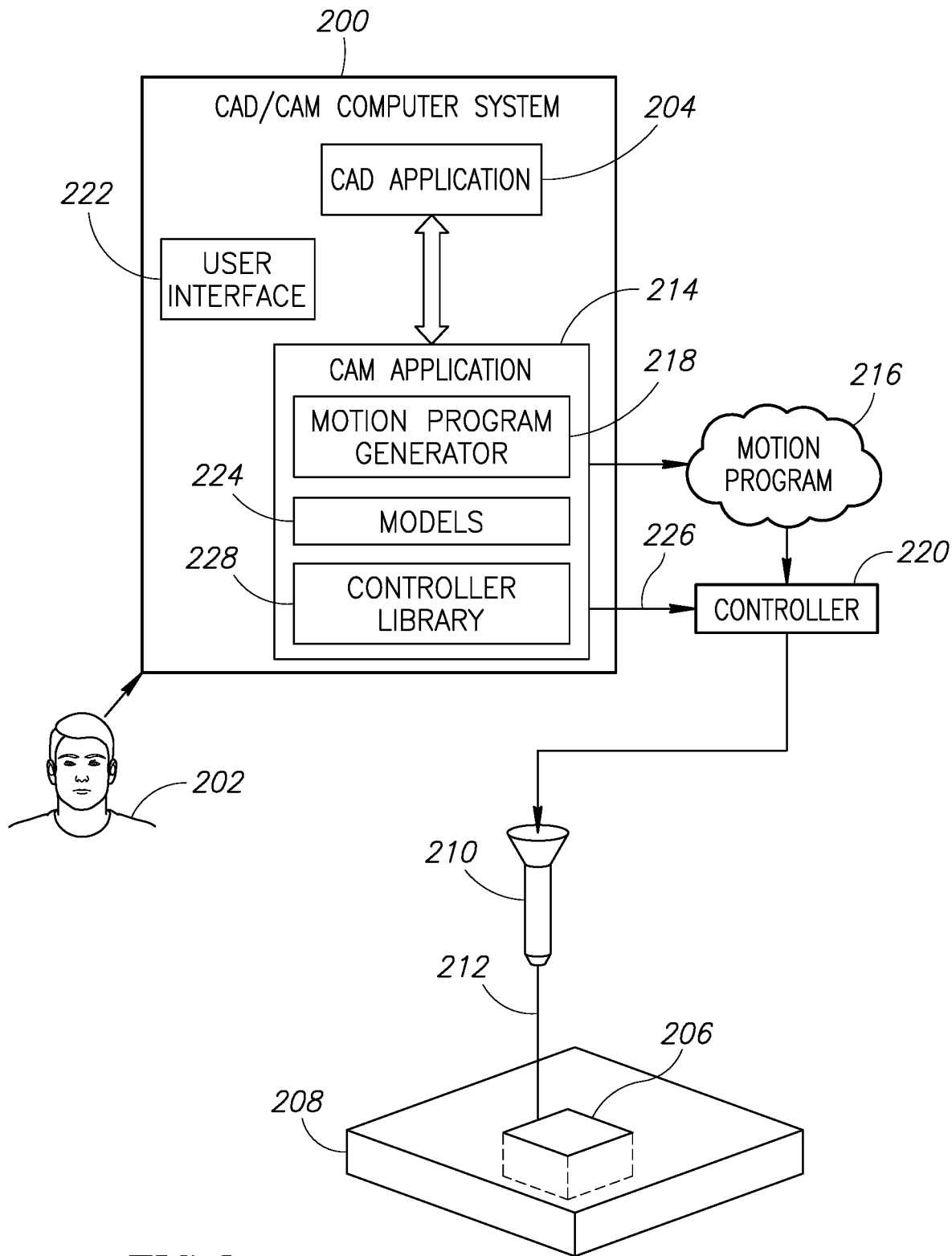
FIG. 2 is a functional block diagram of CAD/CAM system and cutting system, according to one illustrated embodiment.

FIG. 2 is a block diagram illustrating the use of a CAD/CAM computer system 200 to produce a target piece or object 206. In typical operation, an operator 202 uses a CAD application 204 executing on the CAD/CAM system 200 to specify a design of the target object 206 (e.g., a three dimensional object) to be cut from a workpiece material 208. The CAD/CAM system 200 may be directly or indirectly connected to an abrasive waterjet (AWJ) cutting apparatus 210 (or other type of cutting apparatus), such as the high-pressure fluid jet apparatus called the "Dynamic Waterjet® XD" sold by Flow International Corporation. The cutting apparatus 210 utilizes a cutting beam 212 (e.g., a waterjet, a laser beam, etc.) to remove material from the workpiece 208. Other 4-axis, 5-axis, or greater axis machines can also be used providing that the "wrist" of the fluid jet apparatus allows sufficient (e.g., angular) motion. Any existing CAD program or package can be used to specify the design of the target object 206 providing it allows for the operations described herein.

The CAD/CAM system 200 also includes a CAM application 214. The CAM application 214 may be incorporated into the CAD application 204, or vice versa, and may generally be referred to as a CAD/CAM application or system. Alternatively, the CAM application 214 may be separate from the CAD application 204. The CAD application 204 and CAM application 214 may reside on the same or different CAD/CAM systems 200.

A solid 3D model design for the object 206 to be manufactured may be input from the CAD application 204 into the CAM application 214 which, as described in detail below, automatically generates a motion program 216 (or other programmatic or other motion related data) that specifies how the cutting apparatus 210 is to be controlled to cut the object 206 from the workpiece 208. The motion program 216 may be generated by a motion program generator application or module 218 within the CAM application 214. When specified by the operator, the CAM system 200 sends the motion program 216 to a hardware/software controller 220 (e.g., a computer numerical controller, "CNC"), which directs the cutting apparatus 210 to cut the workpiece 208 according to the instructions contained in the motion program to produce the object 206. Used in this manner, the CAM application 214 provides a CAM process to produce target pieces.

Although the CAD/CAM system 200 described in FIG. 2 is shown residing on a CAD/CAM system separate from, but connected to, the cutting apparatus 210, the CAD/CAM system alternatively may be located on other devices within the overall system, depending upon the actual configuration of the cutting apparatus and the computers or other controllers associated with the overall cutting system. For example, the CAD/CAM system 200 may be embedded in the controller 220 of the cutting apparatus itself (as part of the software/firmware/hardware associated with the machine). As another example, the CAD/CAM system 200 may reside on a computer system connected to the controller 220 directly or through a network. In addition, the controller 220 may take many forms including integrated circuit boards as well as robotics systems. All such combinations or permutations are contemplated, and appropriate modifications to the CAM system 200 described, such as the specifics of the motion program 216 and its form, are contemplated based upon the particulars of the cutting system and associated control hardware and software.

In some embodiments, the CAD/CAM system 200 includes one or more functional components/modules that work together to provide the motion program 216 to automatically control the tilt and swivel of the cutting apparatus 210 and other parameters that control the cutting apparatus, and hence the x-axis, y-axis, and z-axis and angular positions of the cutting beam 212 relative to the workpiece material 208 being cut, as the cutting beam moves along a machining path in three dimensional space to cut the object 206. These components may be implemented in software, firmware, or hardware or a combination thereof. The CAD/CAM system 200 may include the motion program generator 218, a user interface 222, such as a graphical user interface ("GUI"), one or more models 224, and an interface 226 to the cutting apparatus controller 220. The motion program generator 218 may be operatively coupled to the CAD application 204 and the user interface 222 to create the motion program 216 or comparable motion instructions or data that can be forwarded to and executed by the controller 220 to control the cutting apparatus 210, and hence the cutting beam 212. Alternative arrangements and combinations of these components are equally contemplated for use with techniques described herein. For example, in some embodiments, the user interface 222 is intertwined with the motion program generator 218 so that the user interface controls the program flow and generates the motion program 216 and/or data. In another embodiment, the core program flow is segregated into a kernel module, which is separate from the motion program generator 218.

The models 224 (also referred to as machining knowledge data) provide the motion program generator 218 with access to sets of mathematical models or data that may be used to determine appropriate cutting beam orientation and cutting process parameters. Each mathematical model may include one or more sets of algorithms, equations, tables, or data that are used by the motion program generator 218 to generate particular values for the resultant commands in the motion program 216 to produce desired cutting characteristics or behavior. For example, in a 5-axis machine environment, these algorithms/equations may be used to generate the x-position, y-position, z-standoff compensation value, and deviation correction angles (for example, that are used to control the tilt and swivel positions of the cutting apparatus) of each command if appropriate. In some embodiments, the models 224 include a set of algorithms, equations, tables, rules or data for generating deviation corrections, for generating speed and acceleration values, for determining machining paths including sequences for machining paths, and other models. The mathematical models or machining knowledge data may be created experimentally and/or theoretically based upon empirical observations and prior analysis of machining data and stored in or on one or more non-transitory computer- or processor-readable medium.

In some embodiments, the CAD/CAM system 200 also includes the interface 226 to the controller 220 (e.g., through a controller library 228), which provides functions for two way communication between the controller and the CAD/CAM system. These controller functions may be used, for example, to display the machining path in progress while the object 206 is being cut out of the workpiece 208. They may also be used to obtain values of the cutting apparatus 210, such as the current state of the attached mechanical and electrical devices. In embodiments where the CAD/CAM system 200 is embedded in the controller 220 or in part of the cutting apparatus 210, some of these components or functions may be eliminated.

Many different arrangements and divisions of functionality of the components of a CAD/CAM system 200 are possible. The embodiments described herein may be practiced without some of the specific details, or with other specific details, such as changes with respect to the ordering of the code flow, different code flows, etc., or the specific features shown on the user interface screens. Thus, the scope of the techniques and/or functions described is not limited by the particular order, selection, or decomposition of blocks described with reference to any particular routine or code logic. In addition, example embodiments described herein provide applications, tools, data structures and other support to implement a CAD/CAM system 200 for cutting objects. Other embodiments of the described techniques may be used for other purposes, including for other fluid jet apparatus cutting, laser beam cutting, etc.

Figure 3:
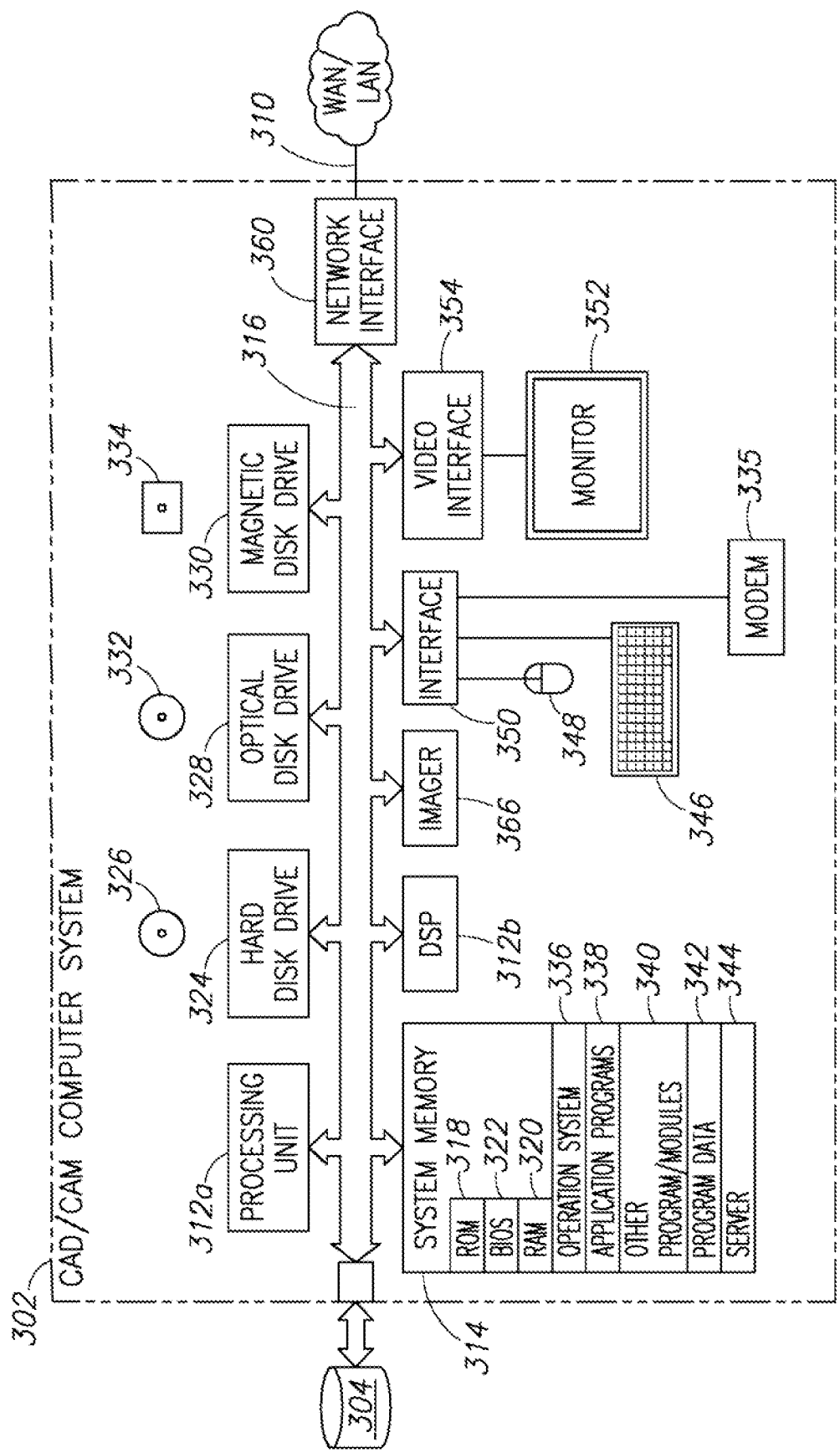
FIG. 3 is a functional block diagram of portions of the CAD/CAM system of FIG. 2, according to one illustrated embodiment.

FIG. 3 and the following discussion provide a brief, general description of the components forming an exemplary CAD/CAM system 302 in which the various illustrated embodiments can be implemented. Although not required, some portion of the embodiments will be described in the general context of computer-executable instructions or logic, such as program application modules, objects, or macros being executed by a computer. Those skilled in the relevant art will appreciate that the illustrated embodiments as well as other embodiments can be practiced with other computer system configurations, including handheld devices for instance Web enabled cellular phones or PDAs, multi-processor systems, microprocessor-based or programmable consumer electronics, personal computers ("PCs"), network PCs, minicomputers, mainframe computers, and the like. The embodiments can be practiced in distributed computing environments where tasks or modules are performed by remote processing devices, which are linked through a communications network. In a distributed computing environment, program modules may be located in both local and remote memory storage devices (e.g., remote memory storage device 304).

The CAD/CAM system 302 may include one or more processing units 312a, 312b (collectively 312), a system memory 314 and a system bus 316 that couples various system components, including the system memory 314 to the processing units 312. The processing units 312 may be any logic processing unit, such as one or more central processing units (CPUs) 312a or digital signal processors (DSPs) 312b. The system bus 316 can employ any known bus structures or architectures, including a memory bus with memory controller, a peripheral bus, and/or a local bus. The system memory 314 includes read-only memory ("ROM") 318 and random access memory ("RAM") 320. A basic input/output system ("BIOS") 322, which can form part of the ROM 318, contains basic routines that help transfer information between elements within the CAD/CAM system 302, such as during start-up.

The processing unit(s) 312 may be any logic processing unit, such as one or more central processing units (CPUs), digital signal processors (DSPs), application-specific integrated circuits (ASICs), field programmable gate arrays (FPGAs), graphical processing units (GPUs), etc. Non-limiting examples of commercially available computer systems include, but are not limited to, an 80×86 or Pentium series microprocessor from Intel Corporation, U.S.A., a PowerPC microprocessor from IBM, a Sparc microprocessor from Sun Microsystems, Inc., a PA-RISC series microprocessor from Hewlett-Packard Company, a 68xxx series microprocessor from Motorola Corporation, an ATOM processor, or an A4 or A5 processor. Unless described otherwise, the construction and operation of the various blocks in FIG. 3 are of conventional design. As a result, such blocks need not be described in further detail herein, as they will be understood by those skilled in the relevant art.

The CAD/CAM system 302 may include a hard disk drive 324 for reading from and writing to a hard disk 326, an optical disk drive 328 for reading from and writing to removable optical disks 332, and/or a magnetic disk drive 330 for reading from and writing to magnetic disks 334. The optical disk 332 can be a CD-ROM, while the magnetic disk 334 can be a magnetic floppy disk or diskette. The hard disk drive 324, optical disk drive 328 and magnetic disk drive 330 may communicate with the processing unit 312 via the system bus 316. The hard disk drive 324, optical disk drive 328 and magnetic disk drive 330 may include interfaces or controllers (not shown) coupled between such drives and the system bus 316, as is known by those skilled in the relevant art. The drives 324, 328 and 330, and their associated computer-readable media 326, 332, 334, provide nontransitory nonvolatile storage of computer-readable instructions, data structures, program modules and other data for the CAD/CAM system 302. Although the depicted CAD/CAM system 302 is illustrated employing a hard disk 324, optical disk 328 and magnetic disk 330, those skilled in the relevant art will appreciate that other types of computer-readable media that can store data accessible by a computer may be employed, such as WORM drives, RAID drives, magnetic cassettes, flash memory cards, digital video disks ("DVD"), Bernoulli cartridges, RAMs, ROMs, smart cards, etc.

Program modules can be stored in the system memory 314, such as an operating system 336, one or more application programs 338, other programs or modules 340 and program data 342. The application programs 338 may include instructions that cause the processor(s) 312 to implement the CAD application and CAM application shown in FIG. 2, for example. These various aspects are described in detail herein with reference to the various flow diagrams.

The system memory 314 may also include communications programs, for example, a server 344 that causes the CAD/CAM system 302 to serve electronic information or files via the Internet, intranets, extranets, telecommunications networks, or other networks. The server 344 in the depicted embodiment is markup language based, such as Hypertext Markup Language (HTML), Extensible Markup Language (XML) or Wireless Markup Language (WML), and operates with markup languages that use syntactically delimited characters added to the data of a document to represent the structure of the document. A number of suitable servers may be commercially available such as those from Mozilla, Google, Microsoft and Apple Computer.

While shown in FIG. 3 as being stored in the system memory 314, the operating system 336, application programs 338, other programs/modules 340, program data 342 and server 344 can be stored on the hard disk 326 of the hard disk drive 324, the optical disk 332 of the optical disk drive 328 and/or the magnetic disk 334 of the magnetic disk drive 330.

An operator can enter commands and information into the CAD/CAM system 302 through input devices such as a touch screen or keyboard 346 and/or a pointing device such as a mouse 348, imager 366 and/or via a graphical user interface. Other input devices can include a microphone, joystick, game pad, tablet, scanner, etc. These and other input devices are connected to one or more of the processing units 312 through an interface 350 such as a serial port interface that couples to the system bus 316, although other interfaces such as a parallel port, a game port or a wireless interface or a universal serial bus ("USB") can be used. A monitor 352 or other display device is coupled to the system bus 316 via a video interface 354, such as a video adapter. The CAD/CAM system 302 can include other output devices, such as speakers, printers, etc.

The CAD/CAM system 302 can include one or more network interfaces 360, one or more modems 335, and can operate in a networked environment 300 using logical connections 310 to one or more remote computers and/or devices. For example, the CAD/CAM system 302 can operate in a networked environment using logical connections 310 to the controller of the waterjet apparatus (FIG. 2). Communications may be via a wired and/or wireless network architecture, for instance, wired and wireless enterprise-wide computer networks, intranets, extranets, and/or the Internet. Other embodiments may include other types of communications networks including telecommunications networks, cellular networks, paging networks, and other mobile networks. There may be any variety of computers, switching devices, routers, bridges, firewalls and other devices in the communications paths between the CAD/CAM system 302 and other client processor-based systems.

Figure 4A:
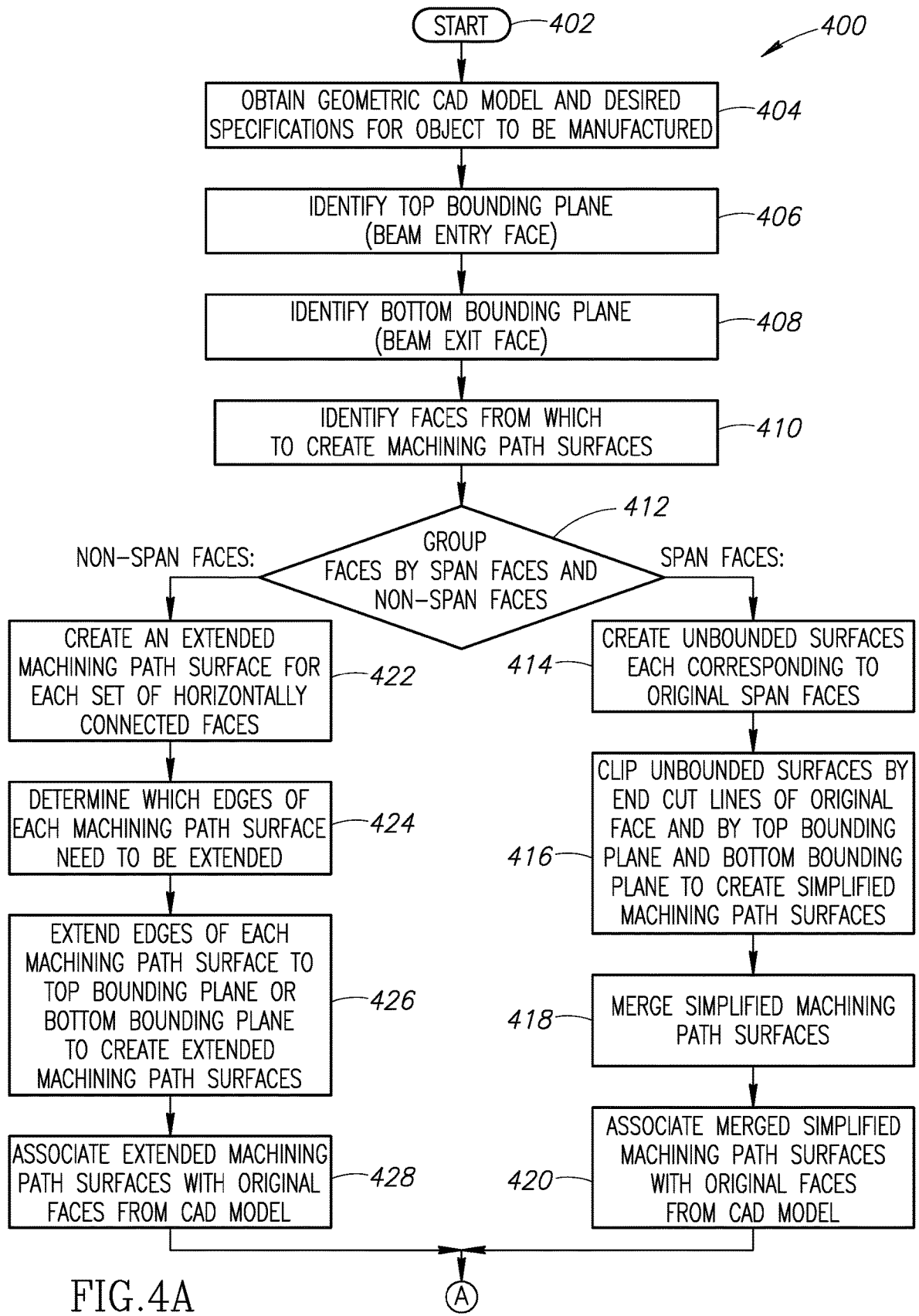
FIGS. 4A and 4B are a flow diagram that shows a method of operation for a CAD/CAM system, according to one illustrated embodiment.
Figure 4B:
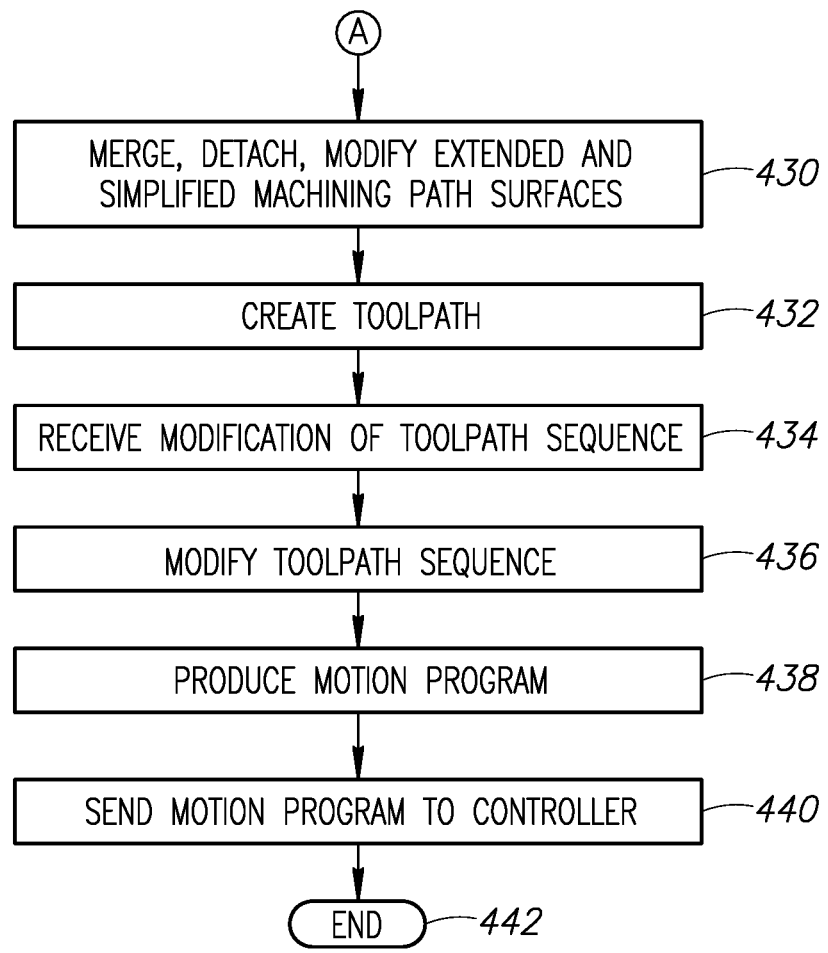

FIGS. 4A and 4B depict an example flow diagram of a process 400 executed by an embodiment of a CAD/CAM system, controller, and cutting apparatus to produce an object from a workpiece. The process 400 may be described in the context of a waterjet cutting apparatus, but the process may also be implemented for use with other types of cutting systems. The process 400 starts at 402. At 404, a CAM application gathers a variety of input data from a CAD application, such as the CAD application 204 executing on the CAD/CAM system 200 of FIG. 2. The input data may include a design (a geometry specification) for a target piece or object in a three-dimensional CAD format (e.g., a CAD solid model), or equivalent. As discussed above, in some embodiments the CAM application is integrated into the CAD application.

In addition to a CAD solid model, other customer requirements can be specified and gathered, such as dimensional tolerances, and an indication of the surface finish (and/or desired quality and/or acceptable speed). In some embodiments, these input specifications may be supplied by a graphical user interface, such as the user interface 222 of FIG. 2, by using tools that allow the user to assign tolerances and/or indications of desired finish to particular regions of (areas and/or surfaces of) the target object, for example, through standard or proprietary user interface controls such as buttons, edit fields, drop down menus or a direct manipulation interface that incorporates drag-drop techniques. The CAD/CAM system may also gather other input data, such as process parameters, typically from an operator, although these parameters may have default values or some may be able to be queried and obtained from the controller of the cutting apparatus. In some example embodiments, the CAD/CAM system determines values for one or more of the type of material being cut, material thickness, fluid pressure, nozzle orifice diameter, abrasive flow rate, abrasive type, offset distance, mixing tube diameter, and mixing tube length (or other mixing tube characteristics) as process parameters.

The CAD/CAM system may also use the received geometry specification and input process parameters to automatically calculate an offset geometry. The offset geometry is the geometry that needs to be followed when the target object is cut to account for any width that the beam actually takes up (the width of the cut/kerf due to the beam).

Blocks 406-436 depict acts used to produce a motion program storing program values in a motion program structure (or other data structure, as needed by a particular cutting apparatus controller (FIG. 2), cutting head, etc.). The entries in the data structure may correspond to stored motion program instructions and/or data that are executed by the controller. Depending upon the particular cutting apparatus and controller, the motion program may be motion instructions and/or data, fed directly or indirectly to the hardware/software/firmware that controls the cutting apparatus (e.g., the cutting head thereof). In addition, some configurations require inverse kinematic data because the instructions are specified from the point of view of the motors in the cutting apparatus instead of from the point of view of the cutting beam. Inverse kinematics can be computed using known mathematics to convert beam coordinates into motor (or sometimes referred to as joint) commands. All such embodiments can be incorporated into a CAD/CAM system appropriately configured to use the techniques described herein.

Figure 5:
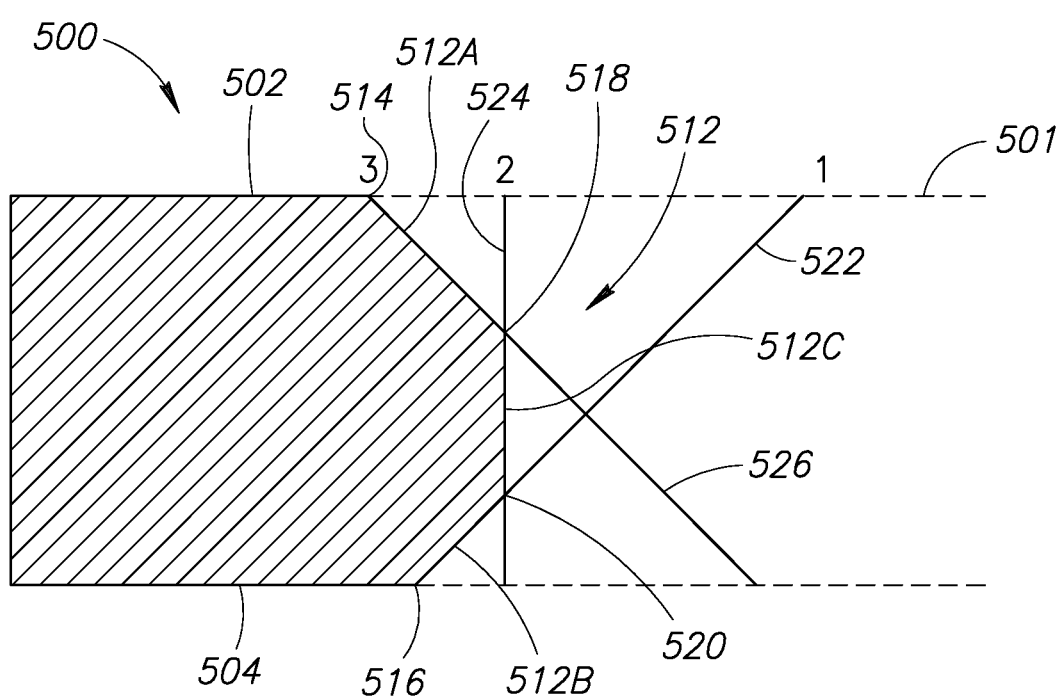
FIG. 5 is a sectional view of a CAD solid model having a beveled surface, according to one illustrated embodiment.

The acts 406-436 used to produce a motion program are discussed below with reference to FIG. 5 and FIGS. 6A-6G. FIG. 5 illustrates a sectional view of a CAD solid model 500 representative of a three dimensional object to be manufactured by cutting away material from a workpiece 501 using a tool, such as a waterjet cutting system. FIGS. 6A-6G are simplified screen prints 600-612 of an example embodiment of the CAD/CAM system user interface 222 (FIG. 2) illustrating one or more of the acts of FIG. 4 utilized to create a motion program to manufacture the object 500 of FIG. 5. Many variations of these screen prints, including the input requested, the output displayed, and the control flow, are contemplated to be used with the techniques described herein.

Figure 6A:
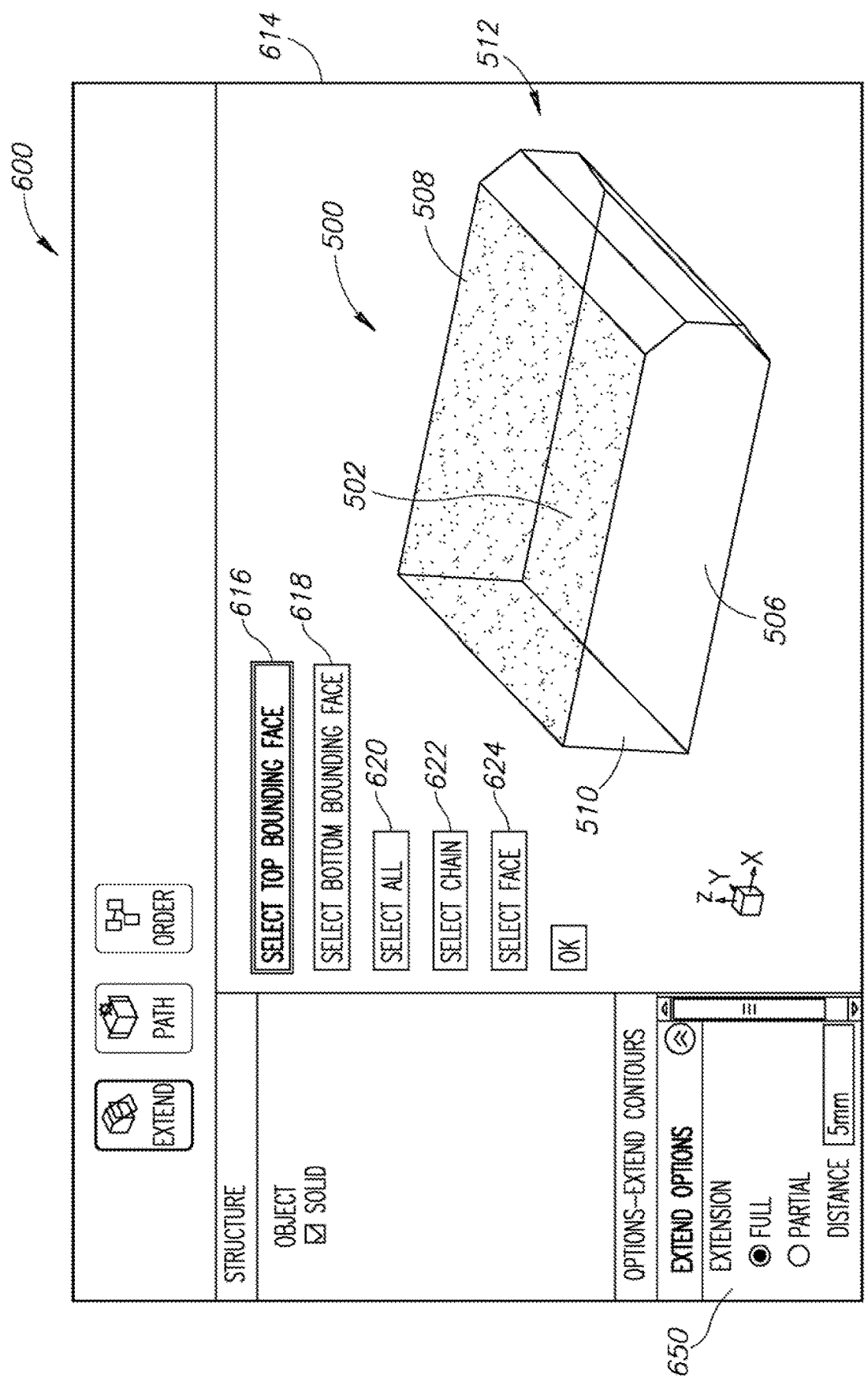
FIGS. 6A-6G are simplified screen prints of a user interface for a CAD/CAM system displayed on a display of the CAD/CAM system, according to one illustrated embodiment.

Referring to FIGS. 5 and 6A, the CAD solid model 500 includes a top surface 502, a bottom surface 504, a vertical front surface 506, a vertical rear surface 508, a vertical left side surface 510, and a right side beveled surface 512. The beveled surface 512 includes an angled upper bevel face 512A having an upper edge 514 adjacent to the top face 502, an angled lower bevel face 512B having a lower edge 516 adjacent to the bottom face 504, and a vertical middle bevel face 512C extending between the upper bevel face and the lower bevel face (i.e., a "k-bevel"). An edge 518 defines a lower edge of the upper bevel face 512A and an upper edge of the vertical middle bevel face 512C. An edge 520 defines an upper edge of the lower bevel face 5126 and a lower edge of the vertical middle bevel face 512C. FIG. 5 shows a first cut path 522 that may be traversed by a cutting beam of a tool (e.g., a waterjet) to define the lower bevel face 512B. A second cut path 524 is shown which may be traversed by a cutting beam of a tool to define the middle vertical bevel face 512C. A third cut path 526 is shown which may be traversed by a beam of a tool to define the upper bevel face 512A. The sequence in which the cut paths 522, 524, and 526 are implemented may be automatically determined by the CAD/CAM system (e.g., based on obtained cutting knowledge data), and/or the sequence may be selected by an operator.

FIG. 6A depicts the screen display 600 for a motion program generator module, such as the motion program generator module 218 of FIG. 2. A drawing display area 614 contains a view of the CAD solid model 500 representative of the three dimensional object to be cut out of the workpiece 501 by a tool, such as a waterjet apparatus. As discussed above, a CAD solid model 500 or other data that represents the geometry of the object may be displayed in the drawing display area 614. As shown in FIG. 5, during a cutting process a tool may be used to cut the workpiece 501 along machining paths 522, 524, and 526 that traverse the lower bevel face, the middle bevel face, and the upper bevel face. The tool may also cut along machine paths that traverse the vertical front surface, the vertical left side surface, and the vertical rear surface to produce the three dimensional object represented by the CAD solid model 500.

Figure 6B:
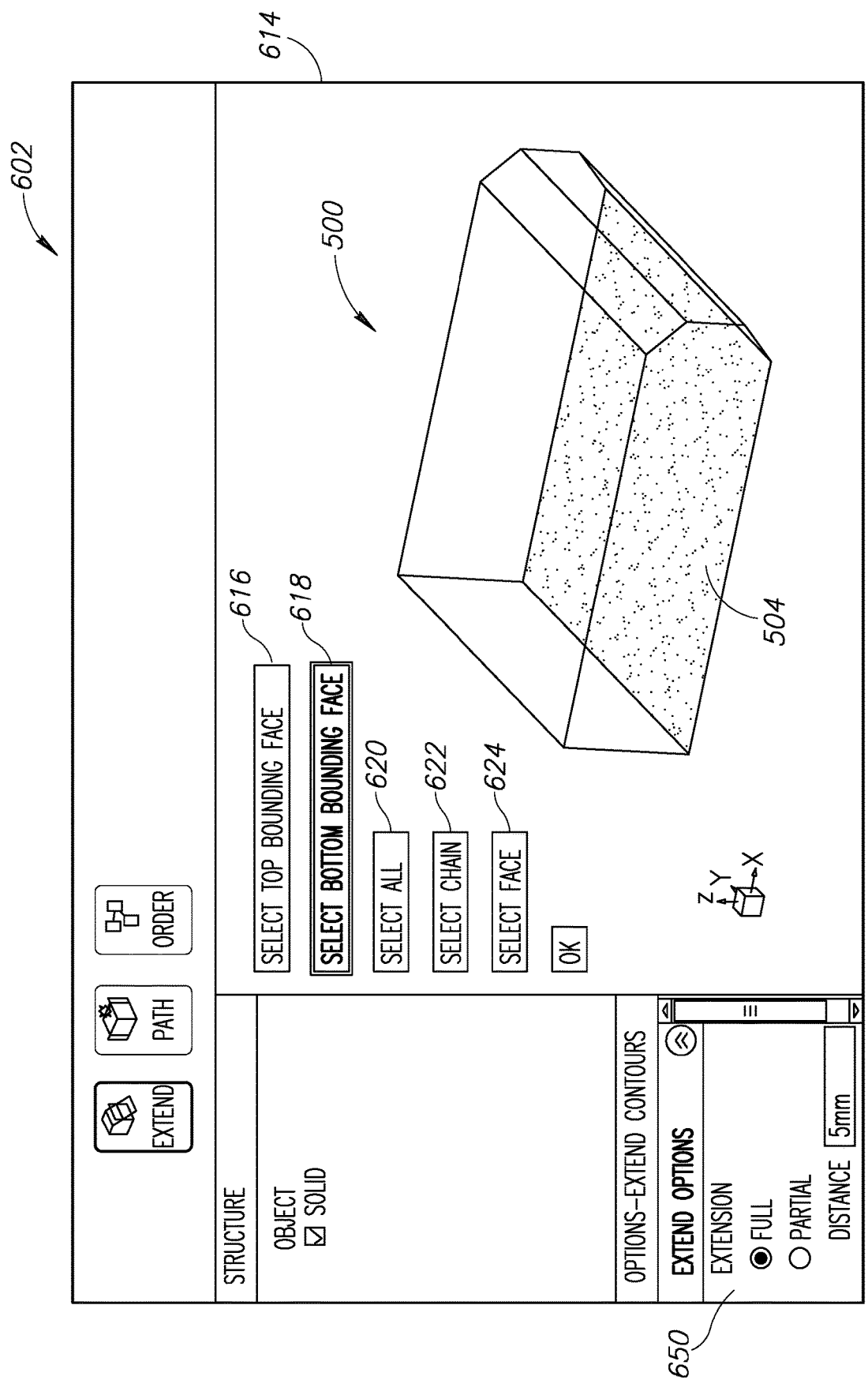

At 406, the CAD/CAM system identifies the top face 502 of the CAD solid model 500 as a top bounding surface or area that corresponds to a cutting beam entrance area. As shown in FIG. 6A, the operator may select a "select top bounding surface" icon 616 in the drawing display area 614 and then select the top face 502 of the CAD solid model 500. At 408, the CAD/CAM system identifies the bottom face 504 of the CAD solid model 500 as a bottom bounding surface or area that corresponds to a cutting beam exit area. As shown in FIG. 6B, the operator may select a "select bottom bounding face" icon 618 in the drawing display area 614 and then select the bottom face 504 of the CAD solid model 500. In some embodiments, the CAD/CAM system is operative to automatically or autonomously select the top bounding area and the bottom bounding area without user intervention. Although this example selects a top bounding area and a bottom bounding area, other types of bounding areas may be used to define beam entry areas and beam exit areas. Moreover, the bounding areas may not correspond to a surface of the CAD solid model 500. For example, the CAD solid model 500 may represent an object to be cut from a middle portion of a workpiece, and the bounding areas may be selected based on one or more surfaces of the workpiece rather than surfaces of the CAD solid model 500. The bounding areas may be planar or non-planar in shape (e.g., to accommodate different shapes of workpieces).

At 410, the CAD/CAM system identifies one or more machining faces from which to create machining path CAM surfaces (or "surface models") to be stored in at least one nontransitory processor-readable medium, such as the hard disk 226 of the hard disk drive 224 of FIG. 2. The machining faces of the CAD solid model are the faces of the CAD solid model that are machined or cut by a cutting beam of a tool when the object is machined from the workpiece 501. In this example, the machining faces include the vertical front face 506, the vertical left side face 510, the vertical rear face 508, the lower bevel face 512B, the middle bevel face 512C, and the upper bevel face 512A.

The machining path CAM surfaces discussed below may be considered "virtual," "phantom," or "intermediate" surfaces, since the machining path CAM surfaces are not actual representations of the object to be manufactured. Rather, the machining path CAM surfaces are generated by the CAD/CAM system to provide visualization and/or representation of the machining path of a cutting beam of a tool, such as jet of a waterjet cutting system.

Figure 6C:
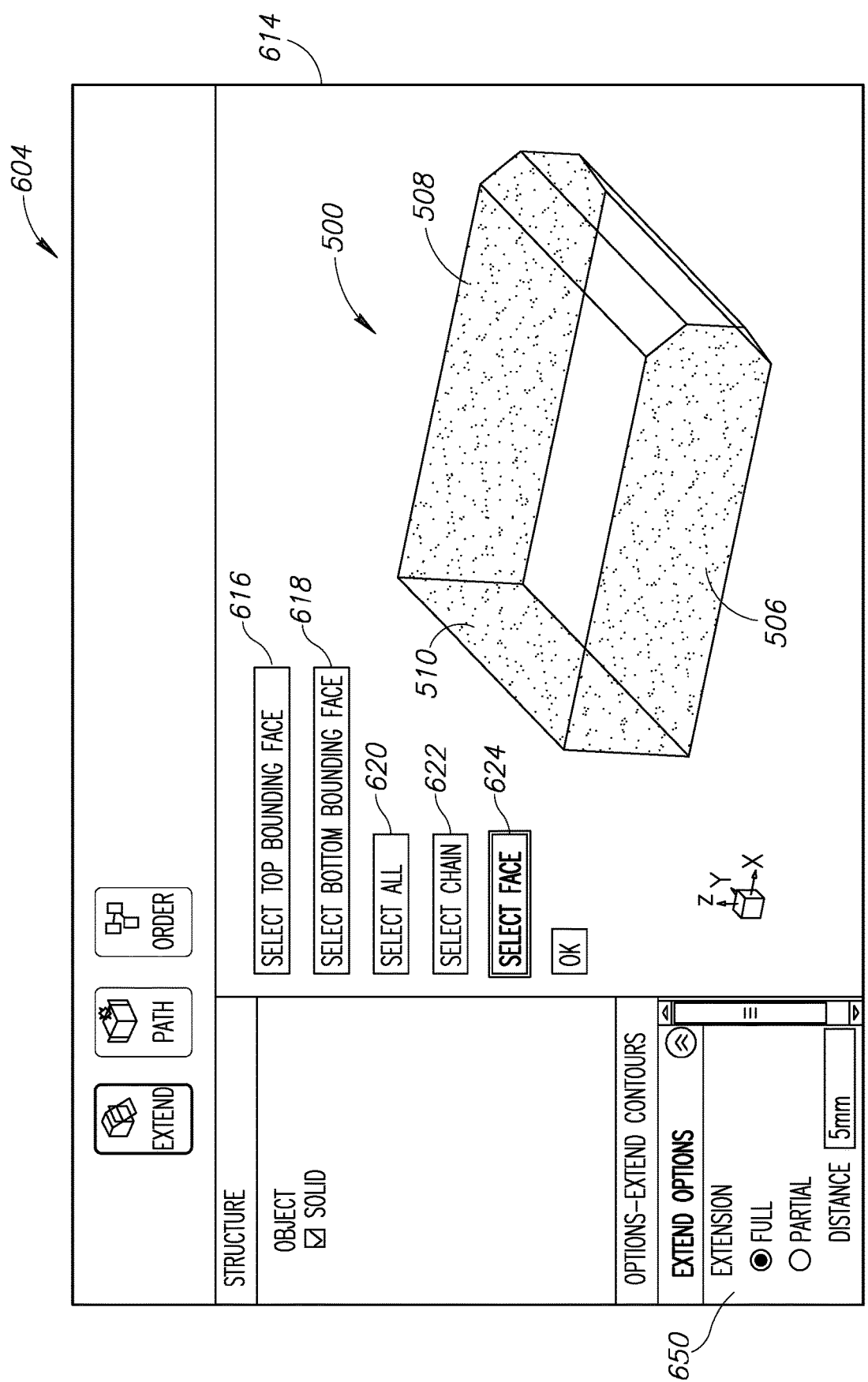

As shown in FIG. 6C, the CAD/CAM system may include a "select all" icon 620, a "select chain" icon 622, and a "select face" icon 624. When the select all icon 620 is selected by the operator, the CAD/CAM system may automatically or autonomously identify all of the machining faces of the CAD solid model 500 to be used to creating one or more machining path CAM surfaces. When the select chain icon 622 is selected, the operator may select a machining face of the CAD solid model 500 and the CAD/CAM system automatically or autonomously selects machining faces in the same horizontal plane that are connected to the selected machining face in a chain (i.e., horizontally connected machining faces). For example, when the select chain icon 622 is selected, the operator may select the front vertical face 506, and the CAD/CAM system may automatically select the left side face 510 and the rear face 508 to form a chain of machining faces. When the select face icon 624 is selected, the operator may select individual machining faces to be used to create one or more machining path CAM surfaces. These options for selecting or identifying machining faces are provided as examples, but other methods for selecting and identifying machining faces may be used.

Figure 6D:
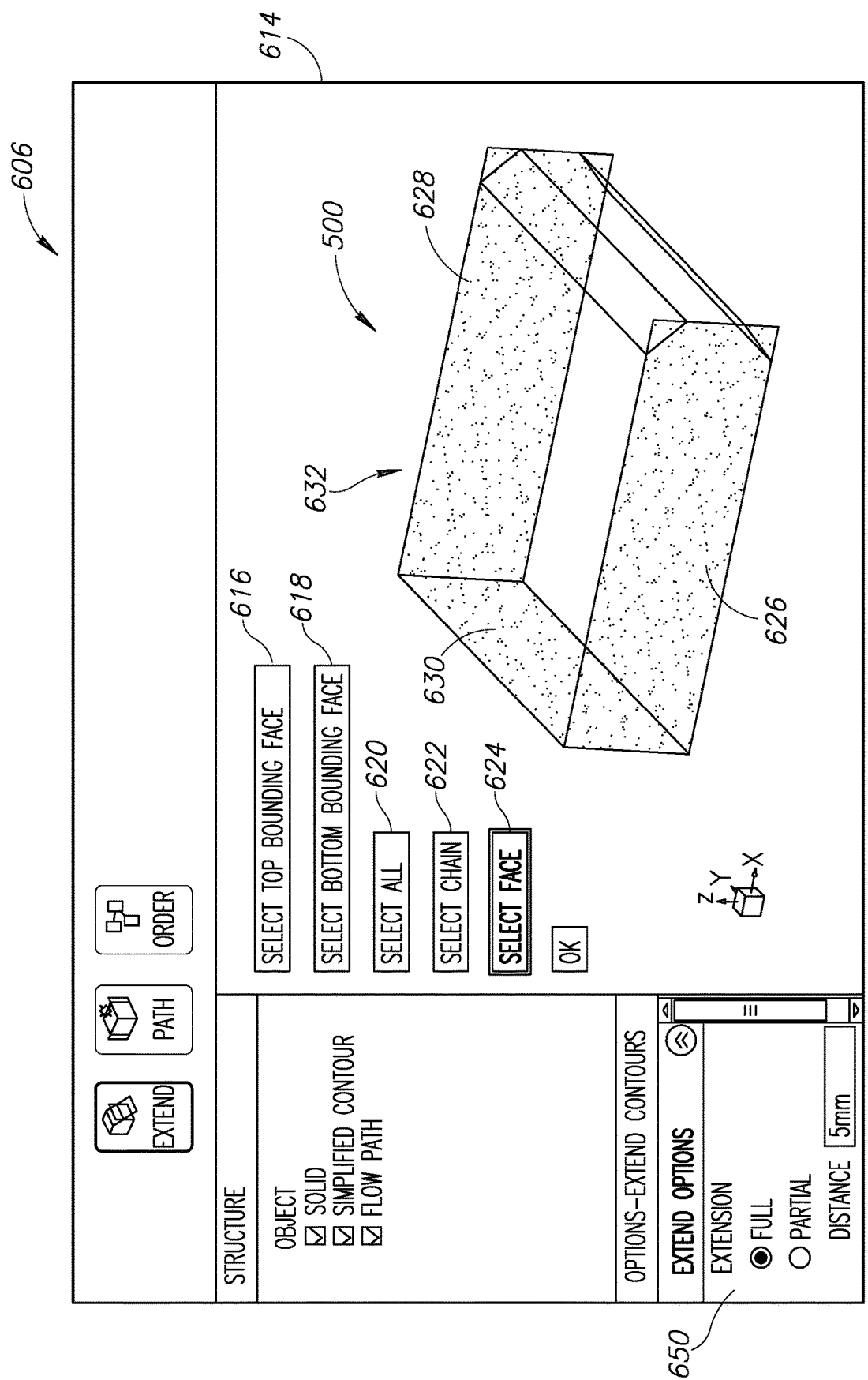
Figure 6E:
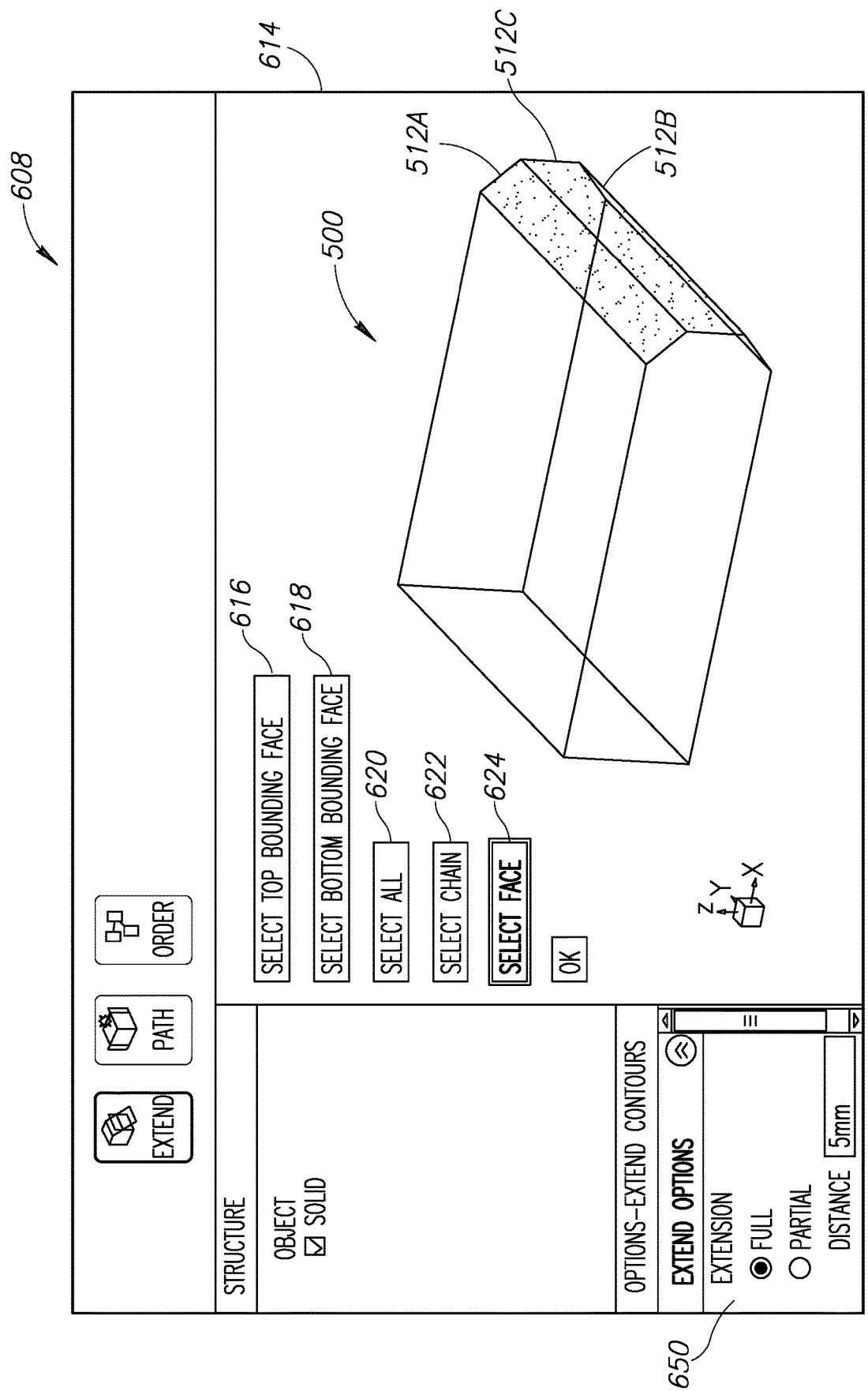

At 412, the CAD/CAM system may group the machining faces into two groups: machining faces that span between the top surface 508 and the bottom surface 504 (i.e., "spanning faces"), and machining faces that do not span between the top surface and the bottom surface (i.e., "non-spanning faces"). In this example, the spanning faces include the vertical front face 506, the vertical left side face 510, and the vertical rear face 508. FIG. 6C shows selection of the spanning faces 506, 508, and 510 of the CAD solid model 500. The non-spanning faces include the lower bevel face 512B, the middle bevel face 512C, and the upper bevel face 512A. FIG. 6E shows selection of the non-spanning faces 512A-C of the CAD solid model 500.

Blocks 414-420 depict acts for creating simplified machining path CAM surfaces for spanning faces or surfaces of an object to be manufactured from a workpiece. As discussed below, the simplified machining path CAM surfaces are representative of a machining path of a cutting beam of a tool (e.g., a beam of a waterjet cutting apparatus) that passes through a workpiece. At 414, the CAD/CAM system may create an unbounded surface that is coplanar with a spanning face (e.g., the front face 506 of the CAD solid model 500). At 416, the CAD/CAM system may clip the unbounded surface on the left and right sides by end cut lines or boundaries of the spanning face and on the top and bottom by the top bounding area and the bottom bounding area, respectively, to create a simplified machining path CAM surface. Resulting simplified machining path CAM surfaces 626, 628, and 630 for the spanning surfaces 506, 508, and 510, respectively, are shown in FIG. 6D.

The simplified machining path CAM surfaces 626, 628, and 630 may be defined as "ruled surfaces." A ruled surface is typically described by a set of points swept by a moving straight line. The straight lines themselves may be referred to as "rulings." Since an unobstructed cutting beam of a waterjet or laser cutting system will proceed in a straight line, a ruled surface gives a natural way to define a cutting beam path for such a tool. Cutting an object having a non-ruled surface can be made to approximate the cutting of an object having a ruled surface by viewing the cutting of the non-ruled surface as cutting a series of smaller ruled surfaces.

Figure 11A:
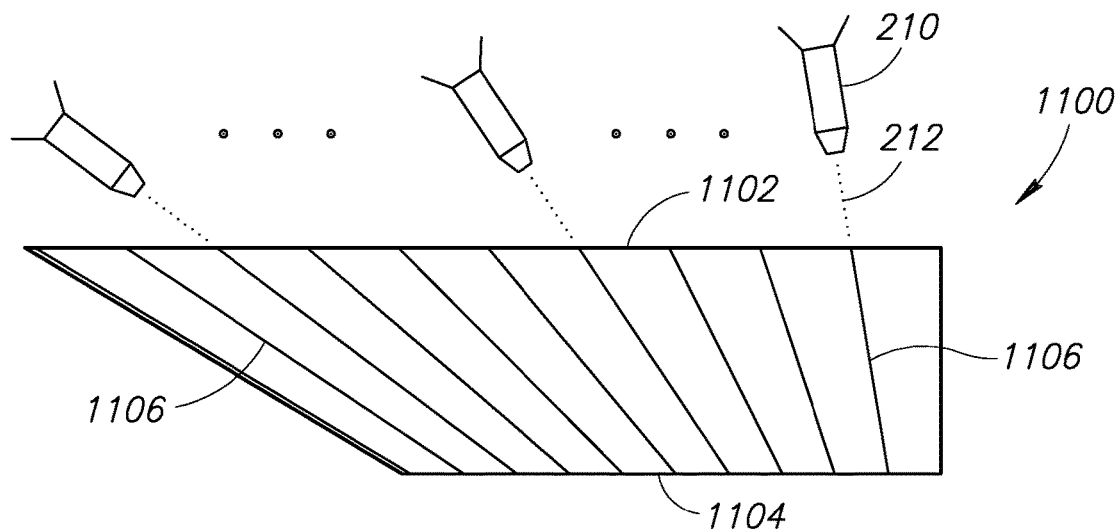
FIG. 11A is an elevational view of a machining path CAM surface created by a CAD/CAM system, according to one illustrated embodiment.

In some embodiments, each of the simplified machining path CAM surfaces is segmented into a number of object or part geometry vectors (PGVs). This segmentation is performed, for example, automatically by components of the CAD/CAM system. FIG. 11A show example segmentation of a simplified machining path CAM surface 1100 for an object to be cut from a flat workpiece. A top edge 1102 of the simplified machining path CAM surface 1100 defines a beam entrance contour where the cutting beam 212 will enter the target material as it progresses along the desired machining path, and a bottom edge 1104 defines a beam exit contour where the cutting beam will leave the material accordingly. The PGVs are formed by using multiple lines 1106 to connect the beam entrance contour to the beam exit contour in a one to one relationship. That is, there are an equal number of segments between PGVs in both the entrance and exit contours. In some embodiments, the number of PGVs may be determined by the desired resolution of the target object to be cut. For example, a circular contour may require a large number of PGVs to optimally retain its circular shape. If the segmentation process results in too few PGVs, then the desired circle would look like a polygon after it is cut. Other factors such as the hardware kinematics or motion controller capabilities may also be considered when determining the number of required PGVs. Additionally, lead-in and lead-out PGVs may be added to the geometry (or beforehand to the geometry specified by the user) to correspond to start and finishing positions of the cutting beam. These vectors do not define the part, but describe the way the cutting beam starts and ends its cut into the workpiece.

At 418, the CAD/CAM system may merge the created simplified machining path CAM surfaces into a combined simplified machining path CAM surface. For example, the simplified machining path CAM surfaces 626, 628, and 630 shown in FIG. 6D may be combined into a single combined simplified machining path CAM surface 632. At 420, the simplified machining path CAM surfaces 626, 628, and 630 are logically associated in at least one nontransitory processor-readable medium with the spanning faces 506, 508, and 510, respectively.

Blocks 422-428 depict acts for creating extended machining path CAM surfaces for the non-spanning surfaces of an object to be manufactured from a workpiece. The extended machining path CAM surfaces are representative of a machining path of a cutting beam of a tool (e.g., a beam of a waterjet cutting apparatus) that passes through a workpiece material. At 422, the CAD/CAM system may create an extended machining path CAM surface for each set of horizontally connected (e.g., in the same horizontal plane) non-spanning faces of the CAD solid model. In the example of FIG. 5 and FIGS. 6A-6G, none of the non-spanning faces 512A-C is horizontally connected to other non-spanning faces. FIGS. 7A-7C, discussed below, illustrate an CAD solid model 700 having horizontally connected non-spanning faces that may be grouped together when creating extended machining path CAM surfaces. Referring back to the example of FIG. 5 and FIGS. 6A-6G, the CAD/CAM system may create an extended machining path CAM surface for each of the non-spanning surfaces 512A-C of the CAD solid model 500 (FIG. 6E). Each of the extended machining path CAM surfaces may initially be a duplicate or copy of its respective associated non-spanning face of the CAD solid model 500 that is subsequently "extended."

At 424, the CAD/CAM system determines which edges of the created extended machining path CAM surfaces should be extended to represent a cutting beam of the tool that passes through the workpiece. At 426 in some embodiments, upper edges of the extended machining path CAM surfaces spaced apart from the top bounding area are extended to the top bounding area, and the lower edges of the extended machining path CAM surfaces spaced apart from the bottom bounding area are extended to the bottom bounding area. At 428, each of the extended machining path CAM surfaces is logically associated in at least one nontransitory processor-readable medium with the non-spanning face or faces from which it is derived.

Figure 6F:
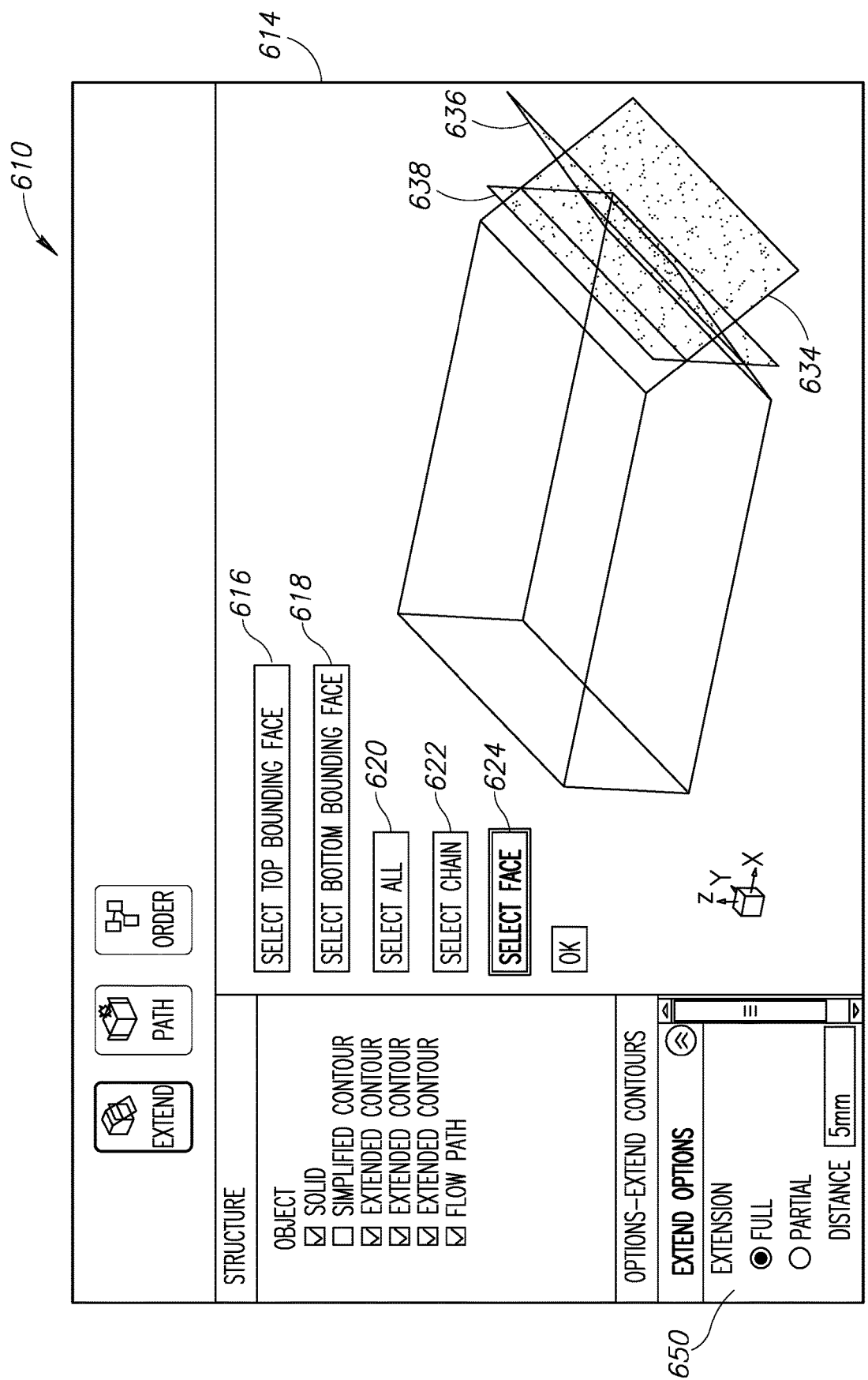
Figure 7A:
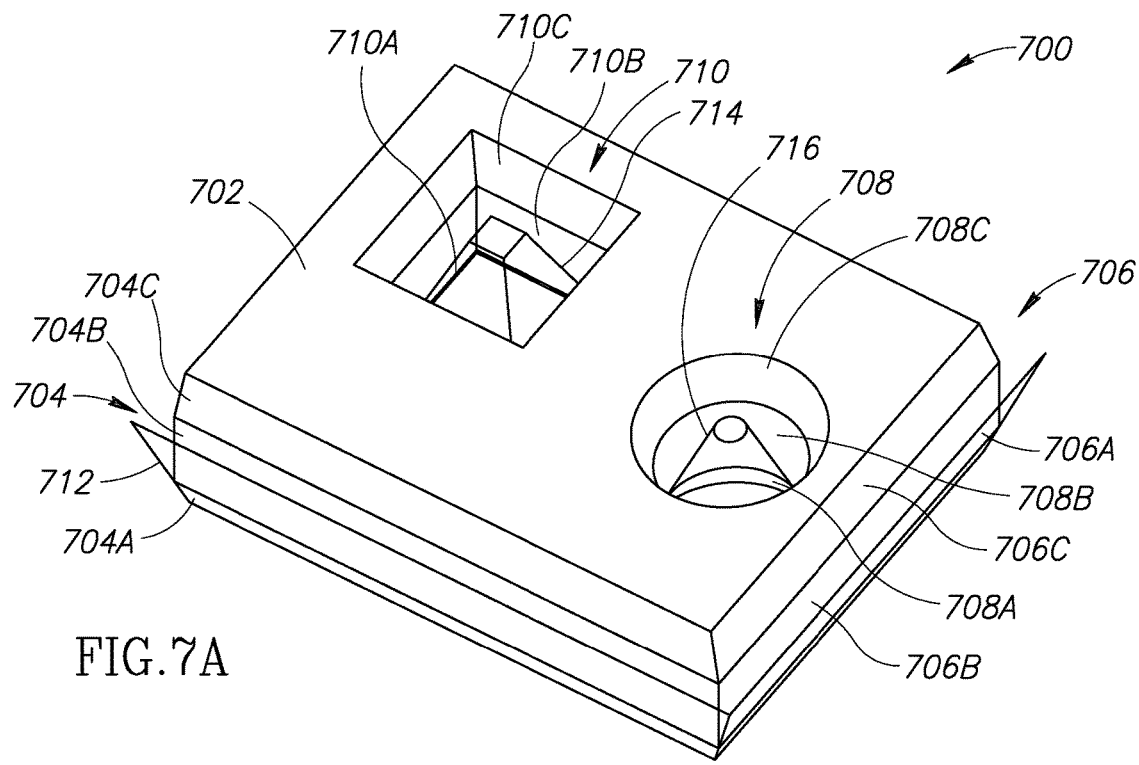
FIG. 7A is an isometric view of extended machining path CAM surfaces that extend lower bevel faces of a CAD solid model, according to one illustrated embodiment.
Figure 7B:
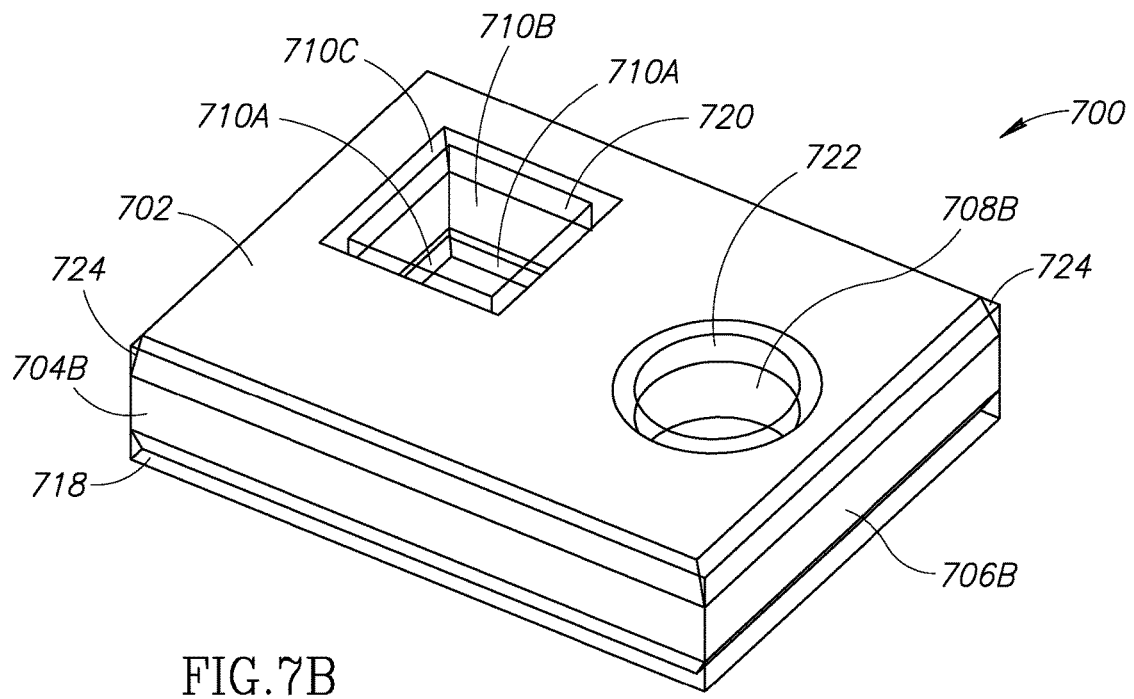
FIG. 7B is an isometric view of extended machining path CAM surfaces that extend middle bevel faces of the CAD solid model of FIG. 7A, according to one illustrated embodiment.
Figure 7C:
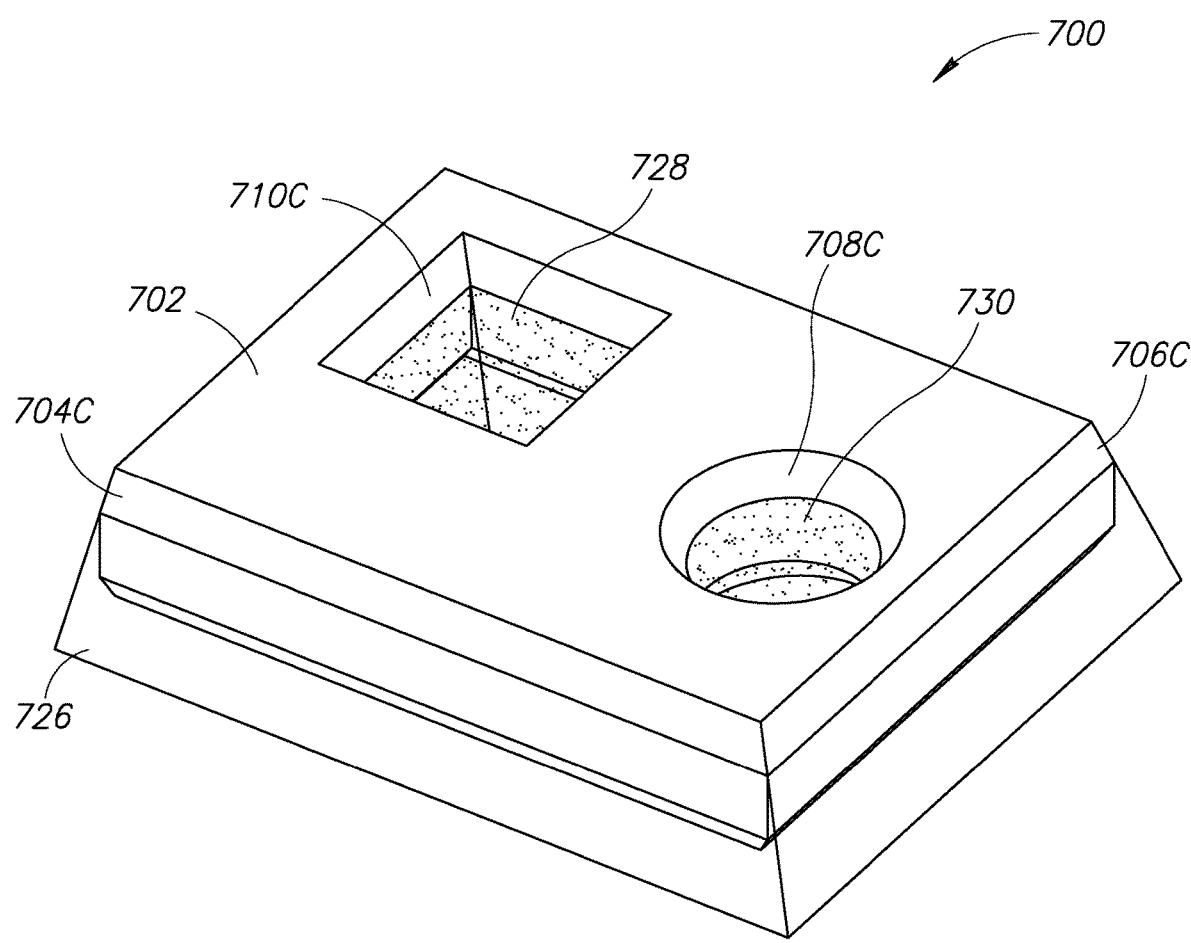
FIG. 7C is an isometric view of extended machining path CAM surfaces that extend upper bevel faces of the CAD solid model of FIG. 7A, according to one illustrated embodiment.

FIG. 6F depicts extended machining path CAM surfaces 634, 636, and 638 created for the non-spanning faces 512A, 512B, and 512C, respectively, of the CAD solid model 500. The extended machining path CAM surfaces 634, 636, and 638 correspond to the cutting beam paths 526, 522, and 524, respectively, shown in FIG. 5, which may be used to machine the k-bevel depicted in the CAD solid model 500.

Figure 10A:
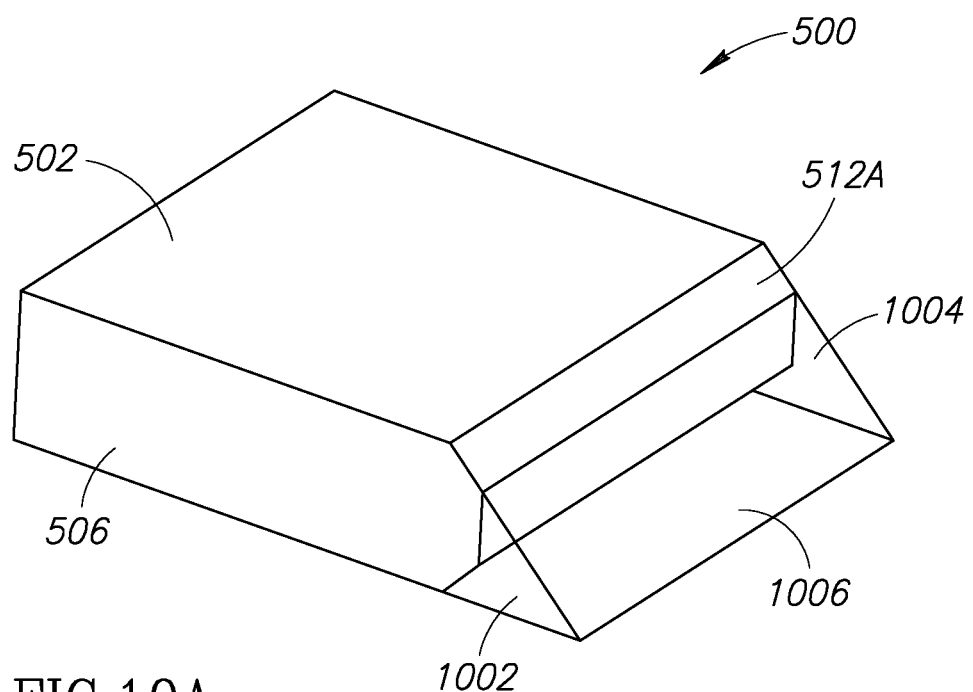
FIG. 10A is an isometric view of a CAD solid model for an object to be manufactured from a workpiece by a tool, according to one illustrated embodiment.
Figure 10B:
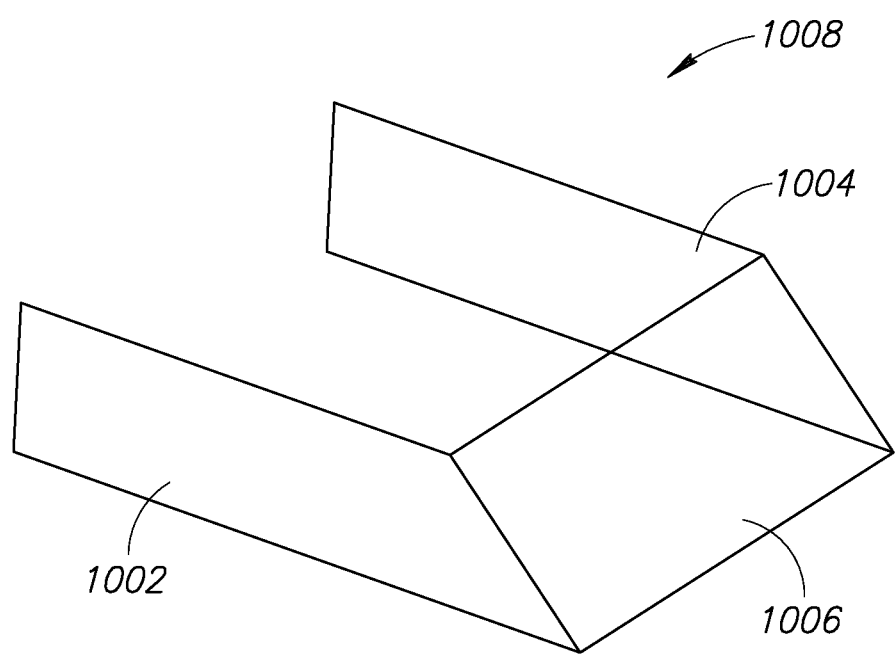
FIG. 10B is an isometric view of a combined machining path CAM surface that combines two vertical machining path CAM surfaces and an angled machining path CAM surface, according to one illustrated embodiment.

At 430, the CAD/CAM system and/or the operator may merge, detach, and/or modify one or more of the created extended and simplified machining path CAM surfaces. For example, FIGS. 10A and 10B illustrate combining two simplified machining path CAM surfaces 1002 and 1004 and an extended machining path CAM surface 1006 to create a single combined or chained machining path CAM surface 1008 that includes vertical and angled machining path CAM surfaces used to machine the object. The combined machining path CAM surface 1008 may be used to generate a toolpath where the tool cuts along the combined machining path CAM surface in a single motion, for example.

Figure 6G:
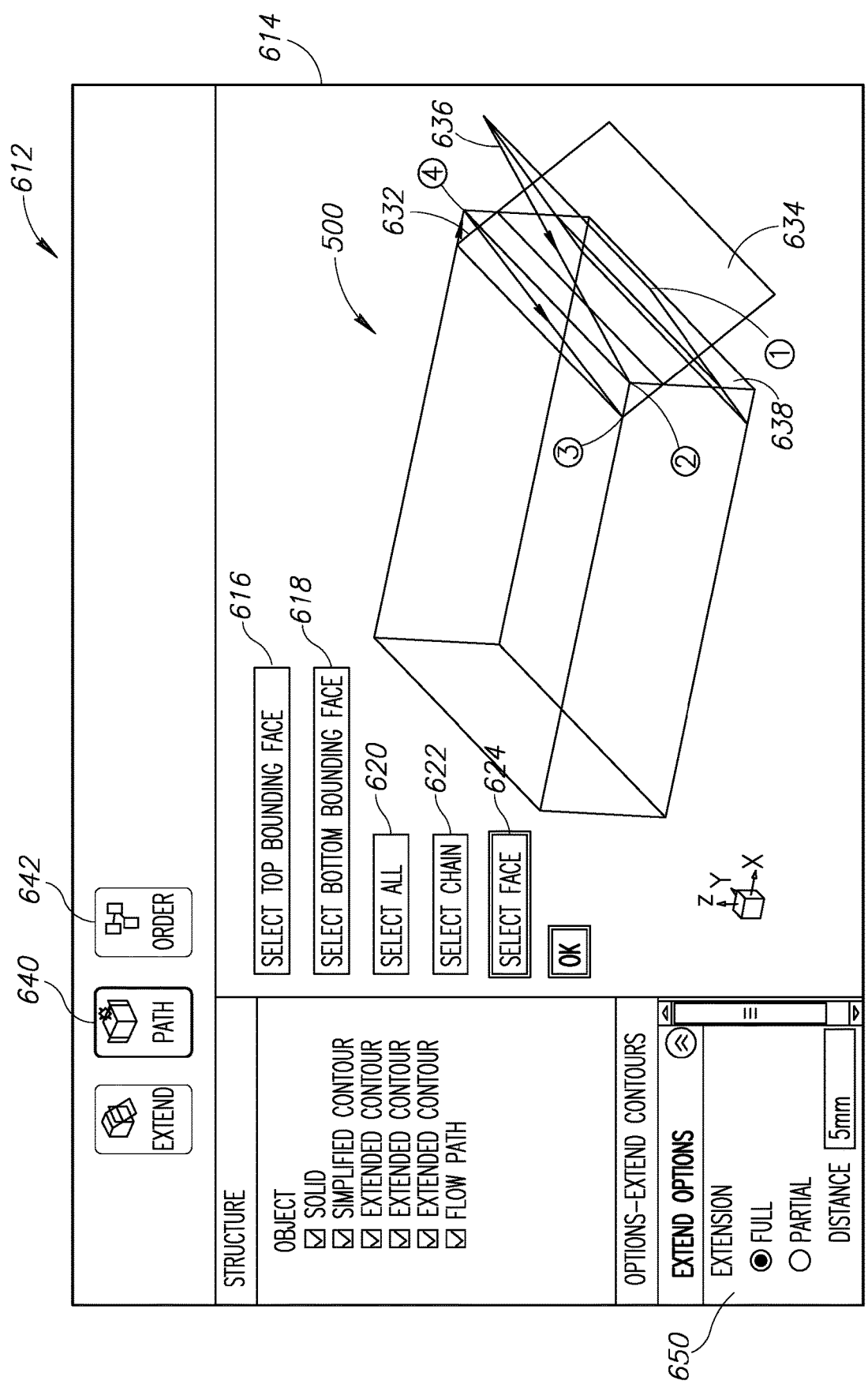

FIG. 6G shows the CAD solid model 500, the created combined simplified machining path CAM surface 632, and the created extended machining path CAM surfaces 634, 636, and 638. The operator can easily view the cuts to be made while viewing the CAD solid model 500, which represents the final object to be manufactured. Accordingly, the operator may create a toolpath for cutting an object that can be cut without damage to the workpiece, without incorrect cuts, and without collision between the cutting tool and the workpiece.

In some embodiments, the simplified machining path CAM surfaces and the extended machining path CAM surfaces may not be visible, but may be used by the CAD/CAM system only to generate toolpaths. In some embodiments, the operator may be able to toggle the visibility of the simplified machining path CAM surfaces and the extended machining path CAM surfaces. In some embodiments, one or more of the acts discussed above may be fully automated by the CAD/CAM system, such that human intervention is not required.

At 432, the CAD/CAM system creates a toolpath for a cutting beam of the tool that traverses the created simplified machining path CAM surfaces and the extended machining path CAM surfaces. The CAD/CAM system may include a selectable icon 640 (FIG. 6G) that, when selected, automatically generates a toolpath. As discussed above, the models 224 (FIG. 2) may include a set of algorithms, equations, tables, rules or data for determining sequences for toolpaths. The models 224 or machining knowledge data may be created experimentally and/or theoretically based upon empirical observations and prior analysis of machining data.

At 434, the CAD/CAM system may receive a modification of the sequence for the toolpath. For example, the CAD/CAM system may include a selectable icon 642 (FIG. 6G) that, when selected, allows the operator to modify the sequence of cuts for the toolpath. As indicated by the circled numbers 1-4 shown in FIG. 6G, in this example the operator has selected to first cut along the extended machining path CAM surface 636, to second cut along the extended machining path CAM surface 638, to third cut along the extended machining path CAM surface 634, and to fourth cut along the combined simplified machining path CAM surface 632. At 436, the CAD/CAM system may modify the toolpath sequence based on the input received from the operator and store the modified toolpath sequence in at least one non-transitory processor-readable medium.

At 438, the CAD/CAM system produces the final motion program. The motion program contains the necessary commands to orient the cutting beam along each PGV of the created machining path CAM surfaces (simplified and extended) at the determined cutting speed, starting with the location of a lead-in PGV and ending with the location that corresponds to a lead-out PGV, as the cutting beam progress along the beam entrance and beam exit contours. The motion program instructions may be expressed in terms of motor positions or tool-tip positions and orientations, or equivalents thereof. If tool-tip positions defining location and orientation are used, the controller may interpret the instructions into motor positions through the use of kinematic equations. The complexity of the kinematics is typically a function of the hardware used to manipulate the cutting beam.

At 440, the CAD/CAM system provides (e.g., sends, forwards, communicates, transmits, or the like) the motion program/motion instructions/data to the controller of the tool for execution. The term "controller" includes any device capable of directing motor movement based upon the motion program/motion instructions/data. The term "motion program" is used herein to indicate a set of instructions or data that the tool and/or controller being used understands. The foregoing code/logic can accordingly be altered to accommodate the needs of any such instructions and or data requirements.

The method 400 ends at 442 until restarted again. For example, the method 400 may be restarted when a new toolpath is to be generated for an object to be manufactured by a cutting tool, or when an existing toolpath is to be modified.

FIGS. 7A-7C illustrate various examples of extended machine path CAM surfaces and simplified machine path CAM surfaces that may be created by a CAD/CAM system to generate toolpaths for a CAD solid model 700 of an object to be manufactured using a tool having a cutting beam, such as a waterjet cutting apparatus or a laser cutting apparatus. The CAD solid model 700 includes a top surface 702, a front beveled surface 704 defined by a lower bevel face 704A, a middle bevel face 704B, and an upper bevel face 704C. The CAD solid model 700 also includes a right side beveled surface 706 defined by a lower bevel face 706A, a middle bevel face 706B, and an upper bevel face 706C. The CAD solid model 700 further includes an interior circular aperture 708 defined by a lower bevel surface 708A, a middle bevel surface 708B, and an upper bevel surface 708C. The CAD solid model 700 further includes an interior square aperture 710 defined by four horizontally connected lower bevel surfaces 710A (two shown), four horizontally connected middle bevel surfaces 710B (two shown), and four horizontally connected upper bevel surfaces 710C (two shown). Although not shown in FIGS. 7A-7C, the CAD solid model also includes a bottom surface, a rear surface, and a left side surface.

FIG. 7A illustrates three extended machining path CAM surfaces 712, 714 and 716 created by the CAD/CAM system for the lower bevel faces 704A, 706A, 708A, and 710A of the CAD solid model 700. The extended machining path CAM surfaces 712, 714, and 716 extend the lower bevel faces upward toward a top bounding area that is coplanar with the top surface 702 of the CAD solid model 700. Specifically, the extended machining path CAM surface 712 extends the horizontally connected lower bevel faces 704A and 706A of the front surface 704 and the right side surface 706, respectively. The extended machining path CAM surface 714 extends the horizontally connected lower bevel faces 710A of the interior square aperture 710. The extended machining path CAM surface 716 extends the lower bevel face 708A of the interior circular aperture 708. FIG. 7B illustrates three extended machining path CAM surfaces 718, 720, and 722 created by the CAD/CAM system for the middle bevel faces 704B, 706B, 708B, and 710B of the CAD solid model 700. The extended machining path CAM surfaces 718, 720, and 722 extend the middle bevel faces upward toward the top bounding area and downward toward a bottom bounding area that is coplanar with the bottom surface (not shown) of the CAD solid model 700. Specifically, the extended machining path CAM surface 718 extends the horizontally connected middle bevel faces 704A and 706A of the front surface 704 and the right side surface 706, respectively. The extended machining path CAM surface 720 extends the horizontally connected middle bevel faces 710B of the interior square aperture 710. The extended machining path CAM surface 722 extends the middle bevel face 708B of the interior circular aperture 708. FIG. 7B also depicts a simplified machining path CAM surface 724 that corresponds to the connected spanning left side surface and spanning rear surface of the CAD solid model 700.

FIG. 7C illustrates three extended machining path CAM surfaces 726, 728, 730 created by the CAD/CAM system for the upper bevel faces 704C, 706C, 708C, and 710C of the CAD solid model 700. The extended machining path CAM surfaces 728 and 730 are shaded with stippling for clarity. The extended machining path CAM surfaces extend the upper bevel faces downward toward the bottom bounding area. Specifically, the extended machining path CAM surface 726 extends the horizontally connected upper bevel faces 704C and 706C of the front surface 704 and the right side surface 706, respectively. The extended machining path CAM surface 728 extends the horizontally connected upper bevel faces 710C of the interior square aperture 710. The extended machining path CAM surface 730 extends the upper bevel face 708C of the interior circular aperture 708.

As discussed above, the extended machining path CAM surfaces may be defined as ruled surfaces segmented into a number of object or part geometry vectors (PGVs). The edges of the extended machining path CAM surfaces that are extended may be extended in the direction of the PGVs so that the upper edges of the extended machining path CAM surfaces define beam entrance contours where the cutting beam will enter the target material as it progresses along the machining path, and the bottom edges define a beam exit contour where the cutting beam will leave the material. The PGVs are formed by using multiple lines to connect the beam entrance contours to the beam exit contours in a one to one relationship. That is, there are an equal number of segments between PGVs in both the entrance and exit contours.

Figure 8A:
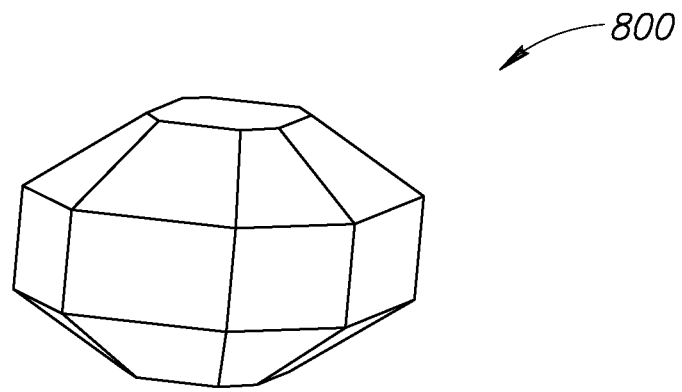
FIG. 8A is an isometric view of a CAD solid model for an object to be manufactured from a workpiece by a tool, according to one illustrated embodiment.
Figure 8B:
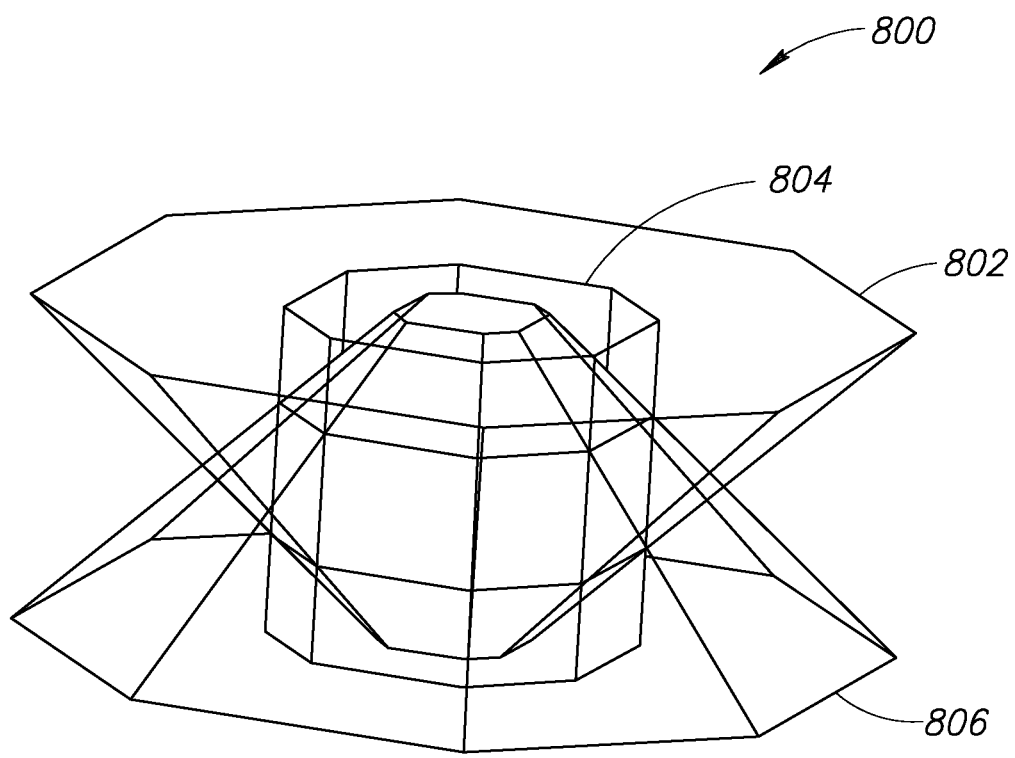
FIG. 8B is an isometric view of extended machining path CAM surfaces that extend faces of the CAD solid model shown in FIG. 8A.

FIG. 8A depicts a CAD solid model 800 for an object to be manufactured by a tool having a cutting beam, such as a waterjet cutting system or a laser cutting system. FIG. 8B shows an example of three extended machining path CAM surfaces 802, 804, and 806 that may be generated by the CAD/CAM system during the toolpath generation process, as discussed above.

Figure 9A:
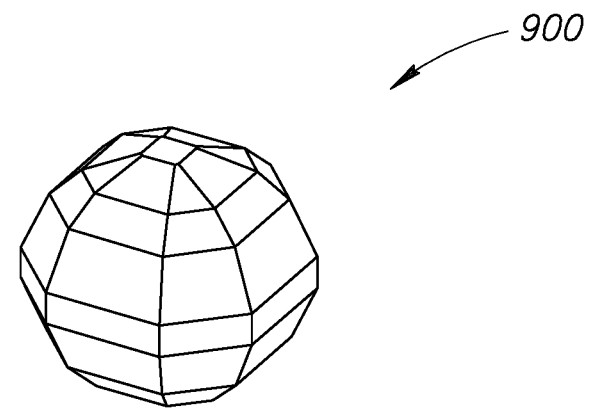
FIG. 9A is an isometric view of a CAD solid model for an object to be manufactured from a workpiece by a tool, according to one illustrated embodiment.
Figure 9B:
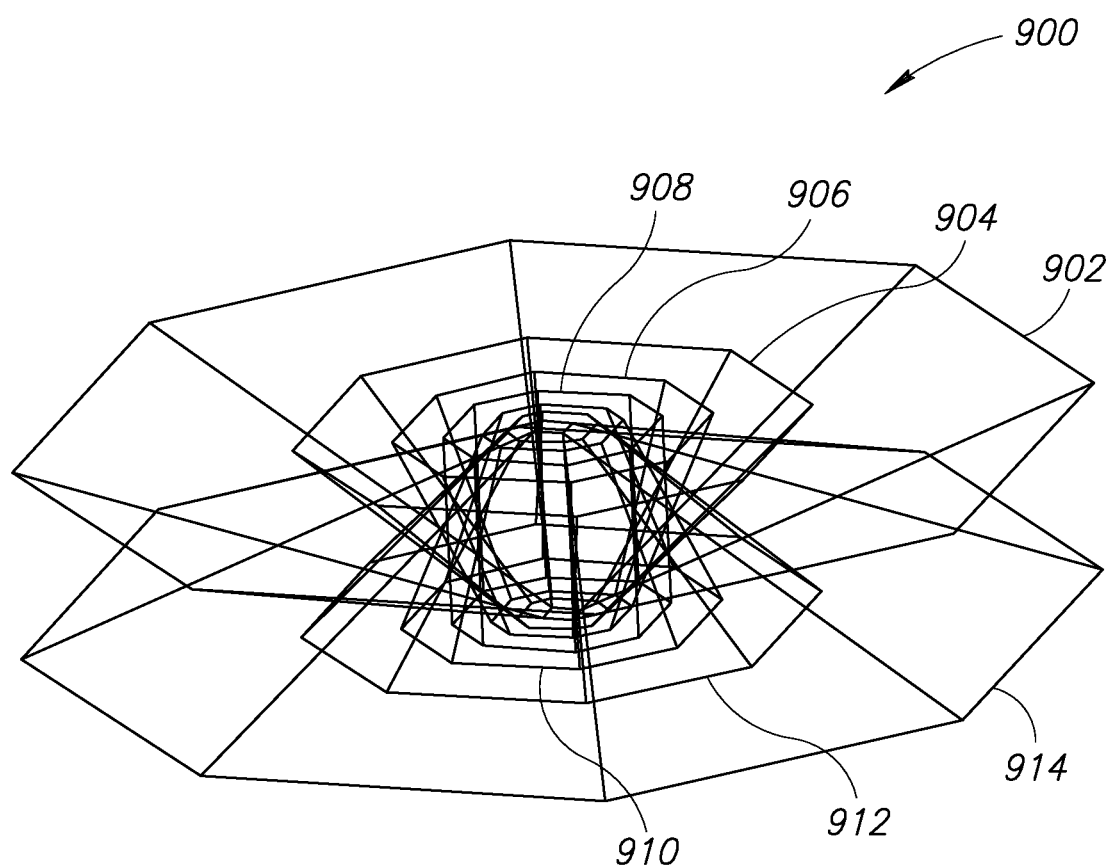
FIG. 9B is an isometric view of extended machining path CAM surfaces that extend faces of the CAD solid model shown in FIG. 9A.

FIG. 9A depicts a CAD solid model 900 for another object to be manufactured by a tool having a cutting beam. FIG. 9B shows an example of seven extended machining path CAM surfaces 902, 904, 906, 908, 910, 912, and 914 that may be generated by the CAD/CAM system during the toolpath generation process, as discussed above.

Figure 9C:
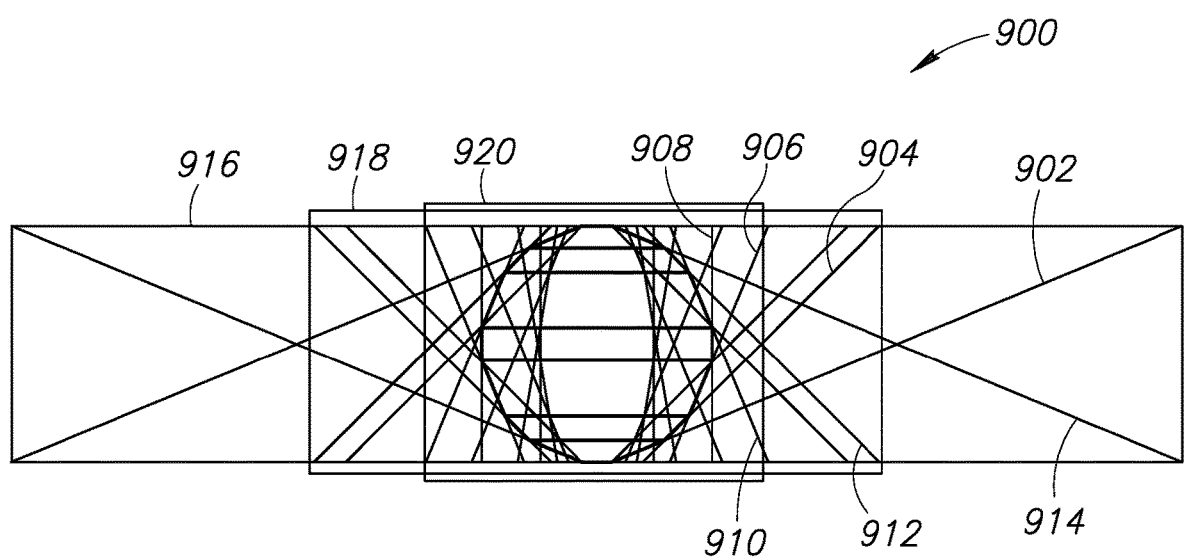
FIG. 9C is an elevational view of bounding boxes for extended machining path CAM surfaces that extend faces of the CAD solid model shown in FIG. 9A.

As shown in FIG. 9C, in some embodiments the extended machining path CAM surfaces 902, 904, 906, 908, 910, 912, and 914 may be partially extended, for example, to the perimeter of one or more defined bounding boxes 916, 918, or 920. More generally, the extended machining path CAM surfaces 902, 904, 906, 908, 910, 912, and 914 may be partially extended to the boundary of any "container," or may be partially extended a distance determined by the CAD/CAM system or selected by the operator.

Figure 11B:
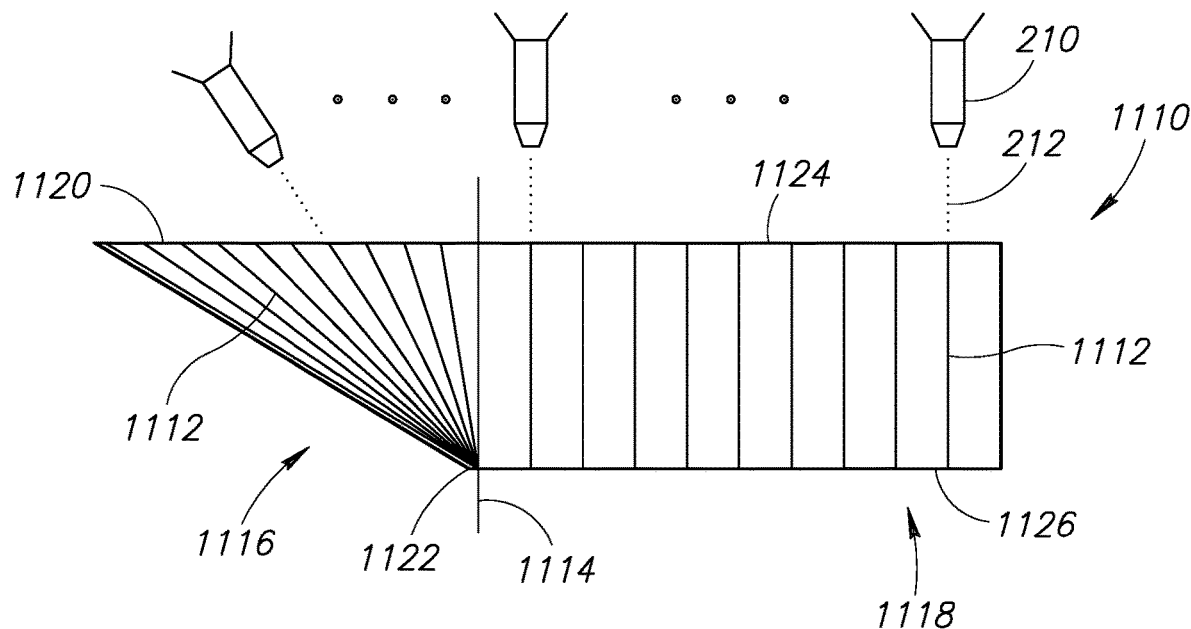
FIG. 11B is an elevational view of a machining path CAM surface created by a CAD/CAM system that has been split into two machining path CAM subsurfaces, according to one illustrated embodiment.

FIG. 11B depicts an example machining path CAM surface 1110 that may be created by a CAD/CAM system, for example, by implementing the process 400 shown in FIGS. 4A and 4B. The machining path CAM surface 1110 is defined as a ruled surface segmented into a number of part geometry vectors (PGVs) 1112. In this example, the machining path CAM surface 1110 is divided or split along a split line 1114 into two machining path CAM subsurfaces 1116 and 1118. The first machining path CAM subsurface 1116 is shaped as a triangle with an upper edge 1120, and a lower edge 1122 defined by a point. The second machining path CAM subsurface 1118 is shaped as a rectangle having an upper edge 1124 and a lower edge 1126. The upper edges 1120 and 1124 of the machining path CAM subsurfaces 1116 and 1118, respectively, define beam entrance contours where the cutting beam will enter the target material. The lower edges 1122 and 1126 of the machining path CAM subsurfaces 1116 and 1118, respectively, define a beam exit contour where the cutting beam will leave the material.

The PGVs 1112 are formed by using multiple lines to connect the beam entrance contours to the beam exit contours in a one to one relationship for each of the machining path CAM subsurfaces 1116 and 1118. As shown, by dividing the machining path CAM surface 1110 into first and second machining path CAM subsurfaces 1116 and 1118, the CAD/CAM system and/or the operator can control the orientation of the PGVs 1112 (i.e., orientation of the cutting beam) in a localized region. Specifically, in this example, the projected cut length is minimized over a majority of the cut since the cutting beam is vertical across the rectangular machining path CAM subsurface 1112. This is in contrast to a machining path CAM surface that has not been divided (FIG. 11A), where the cut length is non-vertical for a majority of the cut. Another advantage of dividing or splitting the machining path CAM surface 1110 into one or more subsurfaces is the CAD/CAM system and/or operator is able to precisely control the area of rotations to control where surface finish variations may exist. For example, using split lines allows for controlling the region of a machining face of an object where rotational angles are applied as the cut path approaches a beveled face.

Figure 11C:
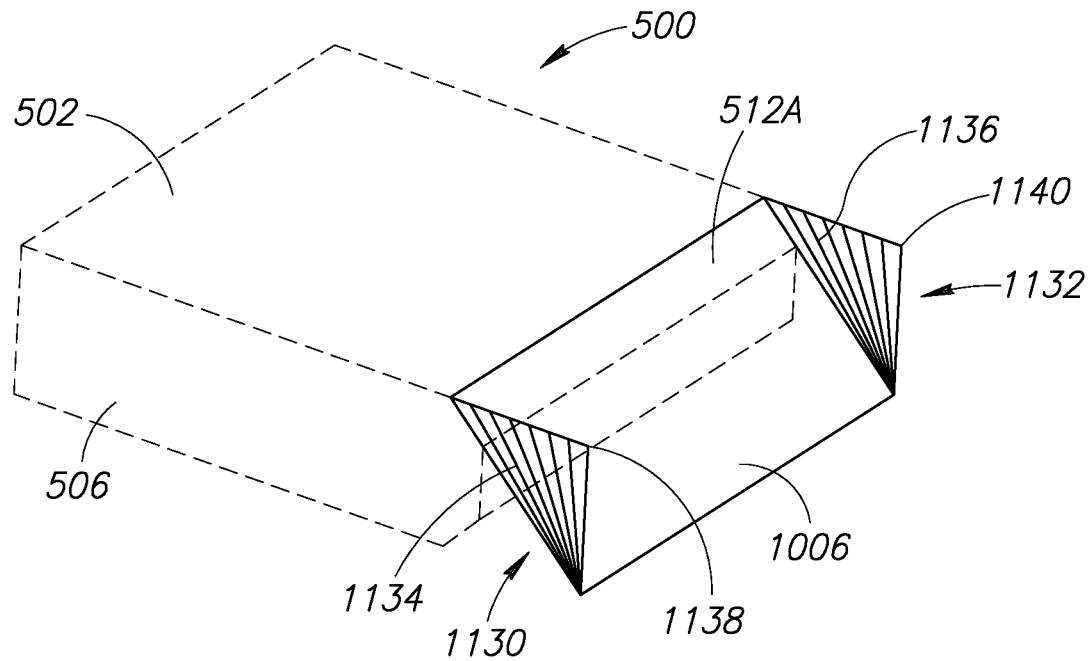
FIG. 11C is an isometric view of a machining path CAM surface created by a CAD/CAM system for vertical lead-in and lead-out machining paths, according to one illustrated embodiment.
Figure 11D:
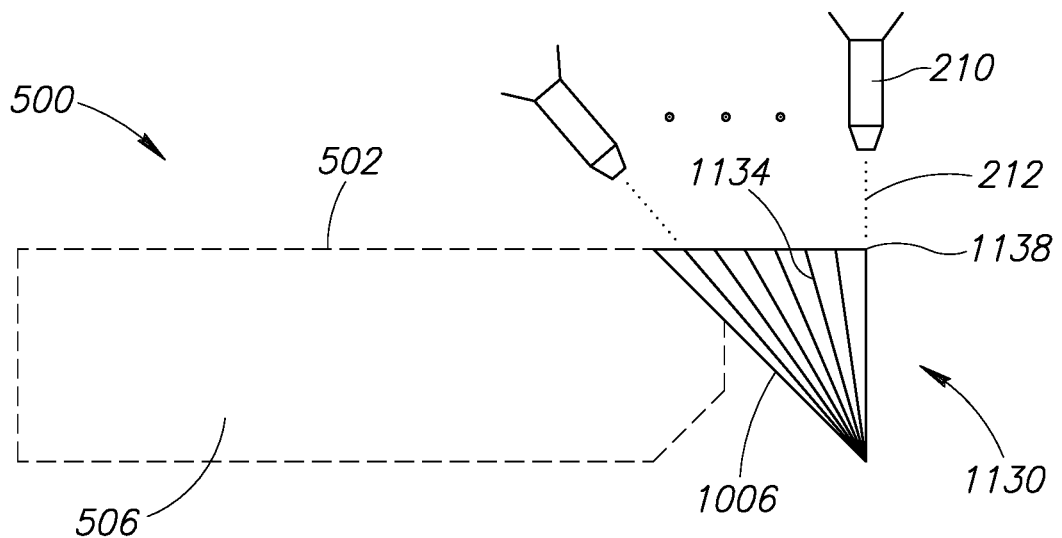
FIG. 11D is a left side elevational view of the machining path CAM surface shown in FIG. 11C.

FIGS. 11C and 11D illustrate a lead-in machining path CAM surface 1130 and a lead-out machining path CAM surface 1132 that may be created by a CAD/CAM system to machine the object represented by the solid CAD model 500. The machining path CAM surface 1006 utilized to define the machining path to cut the upper bevel face 512A is also shown. The machining path CAM surfaces 1130 and 1132 are defined as ruled surfaces segmented into a number of part geometry vectors (PGVs) 1134 and 1136, respectively. In this example, the lead-in machining path CAM surface 1130 corresponds to a start or lead-in path for the cutting beam 212 and the lead-out machining path CAM surface 1132 corresponds to a finishing or lead-out path for the cutting beam. That is, the machining path CAM surfaces 1130 and 1132 do not define the part to be cut, but describe the way the cutting beam starts and ends its cut into the workpiece.

A start or piercing position for the cutting beam 212 may be defined by a perpendicular or vertical lead-in PGV 1138 of the lead-in machining path CAM surface 1130. In many instances, it is preferable to initially pierce the workpiece using a vertical cutting beam (also referred to as a perpendicular cutting beam or a non-angled cutting beam). Piercing a workpiece using a vertical cutting beam reduces the time required to pierce the workpiece by minimizing the depth of the cut. Further, in the case of waterjet cutting applications, piercing a workpiece using a vertical cutting beam also avoids a significant amount of water spray that occurs when piercing the workpiece at non-vertical angles.

Similarly, an end position for the cutting beam 212 may be defined by a vertical lead-out PGV 1140 of the lead-out machining path CAM surface 1132. In many applications, it may also be preferable to have a cutting tool end its cut in a vertical position.

In the example shown in FIGS. 11C and 11D, the cutting tool 210 may pierce a workpiece at the vertical lead-in PGV 1138 of the lead-in machining path CAM surface 1130. The cutting tool 210 may then move toward the machining path CAM surface 1006 according to the PGVs 1134 of the lead-in machining path CAM surface 1130. The cutting tool 210 may then cut the upper bevel face 512A of the solid CAD model 500 according to the PGVs (not shown) of the machining path CAM surface 1006. Finally, the cutting tool 210 moves away from the machining path CAM surface 1006 according to the PGVs 1136 of the lead-out machining path CAM surface 1132. The cutting tool 210 ends its cut at the vertical lead-out PGV 1140.

The vertical piercing and cutting beam exit techniques described above may be applied to linear and/or arc-shaped lead-in or lead-out paths. Further, the CAD/CAM systems disclosed herein may automatically create vertical lead-in and lead-out machining path CAM surfaces. For example, in some embodiments the CAD/CAM systems may provide an option that allows users to select whether vertical lead-in and/or lead-out machining path CAM surfaces are generated with a cutting path is created or modified. Further, an option to add vertical lead-in and/or lead-out machining path CAM surfaces to existing machining path CAM surfaces may be provided. Additionally or alternatively, the vertical lead-in or lead-out surfaces may be created by manual selection by the user.

Figure 12:
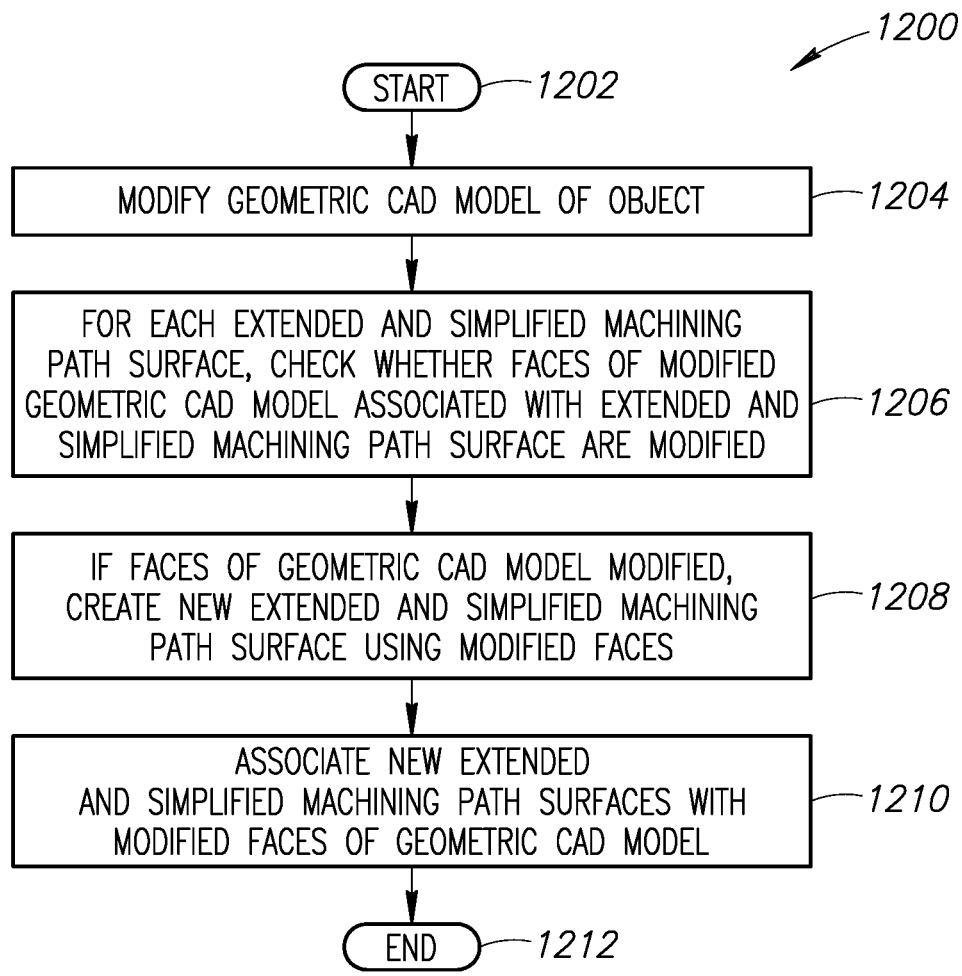
FIG. 12 is a flow diagram that shows a method of operation for a CAD/CAM system, according to one illustrated embodiment.

FIG. 12 shows a high level method 1200 of operating a processor-based device to provide automatic associativity between a CAD solid model of an object to be manufactured and the phantom extended and simplified machining path CAM surfaces discussed above. The method 1200 starts at 1202. At 1204, an operator or other entity modifies a CAD solid model using a CAD application executing on a processor-based device, such as the CAD/CAM system of FIGS. 2 and 3. At 1206, the CAD/CAM system checks to determine whether faces of the CAD solid model logically associated with any of the created extended and simplified machining path CAM surfaces have been modified. For faces of the CAD solid model that has been modified, the CAD/CAM system recreates an extended or simplified machining path CAM surface at 1208. At 1210, the CAD/CAM system associates the new extended or simplified machining path CAM surfaces with the modified face or faces in nontransitory computer- or processor-readable media (e.g., memory).

The method 1200 provides a fully integrated CAD system and CAM system from the design process through numerical control of the cutting tool, which eliminates downstream data translation. In other words, by maintaining associativity between the extended and simplified machining path CAM surfaces and the CAD solid model, changes to the CAD solid model even late in a development cycle do not require reconstruction of the extended and simplified machining path CAM surfaces and the machining paths. Thus, the need for expensive and time-consuming reworking of machining paths is minimized. Moreover, in a team environment the integrated CAD/CAM system may reduce the potential for different operators to be working on different versions of a model, which can cause errors and delays in the development process.

At 1212, the method 1200 terminates at 1212 until called again. For example, the method 1200 may be called when a modification to a CAD solid model is detected. The method 1200 may run concurrently with other methods or processes, for example, as one of multiple threads on a multi-threaded processor system.

Figure 13:
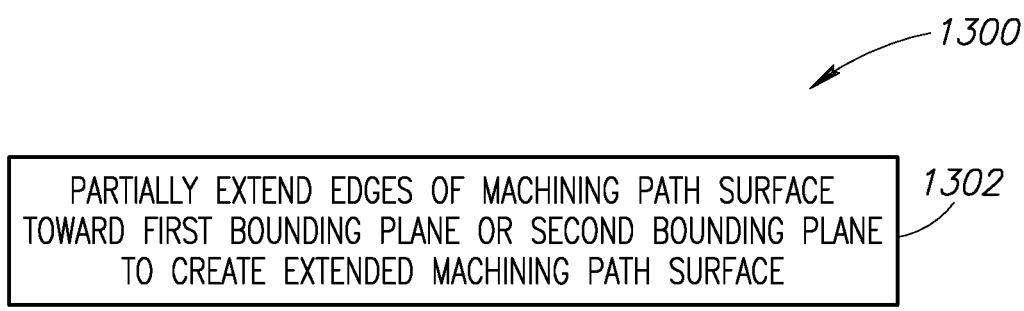
FIG. 13 is a flow diagram that shows a method of operation for a CAD/CAM system, according to one illustrated embodiment.

FIG. 13 shows a method 1300 of creating extended machining path CAM surfaces for use in a CAD/CAM system, according to one illustrated embodiment.

At 1302, a processor-based device, such as the CAD/CAM system shown in FIGS. 2 and 3, respectively, partially extends edges of a machining path CAM surface toward a first bounding area or toward a second bounding area to create an extended machining path CAM surface. As shown in FIG. 6A, an extension selection window 650 may be provided that allows the operator to select whether an edge of an extended machining path CAM surface is to be extended fully to a bounding area, or partially by a distance (e.g., 5 mm, etc.). The operator may be able to select a partial or full extension separately for each edge of created extended machining path CAM surfaces.

Figure 14A:
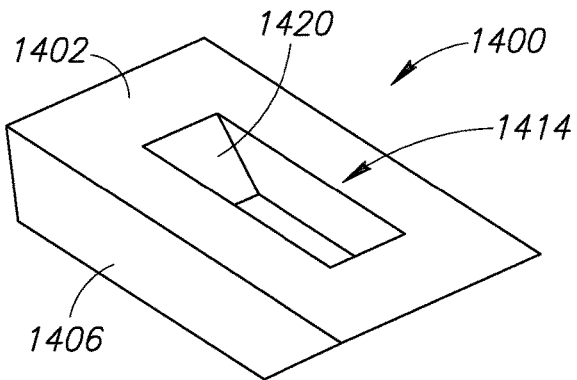
FIGS. 14A-14E depict various views of machining path CAM surfaces for visualizing relief cuts for a CAD solid model representative of an object to be manufactured from a workpiece by a tool, according to one illustrated embodiment.
Figure 14B:
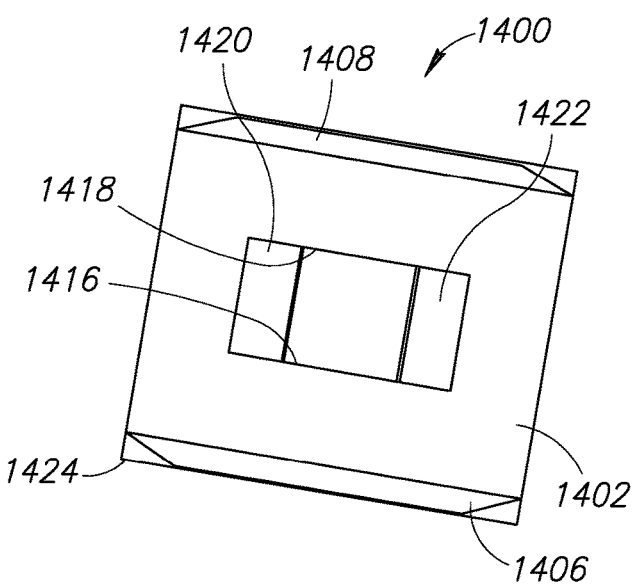
Figure 14C:
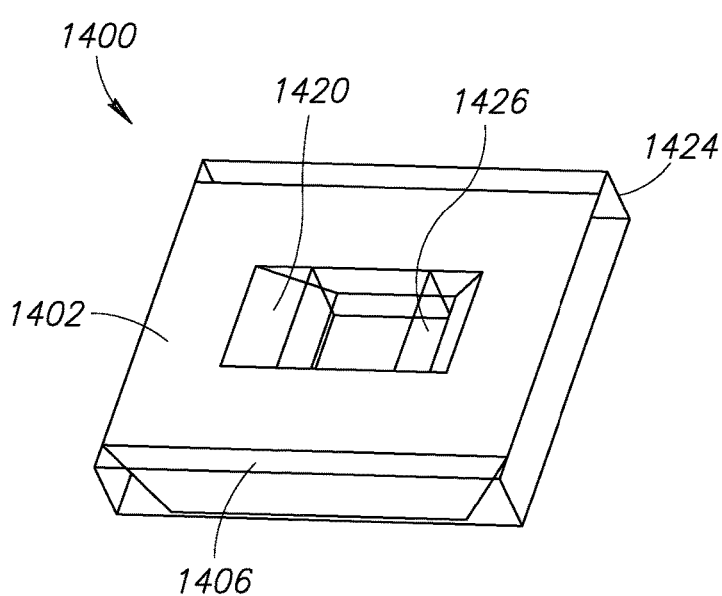
Figure 14D:
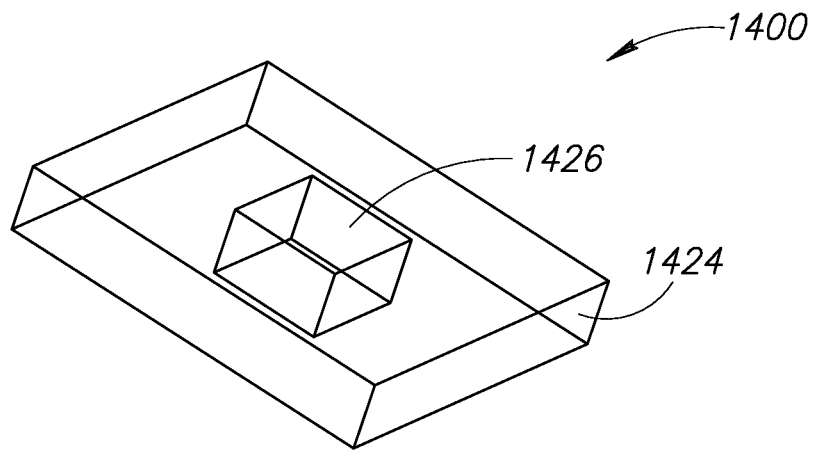
Figure 14E:
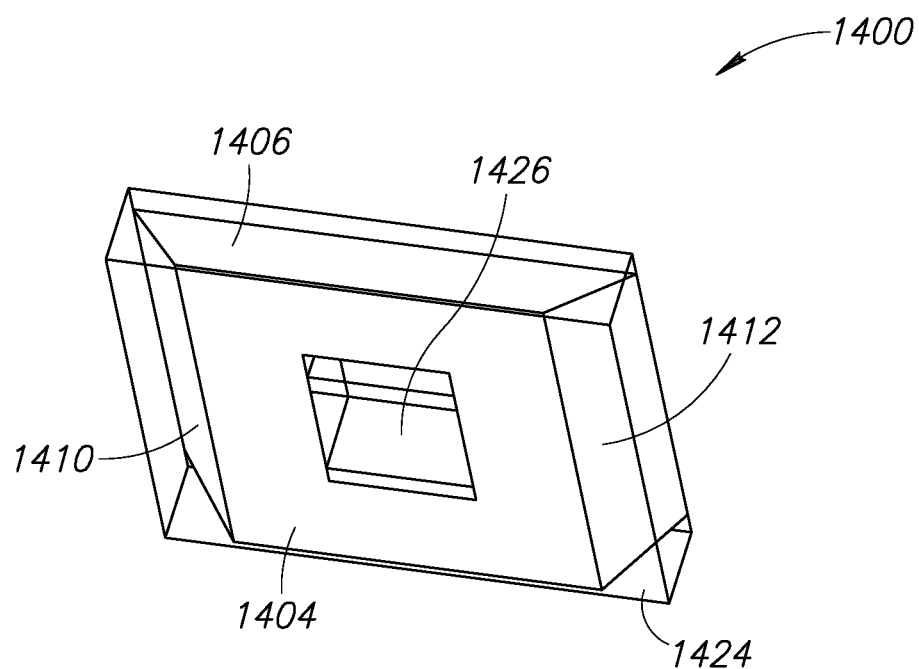

FIGS. 14A-14E provide an example of utilizing machining path CAM surfaces to visualize and determine "relief" cuts for an object to be manufactured from a workpiece using a tool, such as a waterjet cutting system or a laser cutting system. FIGS. 14A-14E depict a CAD solid model 1400 for an object that includes a rectangular top surface 1402 and a rectangular bottom surface 1404 (FIG. 14E). The CAD solid model 1400 includes an angled front surface 1406 and an angled rear surface 1408 (FIG. 14B) that each extend upward and inward from the bottom surface 1404 to the top surface 1402. The CAD solid model 1400 further includes an angled left side surface 1410 (FIG. 14E) and an angled right side surface 1412 that each extend upward and outward from the bottom surface 1404 to the top surface 1402. The CAD solid model 1400 further includes an interior aperture 1414 defined by an interior vertical front surface 1416, an interior vertical rear surface 1418, and interior angled left side and right side surfaces 1420 and 1422, respectively, that each extend upward and outward from the bottom surface 1404 to the top surface 1402.

When the object is cut from a workpiece by a tool, the angled surfaces of the object would cause the object to be locked in place in the workpiece after all of the surfaces have been machined. Thus, an operator may create an exterior machining path CAM surface 1424 that extends around an exterior perimeter of the CAD solid model 1400, and an interior machining path CAM surface 1426 that extends around an innermost perimeter of the interior aperture 1414 of the CAD solid model. The machining path CAM surfaces 1424 and 1426 allow the operator to visualize the relief cuts that should be made to release the object from the workpiece during manufacturing of the object. As discussed above, the machining path CAM surfaces 1424 and 1426 may be used to generate a toolpath for machining the object using a cutting tool. Further, the machining path CAM surfaces 1424 and 1426 may be fully associative with the CAD solid model 1400 of the object, so that the machining path CAM surfaces are automatically updated when changes are made to the CAD solid model, as discuss above with reference to FIG. 12.

The above description of illustrated embodiments, including what is described in the Abstract, is not intended to be exhaustive or to limit the embodiments to the precise forms disclosed. Although specific embodiments of and examples are described herein for illustrative purposes, various equivalent modifications can be made without departing from the spirit and scope of the disclosure, as will be recognized by those skilled in the relevant art. The teachings provided herein of the various embodiments can be applied to other CAM or manufacturing systems, not necessarily the exemplary subtractive waterjet systems generally described above. For example, the teachings provided herein may be applied to additive manufacturing processes, such as 3D printing.

For instance, the foregoing detailed description has set forth various embodiments of the devices and/or processes via the use of block diagrams, schematics, and examples. Insofar as such block diagrams, schematics, and examples contain one or more functions and/or operations, it will be understood by those skilled in the art that each function and/or operation within such block diagrams, flowcharts, or examples can be implemented, individually and/or collectively, by a wide range of hardware, software, firmware, or virtually any combination thereof. In one embodiment, the present subject matter may be implemented via Application Specific Integrated Circuits (ASICs). However, those skilled in the art will recognize that the embodiments disclosed herein, in whole or in part, can be equivalently implemented in standard integrated circuits, as one or more computer programs running on one or more computers (e.g., as one or more programs running on one or more computer systems), as one or more programs running on one or more controllers (e.g., microcontrollers) as one or more programs running on one or more processors (e.g., microprocessors), as firmware, or as virtually any combination thereof, and that designing the circuitry and/or writing the code for the software and or firmware would be well within the skill of one of ordinary skill in the art in light of this disclosure.

In addition, those skilled in the art will appreciate that the mechanisms of taught herein are capable of being distributed as a program product in a variety of forms, and that an illustrative embodiment applies equally regardless of the particular type of signal bearing media used to actually carry out the distribution. Examples of signal bearing media include, but are not limited to, the following: recordable type media such as floppy disks, hard disk drives, CD ROMs, digital tape, and computer memory; and transmission type media such as digital and analog communication links using TDM or IP based communication links (e.g., packet links).

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A nontransitory processor-readable medium comprising processor executable instructions to:
   obtain a computer aided-design (CAD) solid model from at least one nontransitory processor-readable medium, the CAD solid model representative of a physical object to be manufactured from a workpiece;
   identify a first bounding area;
   identify a second bounding area;
   identify one or more non-spanning machining faces of the CAD solid model, each of the one or more non-spanning machining faces having a first edge relatively proximate to the first bounding area and a second edge relatively proximate to the second bounding area, at least one of the first edge and the second edge spaced apart from the first bounding area and the second bounding area, respectively, such that each of the one or more non-spanning machining faces do not span between the first bounding area and the second bounding area;
   create an extended machining path CAM surface model that defines a machining orientation for a tool, the extended machining path CAM surface model logically associated with one or more non-spanning machining faces of the CAD solid model in at least one nontransitory processor-readable medium, the extended machining path CAM surface model including one or more extended machining path CAM surfaces each a representation of a respective one of the non-spanning machining faces of the CAD solid model, the extended machining path CAM surface model including a first extended surface edge relatively proximate to the first bounding area defining a beam entrance contour and a second extended surface edge relatively proximate to the second bounding area defining a beam exit contour; and
   autonomously extend the extended machining path CAM surface model,
   wherein the processor executable instructions cause a processor to:
      autonomously extend the first extended surface edge of the extended machining path CAM surface model toward the first bounding area when the first extended surface edge is spaced apart from the first bounding area; and
      autonomously extend the second extended surface edge of the extended machining path CAM surface model toward the second bounding area when the second extended surface edge is spaced apart from the second bounding area.

2. The nontransitory processor-readable medium of claim 1 wherein the instructions cause the processor to:
   logically associate a first bounding area with a first face of the CAD solid model in at least one nontransitory processor-readable medium, and logically associate a second bounding area with a second face of the CAD solid model in at least one nontransitory processor-readable medium.

3. The nontransitory processor-readable medium of claim 1, further comprising processor executable instructions to:
   create a lead-in machining path CAM surface that corresponds to a starting path of the tool, the lead-in machining path adjacent at least one other machining path CAM surface, the lead-in machining path CAM surface defined by a plurality object geometry vectors that define a machining orientation for the tool, wherein at least one of the plurality of object geometry vectors associated with a workpiece piercing location for the tool defines an orientation for the tool that positions a cutting beam of the tool perpendicular to a surface of the workpiece at the workpiece piercing position.

4. The nontransitory processor-readable medium of claim 1, further comprising processor executable instructions to:
   create a lead-out machining path CAM surface that corresponds to an ending path of the tool, the lead-out machining path adjacent at least one other machining path CAM surface, the lead-out machining path CAM surface defined by a plurality object geometry vectors that define a machining orientation for the tool, wherein at least one of the plurality of object geometry vectors associated with an end location for the tool defines an orientation for the tool that positions a cutting beam of the tool perpendicular to a surface of the workpiece at the end location.

5. The nontransitory processor-readable medium of claim 1, further comprising processor executable instructions to:
   generate motion instructions or data that specify movement for the tool according to the extended machining path CAM surface model; and
   store the motion instructions or data in the nontransitory processor-readable medium.

6. The nontransitory processor-readable medium of claim 5, further comprising processor executable instructions to:
   receive a selection of a positioning sequence for the motion instructions or data via a user interface; and
   logically associate the positioning sequence with the motion instructions or data in at least one nontransitory processor-readable medium.

7. The nontransitory processor-readable medium of claim 5, further comprising processor executable instructions to:
   obtain machining knowledge data stored in at least one nontransitory processor-readable medium, wherein at least a portion of the motion instructions or data are dependent upon the obtained machining knowledge data.

8. The nontransitory processor-readable medium of claim 5, further comprising processor executable instructions to:
   autonomously determine at least one of the one or more non-spanning machining faces of the CAD solid model has been modified;
   autonomously modify the extended machining path CAM surface model dependent on the modification to create a modified extended machining path CAM surface model; and
   autonomously modify the motion instructions or data to specify a traversal of the modified extended machining path CAM surface model.

9. The nontransitory processor-readable medium of claim 8, further comprising processor executable instructions to:
   cause a display to display the modified CAD solid model and the modified extended machining path CAM surface model.

10. The nontransitory processor-readable medium of claim 5, further comprising processor executable instructions to:
  send the motion instructions or data to a controller associated with the tool.

11. The nontransitory processor-readable medium of claim 1, further comprising processor executable instructions to:
  cause a display to display the CAD solid model and the extended machining path CAM surface model.

12. The nontransitory processor-readable medium of claim 1, further comprising processor executable instructions to:
  extend the first extended surface edge of the extended machining path CAM surface model to the first bounding area; and
  extend the second extended surface edge of the extended machining path CAM surface model to the second bounding area.

13. The nontransitory processor-readable medium of claim 1, further comprising processor executable instructions to:
  extend the first extended surface edge of the extended machining path CAM surface model a first distance toward the first bounding area; and
  extend the second extended surface edge of the extended machining path CAM surface model a second distance toward the second bounding area.

14. The nontransitory processor-readable medium of claim 1, further comprising processor executable instructions to:
  identify one or more spanning machining faces of the CAD solid model, each of the one or more spanning machining faces having a first edge at least a portion of which is adjacent the first bounding area and a second edge at least a portion of which is adjacent the second bounding area, such that each of the one or more nonspanning machining faces do not span between the first bounding area and the second bounding area; and
  autonomously create a simplified machining path CAM surface model that defines a machining orientation for the tool, the simplified machining path CAM surface model logically associated with one or more spanning machining faces of the CAD solid model in at least one nontransitory processor-readable medium, the simplified machining path CAM surface model including one or more simplified machining path CAM surfaces, each simplified machining path CAM surface associated with a respective one of the spanning machining faces, the simplified machining path CAM surface model including a first simplified surface edge at least a portion of which is adjacent to the first bounding area defining a beam entrance contour and a second simplified surface edge at least a portion of which is adjacent to the second bounding area defining a beam exit contour.

15. The nontransitory processor-readable medium of claim 14, further comprising processor executable instructions to:
  cause a display to display the CAD solid model, the extended machining path CAM surface model, and the simplified machining path CAM surface model.

16. The nontransitory processor-readable medium of claim 14, further comprising processor executable instructions to:
  extend the first extended surface edge of the extended machining path CAM surface model to the first bounding area; and
  extend the second extended surface edge of the extended machining path CAM surface model to the second bounding area.

17. The nontransitory processor-readable medium of claim 14, further comprising processor executable instructions to:
  extend the first extended surface edge of the extended machining path CAM surface model a first distance toward the first bounding area; and
  extend the second extended surface edge of the extended machining path CAM surface model a second distance toward the second bounding area.

18. The nontransitory processor-readable medium of claim 14, further comprising processor executable instructions to:
  autonomously determine at least one of the one or more machining faces of the CAD solid model has been modified; and
  autonomously modify the extended machining path CAM surface model or the simplified machining path CAM surface model dependent on the modification to generate at least one of a modified extended machining path CAM surface model or a modified simplified machining path CAM surface model.

19. The nontransitory processor-readable medium of claim 18, further comprising processor executable instructions to:
  cause a display to display the modified CAD solid model and the generated at least one modified extended machining path CAM surface model or modified simplified machining path CAM surface model.

20. The nontransitory processor-readable medium of claim 14, further comprising processor executable instructions to:
  logically associate the simplified machining path CAM surface model with a chain of two or more spanning machining faces in at least one nontransitory processor-readable medium.

21. The nontransitory processor-readable medium of claim 14, further comprising processor executable instructions to:
  autonomously combine the extended machining path CAM surface model and the simplified machining path CAM surface model to create a combined machining path CAM surface model.

22. The nontransitory processor-readable medium of claim 21, further comprising processor executable instructions to:
  cause a display to display the CAD solid model and the combined machining path CAM surface model.

23. The nontransitory processor-readable medium of claim 14, further comprising processor executable instructions to:
  segment the simplified machining path CAM surface model into object geometry vectors that define a machining orientation for the tool, each object geometry vector connecting an imaginary point on the first simplified surface edge of the simplified machining path CAM surface model to a corresponding imaginary point on the second simplified surface edge of the simplified machining path CAM surface model such that there is a one-to-one correspondence between the number of points on the first simplified surface edge of the simplified machining path CAM surface model and the second simplified surface edge of the simplified machining path CAM surface model.

24. The nontransitory processor-readable medium of claim 14, further comprising processor executable instructions to:
divide one of the simplified machining path CAM surfaces of the simplified machining path CAM surface model into a first simplified machining path CAM surface and a second simplified machining path CAM surface, each of the first simplified machining path CAM surface and a second simplified machining path CAM surface having a first edge and a second edge;
segment the first simplified machining path CAM surface into object geometry vectors that define a machining orientation for the tool, each object geometry vector connecting an imaginary point on the first edge of the first simplified machining path CAM surface to a corresponding imaginary point on the second edge of the first simplified machining path CAM surface such that there is a one-to-one correspondence between the number of points on the first edge of the first simplified machining path CAM surface and the second edge of the first simplified machining path CAM surface; and
segment the second simplified machining path CAM surface into object geometry vectors that define a machining orientation for the tool, each object geometry vector connecting an imaginary point on the first edge of the second simplified machining path CAM surface to a corresponding imaginary point on the second edge of the second simplified machining path CAM surface such that there is a one-to-one correspondence between the number of points on the first edge of the second simplified machining path CAM surface and the second edge of the second simplified machining path CAM surface.

25. The nontransitory processor-readable medium of claim 1 further comprising processor executable instructions to:
logically associate the extended machining path CAM surface model with a chain of two or more adjacent non-spanning machining faces in at least one nontransitory processor-readable medium.

26. The nontransitory processor-readable medium of claim 1, further comprising processor executable instructions to:
copy the one or more non-spanning machining faces to create the extended machining path CAM surfaces.

27. The nontransitory processor-readable medium of claim 1, further comprising processor executable instructions to:
segment the extended machining path CAM surface model into object geometry vectors that define a machining orientation for the tool, each object geometry vector connecting an imaginary point on the first extended surface edge of the extended machining path CAM surface model to a corresponding imaginary point on the second extended surface edge of the extended machining path CAM surface model such that there is a one-to-one correspondence between the number of points on the first extended surface edge of the extended machining path CAM surface model and the second extended surface edge of the extended machining path CAM surface model.

28. The nontransitory processor-readable medium of claim 1, further comprising processor executable instructions to:
divide one of the extended machining path CAM surfaces of the extended machining path CAM surface model into a first extended machining path CAM surface and a second extended machining path CAM surface, each of the first extended machining path CAM surface and a second extended machining path CAM surface having a first edge and a second edge;
segment the first extended machining path CAM surface into object geometry vectors that define a machining orientation for the tool, each object geometry vector connecting an imaginary point on the first edge of the first extended machining path CAM surface to a corresponding imaginary point on the second edge of the first extended machining path CAM surface such that there is a one-to-one correspondence between the number of points on the first edge of the first extended machining path CAM surface and the second edge of the first extended machining path CAM surface; and
segment the second extended machining path CAM surface into object geometry vectors that define a machining orientation for the tool, each object geometry vector connecting an imaginary point on the first edge of the second extended machining path CAM surface to a corresponding imaginary point on the second edge of the second extended machining path CAM surface such that there is a one-to-one correspondence between the number of points on the first edge of the second extended machining path CAM surface and the second edge of the second extended machining path CAM surface.

29. A nontransitory processor-readable medium comprising processor executable instructions to:
obtain a computer aided-design (CAD) solid model of the physical object to be manufactured by a tool from at least one nontransitory processor-readable medium;
identify a first bounding area;
identify a second bounding area;
identify one or more machining faces of the CAD solid model to be machining by the tool, each of the one or more machining faces having a first edge and a second edge;
generate a machining path CAM surface model that defines a machining orientation for the tool, the machining path CAM surface model stored in at least one nontransitory processor-readable medium, the processor executable instructions cause a processor to:
autonomously generate one or more initial machining path CAM surfaces, each of the initial machining path CAM surfaces logically associated with a respective one of the machining faces in at least one nontransitory processor-readable medium, each of the initial CAM machining faces having a first edge and a second edge corresponding to the first edge and the second edge, respectively, of the machining face with which each of the initial machining path CAM surfaces is logically associated;
autonomously generate one or more final machining path CAM surfaces of the machining path CAM surface model from the initial machining path CAM surfaces, the processor executable instructions cause a processor to, for each initial machining path CAM surface:
extend the first edge toward the first bounding area when the first edge is spaced apart from the first bounding area; and extend the second edge toward the second bounding area when the second edge is spaced apart from the second bounding area;

cause a display to display the CAD solid model and the machining path CAM surface model.

30. The nontransitory processor-readable medium of claim 29, further comprising processor executable instructions to:
generate motion instructions or data that specify movement for the tool according to the machining path CAM surface model.

31. The nontransitory processor-readable medium of claim 30, further comprising computer executable instructions to:
store the motion instructions or data in a nontransitory processor-readable medium.

32. The nontransitory processor-readable medium of claim 30, further comprising computer executable instructions to:
obtain machining knowledge data stored in at least one nontransitory processor-readable medium, wherein at least a portion of the motion instructions or data are dependent upon the obtained machining knowledge data.

33. The nontransitory processor-readable medium of claim 30, further comprising processor executable instructions to:
receive a selection of a positioning sequence for the motion instructions or data via a user interface; and
logically associate the positioning sequence with the motion instructions or data in at least one nontransitory processor-readable medium.

34. The nontransitory processor-readable medium of claim 29, further comprising computer executable instructions to:
modify the CAD solid model;
determine whether any of the machining faces of the CAD solid model are modified;
generate a modified machining path CAM surface model by, for each modified machining face, wherein the computer executable instructions cause a processor to:
autonomously generate a modified initial machining path CAM surface logically associated in at least one nontransitory processor-readable medium with the modified machining face, the modified initial machining path CAM surface having a first edge and a second edge;
autonomously generate a modified final machining path CAM surface from the modified initial machining path CAM surface, wherein the computer executable instructions cause a processor to:
extend the first edge toward the first bounding area when the first edge is spaced apart from the first bounding area; and
extend the second edge toward the second bounding area when the second edge is spaced apart from the second bounding area;
cause a display to display the modified CAD solid model and the modified machining path CAM surface model.

35. The nontransitory processor-readable medium of claim 29, further comprising computer executable instructions to:
divide one of the final CAM machining faces into a first portion and a second portion, each of the first portion and the second portion having a first edge and a second edge;
segment the first portion into object geometry vectors that define a machining orientation for the tool, each object geometry vector connecting an imaginary point on the first edge of the first portion defining a jet entrance contour to a corresponding imaginary point on the second edge of the first portion defining a jet exit contour such that there is a one-to-one correspondence between the number of points on the top edge of the first portion and the bottom edge of the first portion; and
segment the second portion into object geometry vectors that define the machining orientation for the tool, each object geometry vector connecting an imaginary point on the first edge of the second portion defining a jet entrance contour to a corresponding imaginary point on the second edge of the second portion defining a jet exit contour such that there is a one-to-one correspondence between the number of points on the top edge of the second portion and the bottom edge of the second portion.

36. The nontransitory processor-readable medium of claim 29, further comprising computer executable instructions to:
extend the first edges of the initial CAM machining faces to the first bounding area; and
extend the second edges of the initial CAM machining faces to the second bounding area.

37. A processor-based system, comprising:
at least one processor; and
at least one nontransitory processor-readable medium, communicatively coupled to the at least one processor and which stores at least one of processor-executable instructions or data, wherein in use the at least one processor:
obtains a computer aided-design (CAD) solid model of the physical object to be manufactured from at least one nontransitory processor-readable medium;
identifies a first bounding area;
identifies a second bounding area;
identifies one or more non-spanning machining faces of the CAD solid model, each of the one or more non-spanning machining faces having a first edge relatively proximate to the first bounding area and a second edge relatively proximate to the second bounding area, at least one of the first edge and the second edge spaced apart from the first bounding area and the second bounding area, respectively, such that each of the one or more non-spanning machining faces do not span between the first bounding area and the second bounding area;
creates an extended machining path CAM surface model that defines a machining orientation for a tool, the extended machining path CAM surface model logically associated with one or more non-spanning machining faces of the CAD solid model in at least one nontransitory processor-readable medium, the extended machining path CAM surface model including one or more extended machining path CAM surfaces each a representation of a respective one of the non-spanning machining faces of the CAD solid model, the extended machining path CAM surface model including a first extended surface edge relatively proximate to the first bounding area defining a beam entrance contour and a second extended surface edge relatively proximate to the second bounding area defining a beam exit contour;

generates motion instructions or data that specify movement for the tool according to the extended machining path CAM surface model;
stores the motion instructions or data in the nontransitory processor-readable medium; and
autonomously extends the extended machining path CAM surface model, wherein the processor:
autonomously extends the first extended surface edge of the extended machining path CAM surface model toward the first bounding area when the first extended surface edge is spaced apart from the first bounding area; and
autonomously extends the second extended surface edge of the extended machining path CAM surface model toward the second bounding area when the second extended surface edge is spaced apart from the second bounding area.

38. The processor-based system of claim 37 wherein the at least one processor further:
receives a selection of a positioning sequence for the motion instructions or data via a user interface; and
logically associates the positioning sequence with the motion instructions or data in at least one nontransitory processor-readable medium.

39. The processor-based system of claim 37 wherein the at least one processor further:
sends the motion instructions or data to a controller associated with the tool.

40. The processor-based system of claim 37 wherein the at least one processor further:
causes a display to display the CAD solid model and the extended machining path CAM surface model.

41. The processor-based system of claim 37 wherein the at least one processor further:
extends the first extended surface edge of the extended machining path CAM surface model to the first bounding area; and
extends the second extended surface edge of the extended machining path CAM surface model to the second bounding area.

42. The processor-based system of claim 37 wherein the at least one processor further:
extends the first extended surface edge of the extended machining path CAM surface model a first distance toward the first bounding area; and
extends the second extended surface edge of the extended machining path CAM surface model a second distance toward the second bounding area.

43. The processor-based system of claim 37 wherein the at least one processor further:
autonomously determines at least one of the one or more non-spanning machining faces of the CAD solid model has been modified; and
autonomously modifies the extended machining path CAM surface model dependent on the modification to create a modified extended machining path CAM surface model.

44. The processor-based system of claim 43 wherein the at least one processor further:
causes a display to display the modified CAD solid model and the modified extended machining path CAM surface model.

45. The processor-based system of claim 37 wherein the at least one processor further:
identifies one or more spanning machining faces of the CAD solid model, each of the one or more spanning machining faces having a first edge at least a portion of which is adjacent the first bounding area and a second edge at least a portion of which is adjacent the second bounding area, such that each of the one or more nonspanning machining faces do not span between the first bounding area and the second bounding area; and
autonomously creates a simplified machining path CAM surface model that defines a machining orientation for the tool, the simplified machining path CAM surface model logically associated with one or more spanning machining faces of the CAD solid model in at least one nontransitory processor-readable medium, the simplified machining path CAM surface model including one or more simplified machining path CAM surfaces, each simplified machining path CAM surface associated with a respective one of the spanning machining faces, the simplified machining path CAM surface model including a first simplified surface edge at least a portion of which is adjacent to the first bounding area defining a beam entrance contour and a second simplified surface edge at least a portion of which is adjacent to the second bounding area defining a beam exit contour.

46. The processor-based system of claim 45 wherein the at least one processor further:
causes a display to display the CAD solid model, the extended machining path CAM surface model, and the simplified machining path CAM surface model.

47. The processor-based system of claim 45 wherein the at least one processor further:
extends the first extended surface edge of the extended machining path CAM surface model to the first bounding area; and
extends the second extended surface edge of the extended machining path CAM surface model to the second bounding area.

48. The processor-based system of claim 45 wherein the at least one processor further:
extends the first extended surface edge of the extended machining path CAM surface model a first distance toward the first bounding area; and
extends the second extended surface edge of the extended machining path CAM surface model a second distance toward the second bounding area.

49. The processor-based system of claim 45 wherein the at least one processor further:
autonomously determines at least one of the one or more machining faces of the CAD solid model has been modified; and
autonomously modifies the extended machining path CAM surface model or the simplified machining path CAM surface model dependent on the modification to generate at least one of a modified extended machining path CAM surface model or a modified simplified machining path CAM surface model.

50. The processor-based system of claim 49 wherein the at least one processor further:
causes a display to display the modified CAD solid model and the generated at least one modified extended machining path CAM surface model or modified simplified machining path CAM surface model.

51. The processor-based system of claim 45 wherein the at least one processor further:
logically associates the simplified machining path CAM surface model with a chain of two or more spanning machining faces in at least one nontransitory processor-readable medium.

52. The processor-based system of claim 45 wherein the at least one processor further:
autonomously combines the extended machining path CAM surface model and the simplified machining path CAM surface model to create a combined machining path CAM surface model.

53. The processor-based system of claim 52 wherein the at least one processor further:
causes a display to display the CAD solid model and the combined machining path CAM surface model.

54. The processor-based system of claim 45 wherein the at least one processor further:
segments the simplified machining path CAM surface model into object geometry vectors that define a machining orientation for the tool, each object geometry vector connecting an imaginary point on the first simplified surface edge of the simplified machining path CAM surface model to a corresponding imaginary point on the second simplified surface edge of the simplified machining path CAM surface model such that there is a one-to-one correspondence between the number of points on the first simplified surface edge of the simplified machining path CAM surface model and the second simplified surface edge of the simplified machining path CAM surface model.

55. The processor-based system of claim 45 wherein the at least one processor further:
divides one of the simplified machining path CAM surfaces of the simplified machining path CAM surface model into a first simplified machining path CAM surface and a second simplified machining path CAM surface, each of the first simplified machining path CAM surface and a second simplified machining path CAM surface having a first edge and a second edge;
segments the first simplified machining path CAM surface into object geometry vectors that define a machining orientation for the tool, each object geometry vector connecting an imaginary point on the first edge of the first simplified machining path CAM surface to a corresponding imaginary point on the second edge of the first simplified machining path CAM surface such that there is a one-to-one correspondence between the number of points on the first edge of the first simplified machining path CAM surface and the second edge of the first simplified machining path CAM surface; and
segments the second simplified machining path CAM surface into object geometry vectors that define a machining orientation for the tool, each object geometry vector connecting an imaginary point on the first edge of the second simplified machining path CAM surface to a corresponding imaginary point on the second edge of the second simplified machining path CAM surface such that there is a one-to-one correspondence between the number of points on the first edge of the second simplified machining path CAM surface and the second edge of the second simplified machining path CAM surface.

56. The processor-based system of claim 37 wherein the at least one processor further:
logically associates the extended machining path CAM surface model with a chain of two or more adjacent non-spanning machining faces in at least one nontransitory processor-readable medium.

57. The processor-based system of claim 37 wherein the at least one processor further:
copies the one or more non-spanning machining faces to create the extended machining path CAM surfaces.

58. The processor-based system of claim 37 wherein the at least one processor further:
segments the extended machining path CAM surface model into object geometry vectors that define a machining orientation for the tool, each object geometry vector connecting an imaginary point on the first extended surface edge of the extended machining path CAM surface model to a corresponding imaginary point on the second extended surface edge of the extended machining path CAM surface model such that there is a one-to-one correspondence between the number of points on the first extended surface edge of the extended machining path CAM surface model and the second extended surface edge of the extended machining path CAM surface model.

59. The processor-based system of claim 37 wherein the at least one processor further:
divides one of the extended machining path CAM surfaces of the extended machining path CAM surface model into a first extended machining path CAM surface and a second extended machining path CAM surface, each of the first extended machining path CAM surface and a second extended machining path CAM surface having a first edge and a second edge;
segments the first extended machining path CAM surface into object geometry vectors that define a machining orientation for the tool, each object geometry vector connecting an imaginary point on the first edge of the first extended machining path CAM surface to a corresponding imaginary point on the second edge of the first extended machining path CAM surface such that there is a one-to-one correspondence between the number of points on the first edge of the first extended machining path CAM surface and the second edge of the first extended machining path CAM surface; and
segments the second extended machining path CAM surface into object geometry vectors that define a machining orientation for the tool, each object geometry vector connecting an imaginary point on the first edge of the second extended machining path CAM surface to a corresponding imaginary point on the second edge of the second extended machining path CAM surface such that there is a one-to-one correspondence between the number of points on the first edge of the second extended machining path CAM surface and the second edge of the second extended machining path CAM surface.

60. A processor-based system, comprising:
at least one processor; and
at least one nontransitory processor-readable medium, communicatively coupled to the at least one processor and which stores at least one of processor-executable instructions or data, wherein in use the at least one processor:
obtains a computer aided-design (CAD) solid model of the physical object to be manufactured by a tool from at least one nontransitory processor-readable medium;
identifies a first bounding area;
identifies a second bounding area;
identifies one or more machining faces of the CAD solid model to be machining by the tool, each of the one or more machining faces having a first edge and a second edge;
generates a machining path CAM surface model that defines a machining orientation for the tool, the machining path CAM surface model stored in at least one nontransitory processor-readable medium, the processor executable instructions cause a processor to:
  autonomously generate one or more initial machining path CAM surfaces, each of the initial machining path CAM surfaces logically associated with a respective one of the machining faces in at least one nontransitory processor-readable medium, each of the initial CAM machining faces having a first edge and a second edge corresponding to the first edge and the second edge, respectively, of the machining face with which each of the initial machining path CAM surfaces is logically associated;
  autonomously generate one or more final machining path CAM surfaces of the machining path CAM surface model from the initial machining path CAM surfaces, the processor executable instructions cause a processor to, for each initial machining path CAM surface:
    extend the first edge toward the first bounding area when the first edge is spaced apart from the first bounding area; and
    extend the second edge toward the second bounding area when the second edge is spaced apart from the second bounding area;
  causes a display to display the CAD solid model and the machining path CAM surface model;
  logically associates a first bounding area with a first face of the CAD solid model in at least one nontransitory processor-readable medium; and
  logically associates a second bounding area with a second face of the CAD solid model in at least one nontransitory processor-readable medium.

61. The processor-based system of claim 60 wherein the at least one processor further:
  generates motion instructions or data that specify movement for the tool according to the machining path CAM surface model.

62. The processor-based system of claim 60 wherein the at least one processor further:
  stores the motion instructions or data in a nontransitory processor-readable medium.

63. The processor-based system of claim 60 wherein the at least one processor further:
  obtains machining knowledge data stored in at least one nontransitory processor-readable medium, wherein at least a portion of the motion instructions or data are dependent upon the obtained machining knowledge data.

64. The processor-based system of claim 60 wherein the at least one processor further:
  receives a selection of a positioning sequence for the motion instructions or data via a user interface; and
  logically associates the positioning sequence with the motion instructions or data in at least one nontransitory processor-readable medium.

65. The processor-based system of claim 60 wherein the at least one processor further:
  modifies the CAD solid model;
  determines whether any of the machining faces of the CAD solid model are modified;
  generates a modified machining path CAM surface model by, for each modified machining face, wherein the computer executable instructions cause a processor to:
    autonomously generate a modified initial machining path CAM surface logically associated in at least one nontransitory processor-readable medium with the modified machining face, the modified initial machining path CAM surface having a first edge and a second edge;
    autonomously generate a modified final machining path CAM surface from the modified initial machining path CAM surface, wherein the computer executable instructions cause a processor to:
      extend the first edge toward the first bounding area when the first edge is spaced apart from the first bounding area; and
      extend the second edge toward the second bounding area when the second edge is spaced apart from the second bounding area;
  causes a display to display the modified CAD solid model and the modified machining path CAM surface model.

66. The processor-based system of claim 60 wherein the at least one processor further:
  divides one of the final CAM machining faces into a first portion and a second portion, each of the first portion and the second portion having a first edge and a second edge;
  segments the first portion into object geometry vectors that define a machining orientation for the tool, each object geometry vector connecting an imaginary point on the first edge of the first portion defining a jet entrance contour to a corresponding imaginary point on the second edge of the first portion defining a jet exit contour such that there is a one-to-one correspondence between the number of points on the top edge of the first portion and the bottom edge of the first portion; and
  segments the second portion into object geometry vectors that define the machining orientation for the tool, each object geometry vector connecting an imaginary point on the first edge of the second portion defining a jet entrance contour to a corresponding imaginary point on the second edge of the second portion defining a jet exit contour such that there is a one-to-one correspondence between the number of points on the top edge of the second portion and the bottom edge of the second portion.

67. The processor-based system of claim 60 wherein the at least one processor further:
  extends the first edges of the initial CAM machining faces to the first bounding area; and
  extends the second edges of the initial CAM machining faces to the second bounding area.

* * * * *